(12) United States Patent
Kamijima

(10) Patent No.: US 6,970,323 B2
(45) Date of Patent: Nov. 29, 2005

(54) MICRO DEVICE INCLUDING A THIN FILM WIRING STRUCTURE AND METHOD FOR FABRICATING THE SAME

(75) Inventor: Akifumi Kamijima, Chuo-ku (JP)

(73) Assignee: TDK Corporation, Tokyo (JP)

( * ) Notice: Subject to any disclaimer, the term of this patent is extended or adjusted under 35 U.S.C. 154(b) by 166 days.

(21) Appl. No.: 10/397,365

(22) Filed: Mar. 27, 2003

(65) Prior Publication Data

US 2003/0189788 A1 Oct. 9, 2003

(30) Foreign Application Priority Data

Apr. 4, 2002 (JP) .................................. 2002-102695

(51) Int. Cl.⁷ .............................................. G11B 5/147
(52) U.S. Cl. ............................................... 360/123
(58) Field of Search .......................... 360/317, 324.1, 360/123, 126

(56) References Cited

U.S. PATENT DOCUMENTS

| | | | | |
|---|---|---|---|---|
| 3,853,715 A | | 12/1974 | Romankiw | 205/122 |
| 6,181,514 B1 | * | 1/2001 | Santini et al. | 360/126 |
| 6,191,916 B1 | * | 2/2001 | Sasaki | 360/126 |
| 6,333,830 B2 | * | 12/2001 | Rose et al. | 360/123 |
| 6,459,542 B1 | * | 10/2002 | Sato | 360/126 |
| 6,466,401 B1 | * | 10/2002 | Hong et al. | 360/123 |
| 6,507,455 B1 | * | 1/2003 | Kikuiri et al. | 360/126 |
| 6,570,739 B2 | * | 5/2003 | Hsiao et al. | 360/123 |
| 6,594,122 B1 | * | 7/2003 | Shukh | 360/317 |
| 6,678,942 B1 | * | 1/2004 | Sasaki | 29/603.25 |
| 6,757,134 B2 | * | 6/2004 | Emilio Santini | 360/126 |
| 6,765,756 B1 | * | 7/2004 | Hong et al. | 360/126 |

FOREIGN PATENT DOCUMENTS

JP   A-2001-93113   4/2001

* cited by examiner

*Primary Examiner*—Jefferson Evans
(74) *Attorney, Agent, or Firm*—Oliff & Berridge, PLC

(57) ABSTRACT

In a micro device including a thin film wiring structure composed of plural thin film conductors, the thin film conductors are arranged on a base so as to be separated from one another by an inorganic insulating film. The gap width α between adjacent thin film conductors is defined by a thickness of the inorganic insulating film. The gap width α is set smaller than a width β of each thin film conductor.

14 Claims, 89 Drawing Sheets

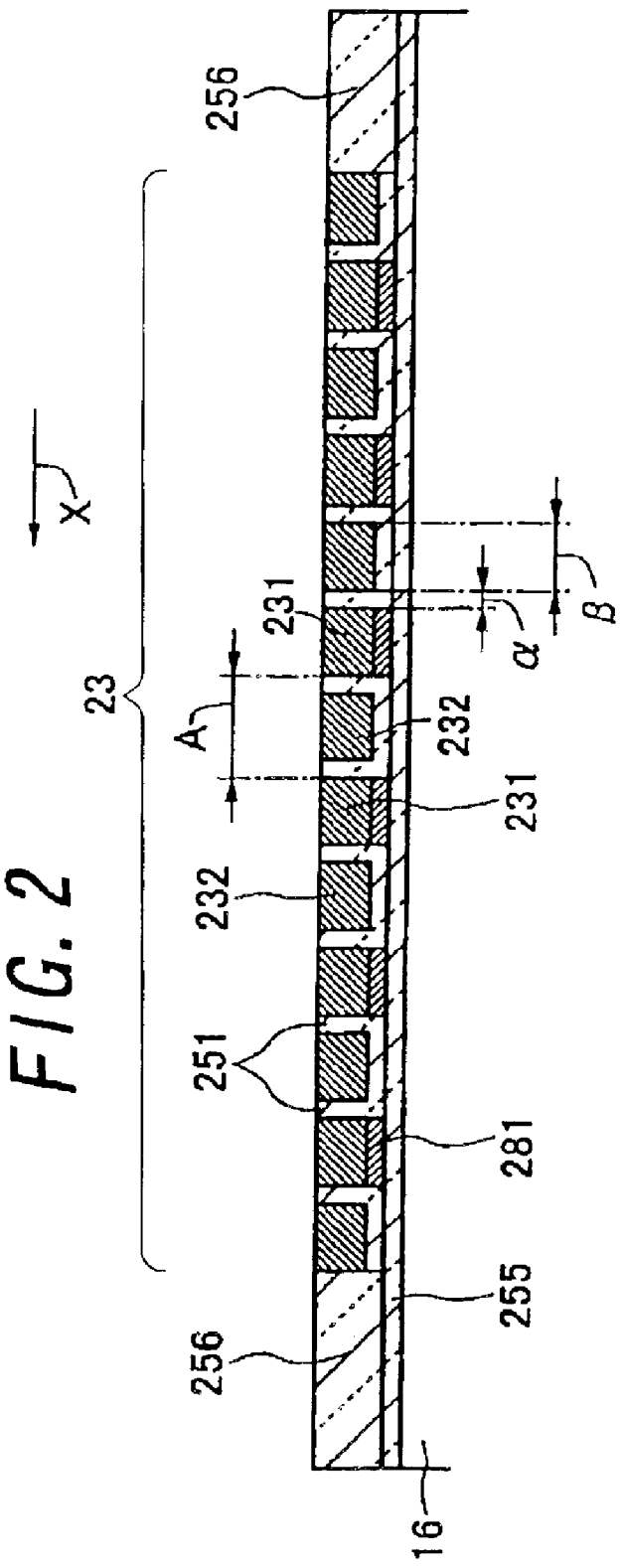

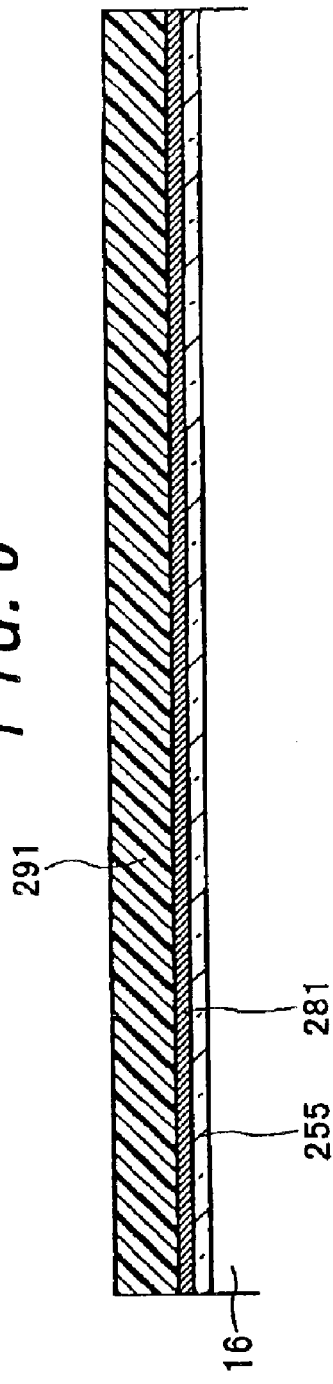
FIG. 6
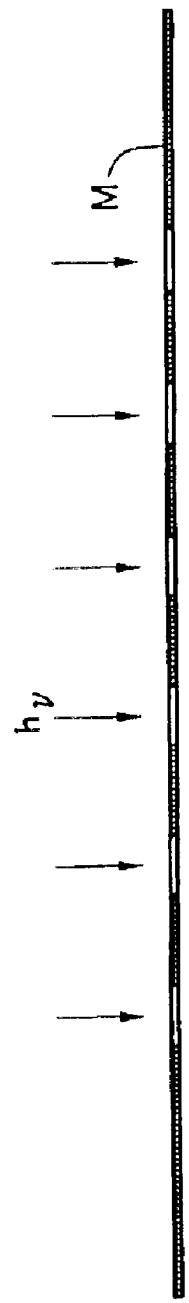
FIG. 7
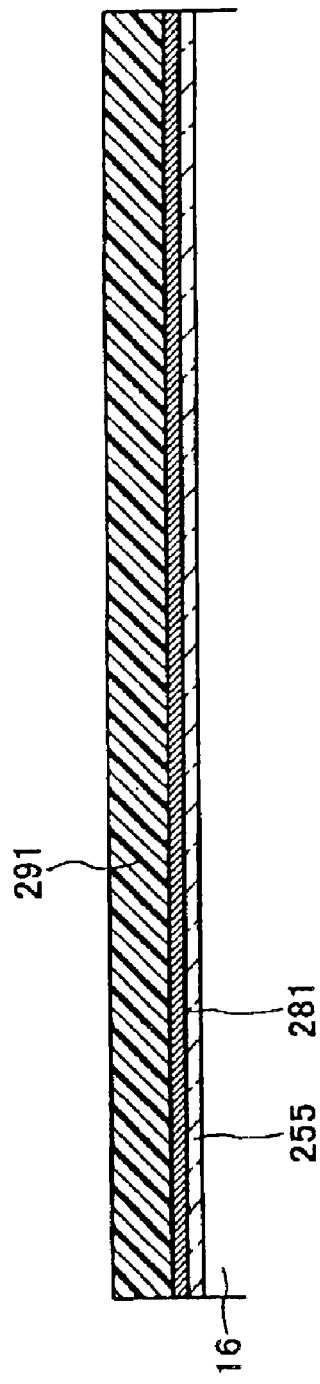

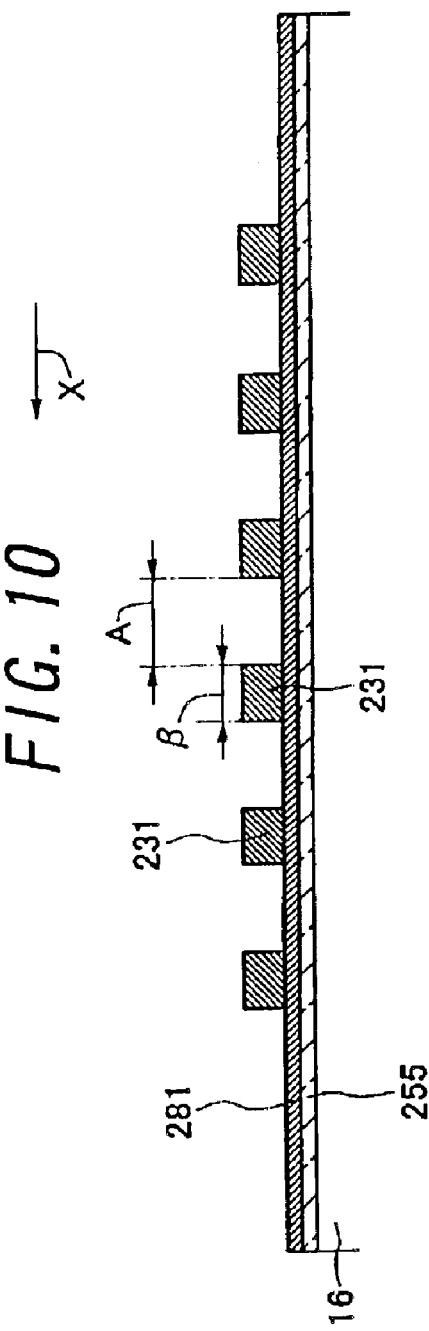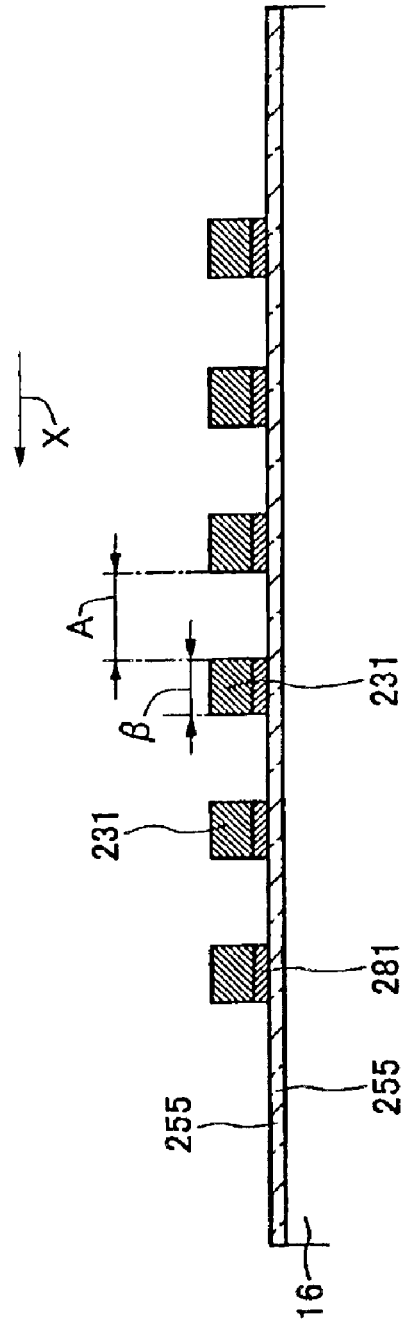

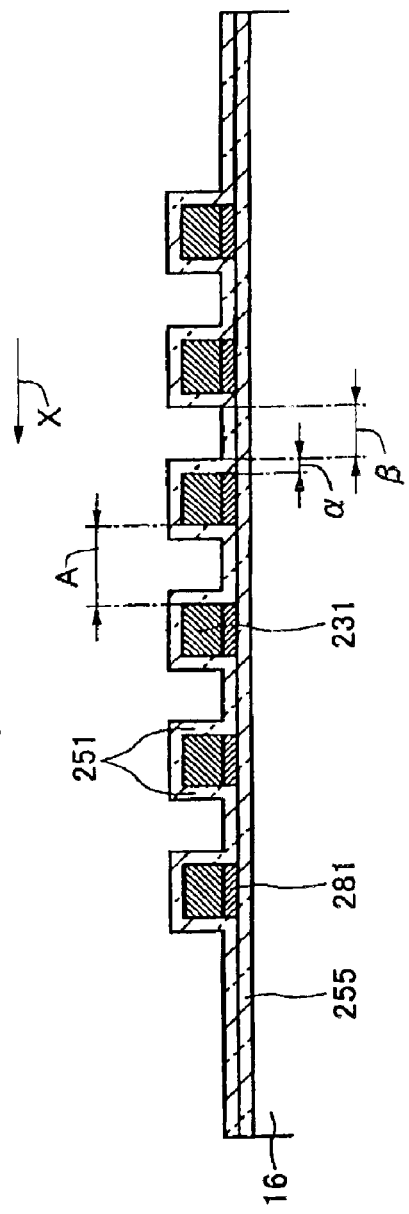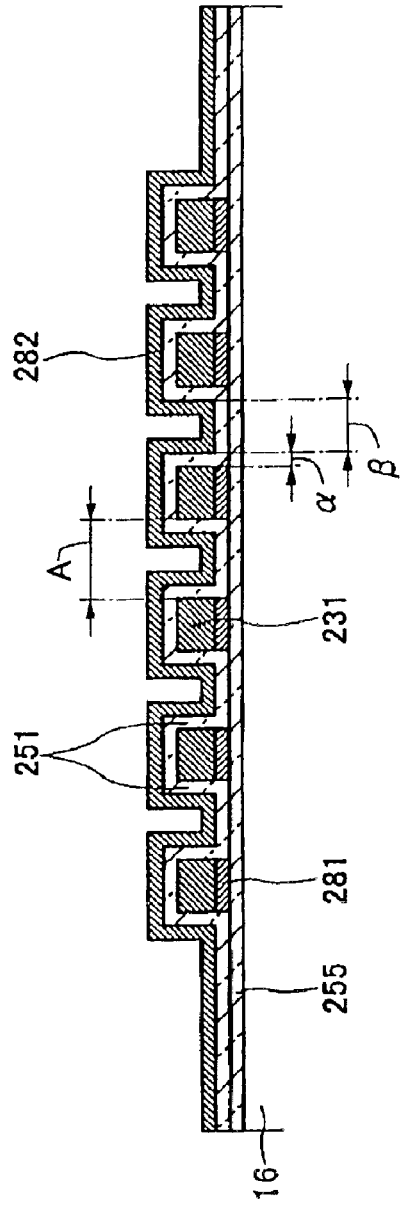

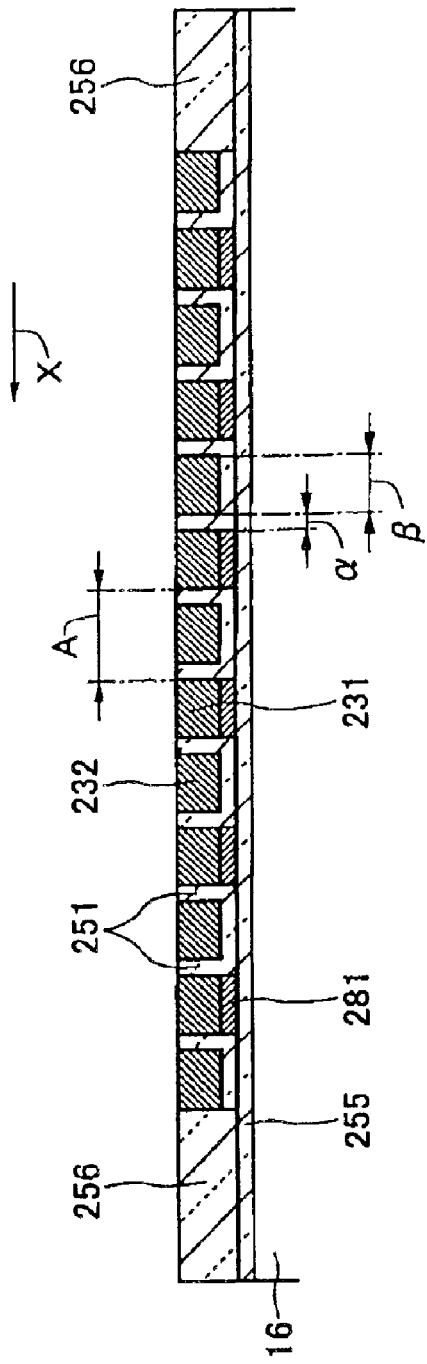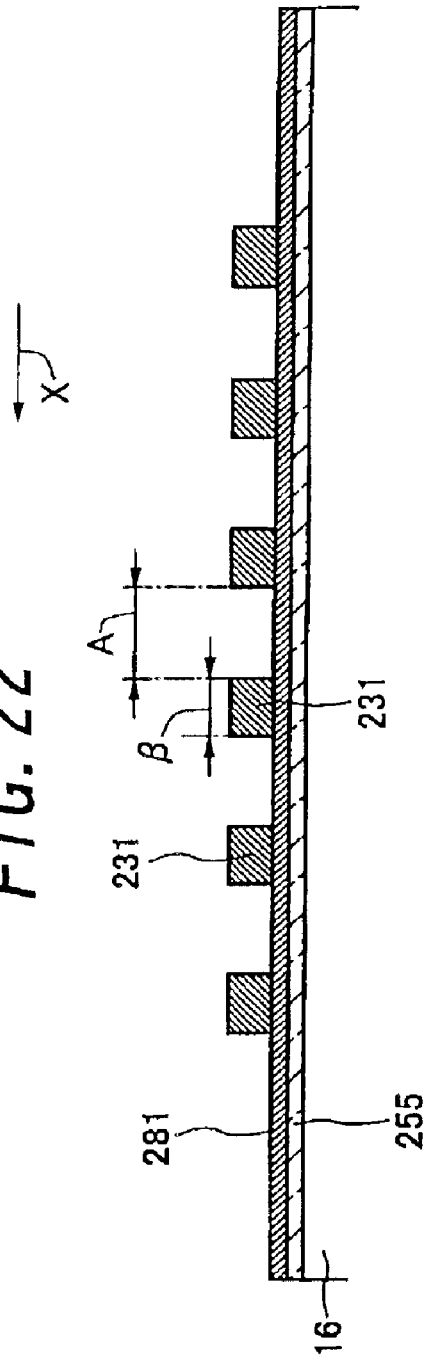

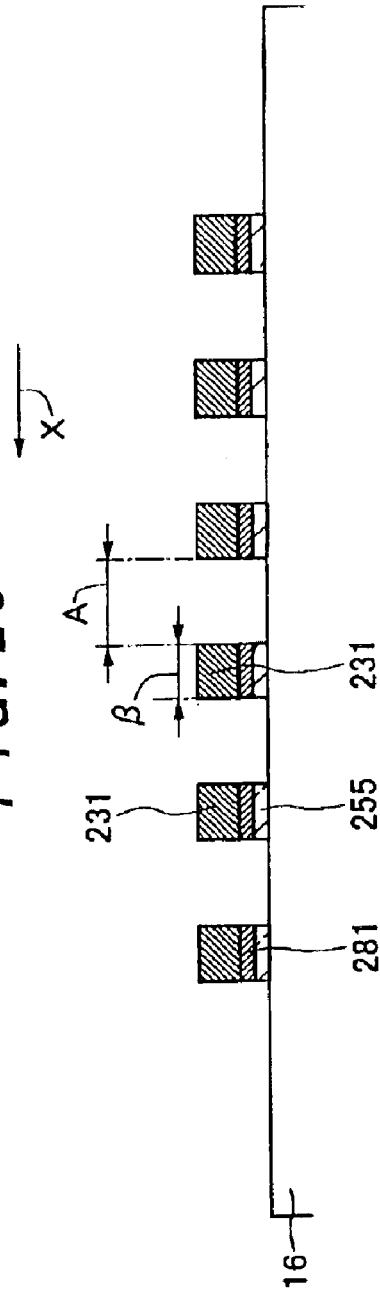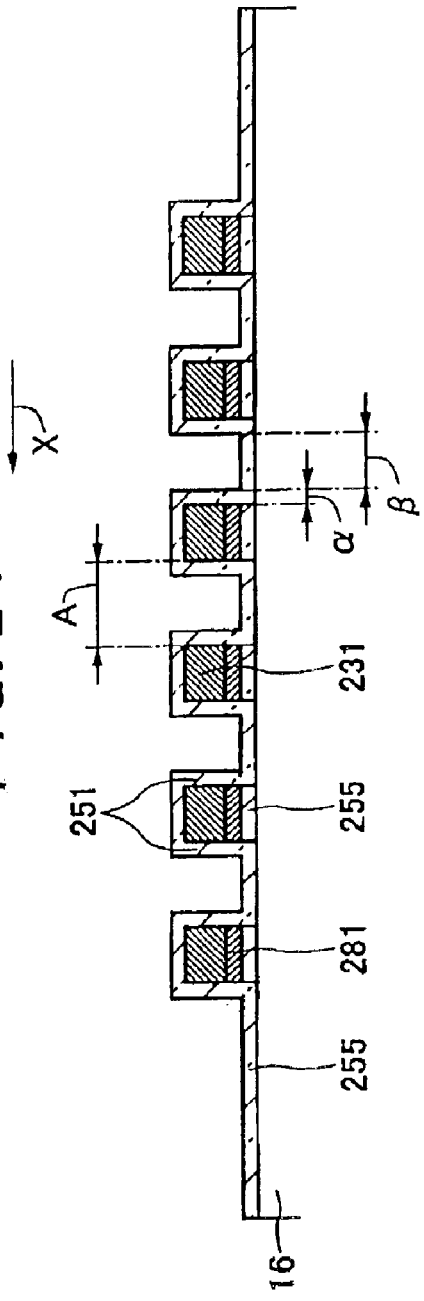

MICRO DEVICE INCLUDING A THIN FILM WIRING STRUCTURE AND METHOD FOR FABRICATING THE SAME

BACKGROUND OF THE INVENTION

1. Field of the Invention

This invention relates to a micro device and a method for fabricating the micro device. As the micro device are exemplified a thin film magnetic head, a thin film inductor, a semiconductor device, a thin film sensor, a thin film actuator, or a composite device equipped with one or some of the thin film devices.

2. Related Art Statement

A thin film magnetic head including a writing element and a reading element is a type of micro device. Normally, the writing head includes a first and a second magnetic layers, the forefronts of which constitute a magnetic pole via a gap layer in an air bearing surface (herein, abbreviated as an "ABS"). The first and the second magnetic layers are magnetically joined at a back gap portion remote from the ABS to complete a magnetic circuit. Then, a planer thin film coil is arranged to wind around the back gap portion within a plane parallel to the first and the second magnetic layers and perpendicular to the ABS.

In the use of the planer thin film coil, the coil length is elongated inevitably, so that the impedance of the thin film coil can not be decreased sufficiently, and the high frequency performance of the thin film coil can not be improved sufficiently.

In the fabrication of the thin film coil, conventionally, a frame-plating method used to be employed, which is typically disclosed in the Japanese Patent examined application No. 56-36706. In this fabrication, a frame-plating treatment is carried out through a resist frame which is later removed, so that the distance between the adjacent coil turns is determined by the bottom width of the each resist frame. Therefore, the density of the coil turn can not be increased sufficiently and the magnetic efficiency of the thin film coil can not be improved sufficiently. Also, the thin film coil can not be down-sized sufficiently.

A new type of thin film magnetic head is disclosed in Japanese Patent Application Laid-open No. 2001-93113 where the winding center axis of the thin film coil is shifted vertically by 90 degrees from the normal horizontal arrangement as mentioned above, to shorten the magnetic path of the thin film coil and to reduce the loss of the eddy current, and thus, to enhance the high frequency performance of the thin film magnetic head.

In this case, too, the frame-plating method is employed in the fabrication of the thin film coil, and the distance between the adjacent coil turns is determined by the bottom width of the resist frame. Therefore, the density of the coil turn can not be increased sufficiently and the magnetic efficiency of the thin film coil can not be improved sufficiently. Also, the thin film coil can not be down-sized sufficiently.

SUMMARY OF THE INVENTION

It is an object of the present invention to provide a micro device, particularly a semiconductor device which can increase the wiring density and thus, develop the element density.

It is another object of the present invention to provide a micro device, particularly, a thin film magnetic head or a thin film inductor where the coil length is shortened while the required magnetomotive force is maintained, and the impedance of the thin film coil is reduced to improve the high frequency performance.

It is still another object of the present invention to provide a micro device, particularly a thin film inductor and a thin film magnetic head where the density of the coil turn is increased and thus, the magnetic efficiency can be improved.

For achieving the above objects, this invention relates to a micro device comprising a thin film wiring structure composed of plural thin film conductors, the thin film conductors being arranged on a base so as to be separated from one another by an inorganic insulating film, a gap width $\alpha$ between adjacent thin film conductors being defined by a thickness of the inorganic insulating film, the gap width $\alpha$ being set smaller than a width $\beta$ of each thin film conductor.

Generally, a thin film wiring structure is made by means of frame plating using a resist mask. Therefore, the distance of the adjacent thin film conductors is defined by the bottom width of the resist frame, so is set larger than the width of each thin film conductor.

In contrast, in the present invention, an additional thin film conductor is provided in between the inherent adjacent thin film conductors as the gap width $\alpha$ between the adjacent thin film conductors is set smaller than the width $\beta$ of the thin film conductor. Therefore, the density of the thin film wiring structure can be increased and thus, the magnetic efficiency can be enhanced.

Since the gap width $\alpha$ is defined by the thickness of the inorganic insulating film to separate the thin film conductors one another, and the inorganic insulating film can be made by means of sputtering or CVD, the gap width $\alpha$ can be reduced as small as possible by the film-forming technique.

Preferably, the gap width $\alpha$ is set within 0.01–0.05 $\mu$m, and the width $\beta$ is set within 0.25–3 $\mu$m. In such a conductor width range, the thin film conductors can exhibit their inherent performances.

Since the micro device of the present invention includes the above-mentioned thin film wiring structure, the element density of the micro device can be enhanced through the enhancement of the wiring density.

The micro device can be applied for various devices such as semi-conductor devices, thin film inductors, thin film magnetic heads, thin film sensors, thin film actuators and composite thereof.

In the thin film inductor, the thin film wiring structure is composed of a thin film coil which is wound helically around a predetermined axis.

In the thin film coil, an additional coil turn is provided in each gap between the inherent adjacent coil turns defined by the bottom width of a resist frame. In the present invention, therefore, the gap width $\alpha$ between the adjacent coil turns is set smaller than the width $\beta$ of the coil turn as viewed along the axis. As a result, the density of the coil turn can be increased, and the magnetic efficiency can be improved.

The thin film coil of the above configuration is shifted vertically from a normal thin film configuration by 90 degrees to form a perpendicular winding structure. Therefore, the thin film coil can have some advantages on the perpendicular-winding structure.

In this case, the thin film coil is employed as an inductance path. In addition to the thin film coil, a thin film core may be provided. The gap width $\alpha$ and the width $\beta$ of the coil turn can be preferably set within the above-mentioned ranges, and also preferably satisfies the above-mentioned relation.

In the thin film magnetic head, the micro device is mainly applied as a writing element. In this case, the thin film coil is composed of the above-mentioned perpendicular winding structure. Therefore, the thin film coil, and thus the thin film magnetic head can have some advantages on the perpendicular winding structure. Moreover, the density of the magnetic efficiency can be enhanced, and thus, the magnetic efficiency can be improved. The thin film magnetic head may include a reading element, which is composed of a giant magnetoresistive effective element with a spin valve film or a ferromagnetic tunnel junction element.

This invention also relates to a thin film magnetic head device and a magnetic recording/reproducing device utilizing a thin film magnetic head as mentioned above.

This invention relates to a method for fabricating a micro device, which is characterized by the steps of:

forming a first inorganic insulating film on a base, forming plural first thin film conductors on the first insulating film so as to be separated from one another by a given distance, removing portions of the first inorganic insulating film located in between the plural first thin film conductors, forming a second inorganic insulating film in a uniform thickness over the first thin film conductors and exposed portions of the base, and forming a second thin film conductor so as to embed gaps located between the first thin film conductors.

Moreover, the fabricating method of the micro device is characterized by the steps of:

forming a first inorganic insulating film on a base, forming plural first thin film conductors on the first insulating film so as to be separated from one another by a given distance, forming a second inorganic insulating film in a uniform thickness over the first thin film conductors and said first inorganic insulating film, and forming a second thin film conductor so as to embed gaps located between the first thin film conductors.

With the fabricating method, the above-mentioned micro device can be obtained to satisfy the condition that the gap width $\alpha$ between adjacent thin film conductors is defined by a thickness of the inorganic insulating film, and the gap width $\alpha$ is set smaller than a width $\beta$ of each thin film conductor.

In the fabrication of a micro device with a thin film coil, the second thin film conductor is made so as to be electrically connected to the first thin film conductors. In this case, generally, additional steps of forming inorganic insulating films, flattening an assembly, forming thin film conductor for frame plating are employed. With the fabricating method, the thin film coil can have the perpendicular winding structure.

Other objects, configurations and advantages will be described in detail hereinafter, with reference to the accompanying drawing. It is to be understood that the invention is not intended to be limited to the following specific embodiments.

BRIEF DESCRIPTION OF THE DRAWINGS

For a better understanding of this invention, reference is made to the attached drawings, wherein:

FIG. 2 is a cross sectional view of the micro device shown in FIG. 1, taken on line "2—2", FIG. 3 is a schematic view showing one step in the fabrication of the micro device shown in FIGS. 1 and 2, FIG. 6 is a schematic view showing the step after the step shown in FIG. 5, FIG. 7 is a schematic view showing the step after the step shown in FIG. 6, FIG. 10 is a schematic view showing the step after the step shown in FIG. 9, FIG. 11 is a schematic view showing the step after the step shown in FIG. 10, FIG. 12 is a schematic view showing the step after the step shown in FIG. 11, FIG. 13 is a schematic view showing the step after the step shown in FIG. 12, FIG. 21 is a schematic view showing the step after the step shown in FIG. 20, FIG. 22 is a schematic view showing one step in another fabrication of a micro device according to the present invention, FIG. 23 is a schematic view showing the step after the step shown in FIG. 22, FIG. 24 is a schematic view showing the step after the step shown in FIG. 23.

DETAILED DESCRIPTION OF PREFERRED EMBODIMENTS

1. Micro Device Including a Thin Film Wiring Structure

Figure 1:
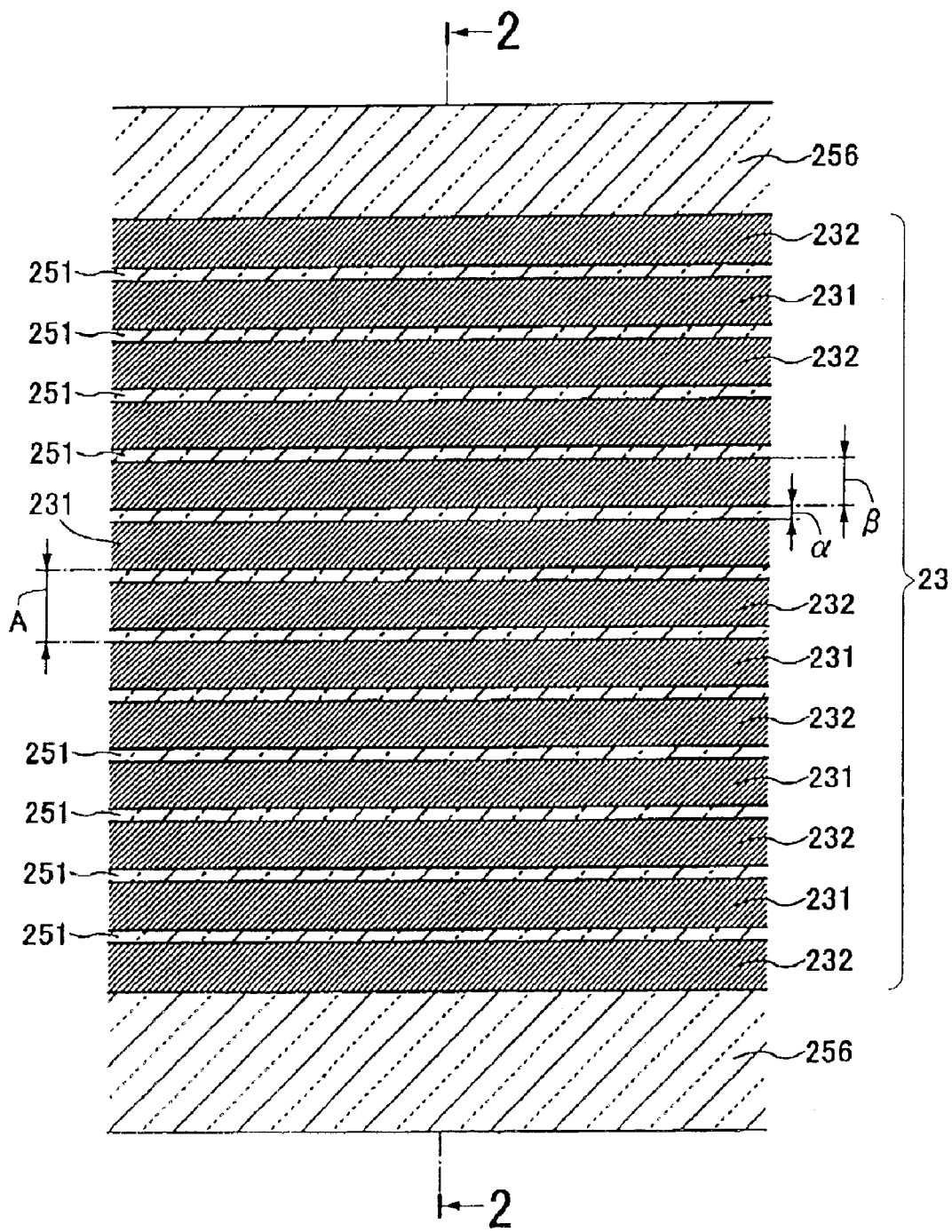
FIG. 1 is a plan view showing a micro device according to the present invention.

FIG. 1 is a plan view showing a micro device according to the present invention, and FIG. 2 is a cross sectional view of the micro device shown in FIG. 1, taken on line "2—2". For example, the micro device may be usable for a semiconductor device with a thin film wiring structure, and includes a thin film wire 23 and inorganic insulating films 251.

The thin film wire 23 is composed of plural thin film conductors 231 and 232 which are arranged by a distance A in a direction X. The configuration and the number of the thin film conductors is not restricted, and in this embodiment, only one example is illustrated. A base 16 is prepared, at least the surface of which is covered with an inorganic insulating film 255 made of e.g., $Al_2O_3$, $SiO_2$, AlN or DLC (diamond-like carbon).

At the outer side of the thin film wire 23 are provided inorganic insulating films 256 made of e.g., $Al_2O_3$, $SiO_2$, AlN or DLC. In the present invention, thee insulating film 256 is not essential. At the bottom side of the thin film wire 23 are provided conductor films 281 used as plating electrode films, which may be omitted without the use of the plating method in the fabrication of the thin film wire 23.

In the thin film wire 23, the thin film conductor 232 is located within a region having a width "A" in between the adjacent film conductors 231 so as to be separated from the conductors 231 by a given gap.

The width $\alpha$ of the gap is set smaller than the width $\beta$ of the conductors 231 and 232. The gap width $\alpha$ is determined by the thickness of an inorganic insulating film 251 made of e.g., $Al_2O_3$, $SiO_2$, AlO or DLC.

For example, a conventional thin film wire is composed of only the thin film conductors 231 without the intermediate thin film conductor 232, so the distance between the adjacent thin film conductors is determined by the distance "A", which corresponds to the width of the remnant resist frame. In contrast, in the present invention, the thin film conductor is additionally provided within the region defined by the distance "A". Therefore, the density of the thin film wire is enhanced and thus, the density of the micro device can be developed.

As mentioned above, the gap width $\alpha$ is set smaller than the width $\beta$ of the thin film conductors 231 and 232, and is determined by the thickness of the inorganic insulating film 251 provided in the gap. The inorganic insulating film 251 may be formed by means of sputtering or CVD. The gap width $\alpha$ can be made as small as possible on the above-mentioned film forming technique, so that the density of the thin film wire can be enhanced.

Preferably, the gap width $\alpha$ is set within 0.01–0.05 $\mu$m. Such a gap width $\alpha$ can be realized by the above-mentioned film-forming technique, and the adjacent thin film conductors can be electrically insulated.

Preferably, the gap width $\alpha$ and the thin film conductor width $\beta$ satisfies the relation of:

$$(1/300) \leq \alpha/\beta (1/5).$$

In the above relation, if the gap width $\alpha$ is set within 0.01–0.05 $\mu$m, the thin film conductor width $\beta$ is set within 0.25–3 $\mu$m. In such a conductor width range, the thin film conductors 231 and 232 can exhibit their inherent functions.

2. Method for Fabricating a Micro Device with a Thin Film Wiring Structure

Figure 4:
FIG. 4 is a schematic view showing the step after the step shown in FIG. 3.

FIGS. 2–21 are explanatory views showing the method for fabricating the micro device shown in FIGS. 1 and 2. First of all, the planer base 6 is prepared as shown in FIG. 3, and the inorganic insulating film 255 is formed on the base 6 made of $Al_2O_3$, $SiO_2$, AlN or DLC by means of sputtering or CVD as shown in FIG. 4.

Figure 5:
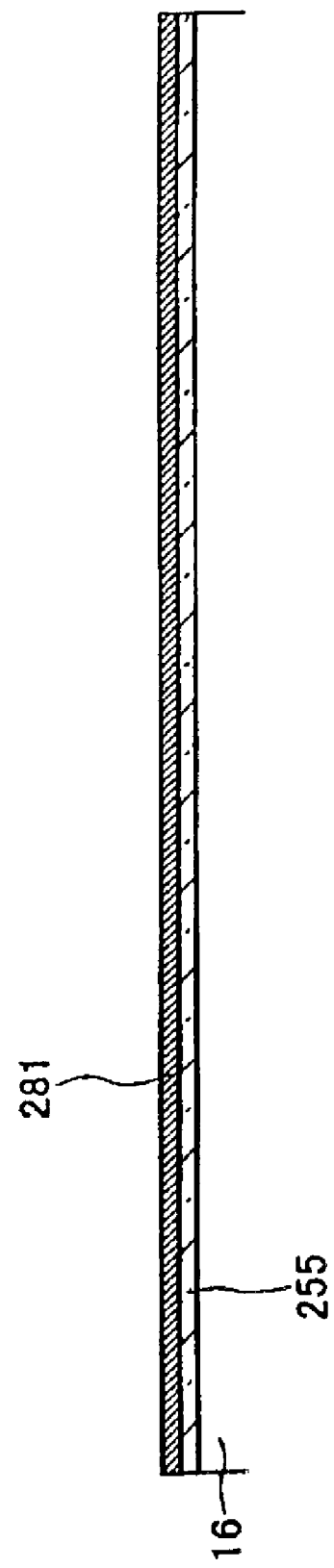
FIG. 5 is a schematic view showing the step after the step shown in FIG. 4.
Figure 8:
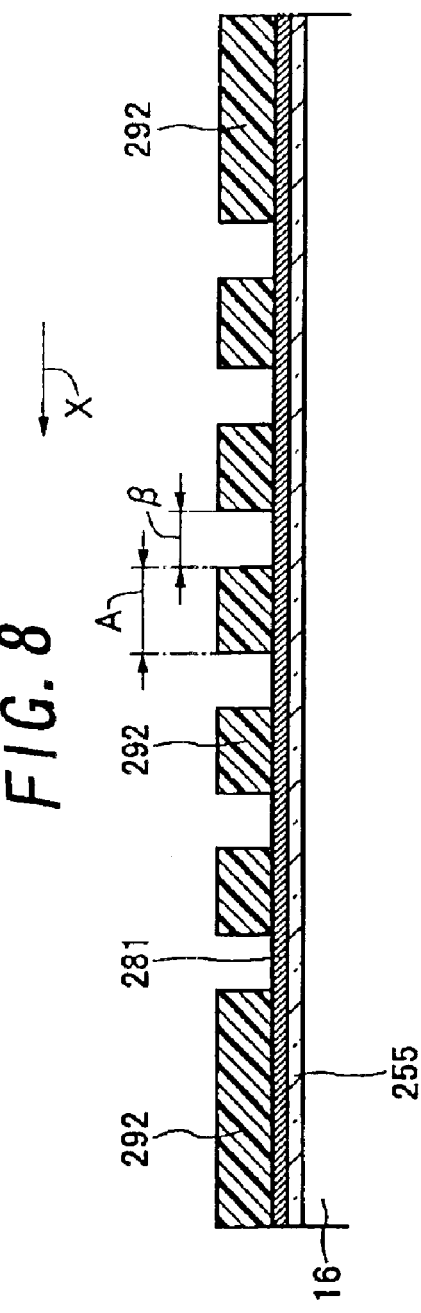
FIG. 8 is a schematic view showing the step after the step shown in FIG. 7.

Then, as shown in FIG. 5, a conductor film 281 to be functioned as a plating electrode film is formed of the same material as the thin film wire to be formed later on the inorganic insulating film 255 by means of sputtering or CVD.

Then, as shown in FIG. 6, a photoresist film 291 is applied onto the conductor film 281. The photoresist film 291 may be made of well known material by means of spin coating. The photoresist film 291 may be heated as occasion demands.

Then, as shown in FIG. 7, the photoresist film 291 is exposed via a photomask M, and the mask pattern as a latent image is transcribed on the photoresist film 291. The photomask M has a mask pattern correspondent with the thin film wire pattern. The photoresist film 291 may be heated after the transcription as occasion demands.

Then, the photoresist film 291 is developed using a developing solution, washed and dried. As a result, a resist frame 292 is made so as to be arranged in the direction X by the distance $\beta$. The width of the resist frame 292 is set to $\alpha$.

Figure 9:
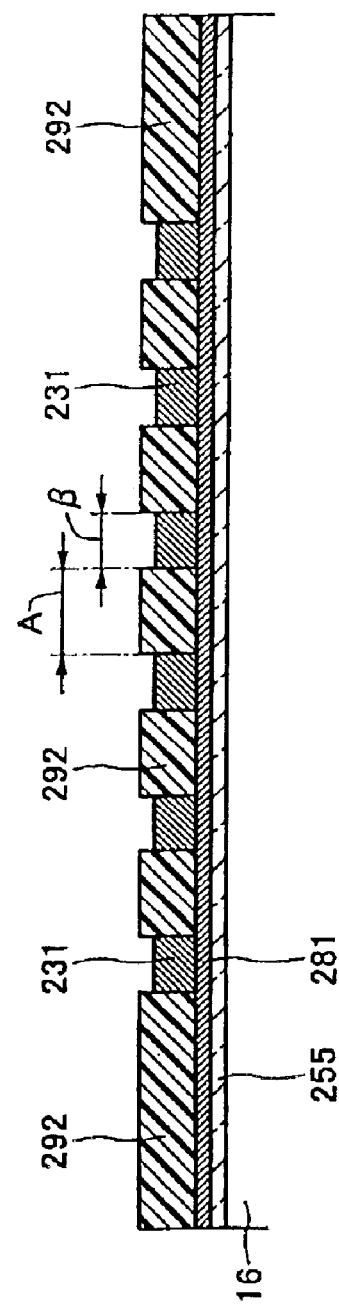
FIG. 9 is a schematic view showing the step after the step shown in FIG. 8.

Then, a frame-plating is carried out using the conductor film 281 as the plating electrode film to form the first thin film conductors 231 with the width $\beta$ in between the adjacent segments of the resist frame 292, as shown in FIG. 9. The first thin film conductors 231 are plating films made of Cu or Au.

Then, the resist frame 292 is removed by using an organic solvent or by means of ashing. In this case, as shown in FIG. 10, only the first thin film conductors 231 remain on the conductor film 281. The width of the first thin film conductor 231 is defined by the distance $\beta$, and the distance between the adjacent first thin film conductors 231 is defined by the distance "A".

Then, the conductor film 281 is removed by means of dry etching such as RIE or milling or wet etching using the first thin film conductors 231 as a mask. In this case, as shown in FIG. 11, the inorganic insulating film 255 is exposed in between the adjacent first thin film conductors 231.

Then, as shown in FIG. 12, the inorganic insulating film 251 is formed over the first thin film conductors 231 and the inorganic insulating film 255 in a uniform thickness by means of sputtering or CVD. The inorganic insulating film 251 may be made of $Al_2O_3$, $SiO_2$, AlN or DLC. In FIG. 12, the thickness of the inorganic insulating film 251 is set to $\alpha$, and the distance between the adjacent thin film conductors 231 is set to $\beta$ in consideration of the thickness of the inorganic insulating film 251. The thickness $\alpha$ and the distance $\beta$ satisfies the relation of $2\alpha+\beta=A$.

Then, as shown in FIG. 13, a conductor film 282 to be functioned as a plating electrode film later is formed of the same material as the thin film wire to be formed later on the inorganic insulating film 251 by means of sputtering or CVD.

Figure 14:
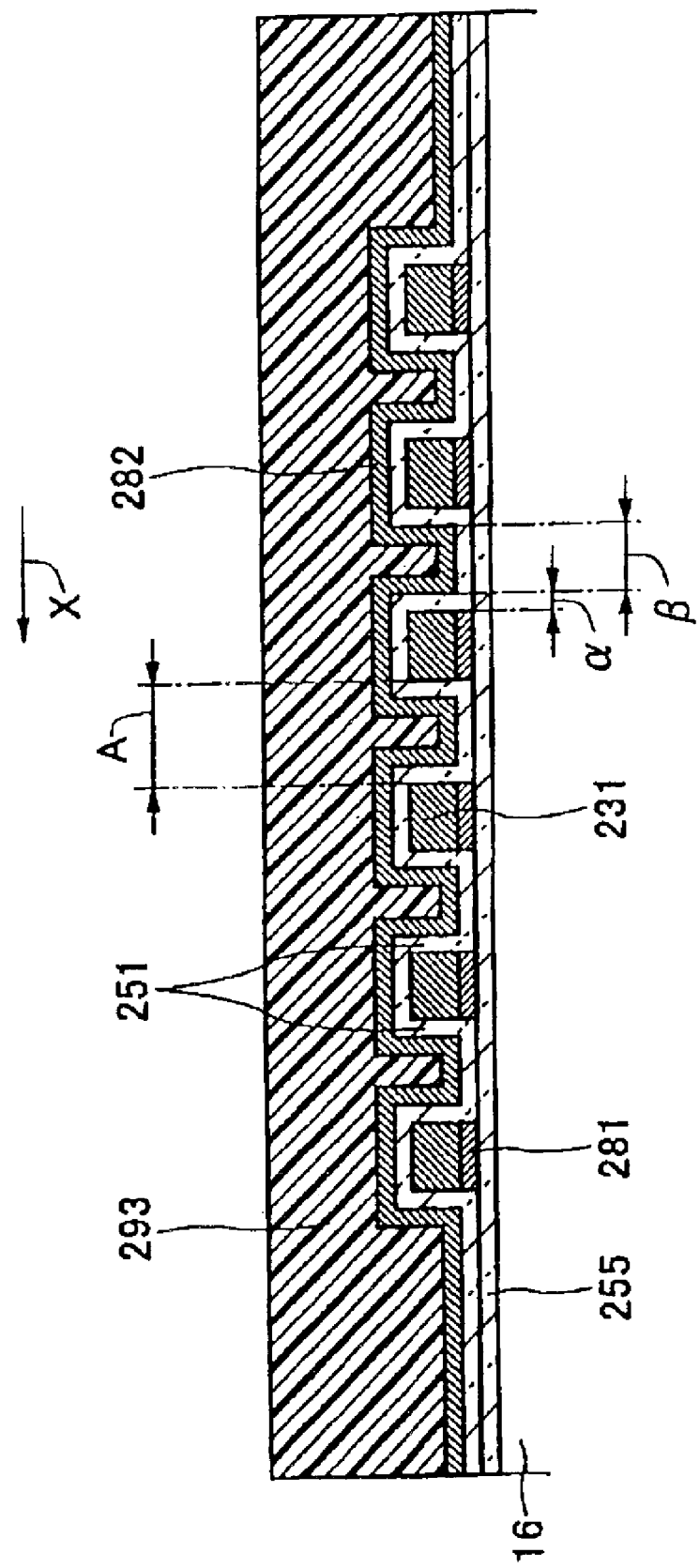
FIG. 14 is a schematic view showing the step after the step shown in FIG. 13.

Then, as shown in FIG. 14, a photoresist film 293 is applied on the conductor film 282 by means of spin coating. The photoresist film 293 may be made of a well known material. The photoresist film 293 may be heated as occasion demands.

Figure 15:
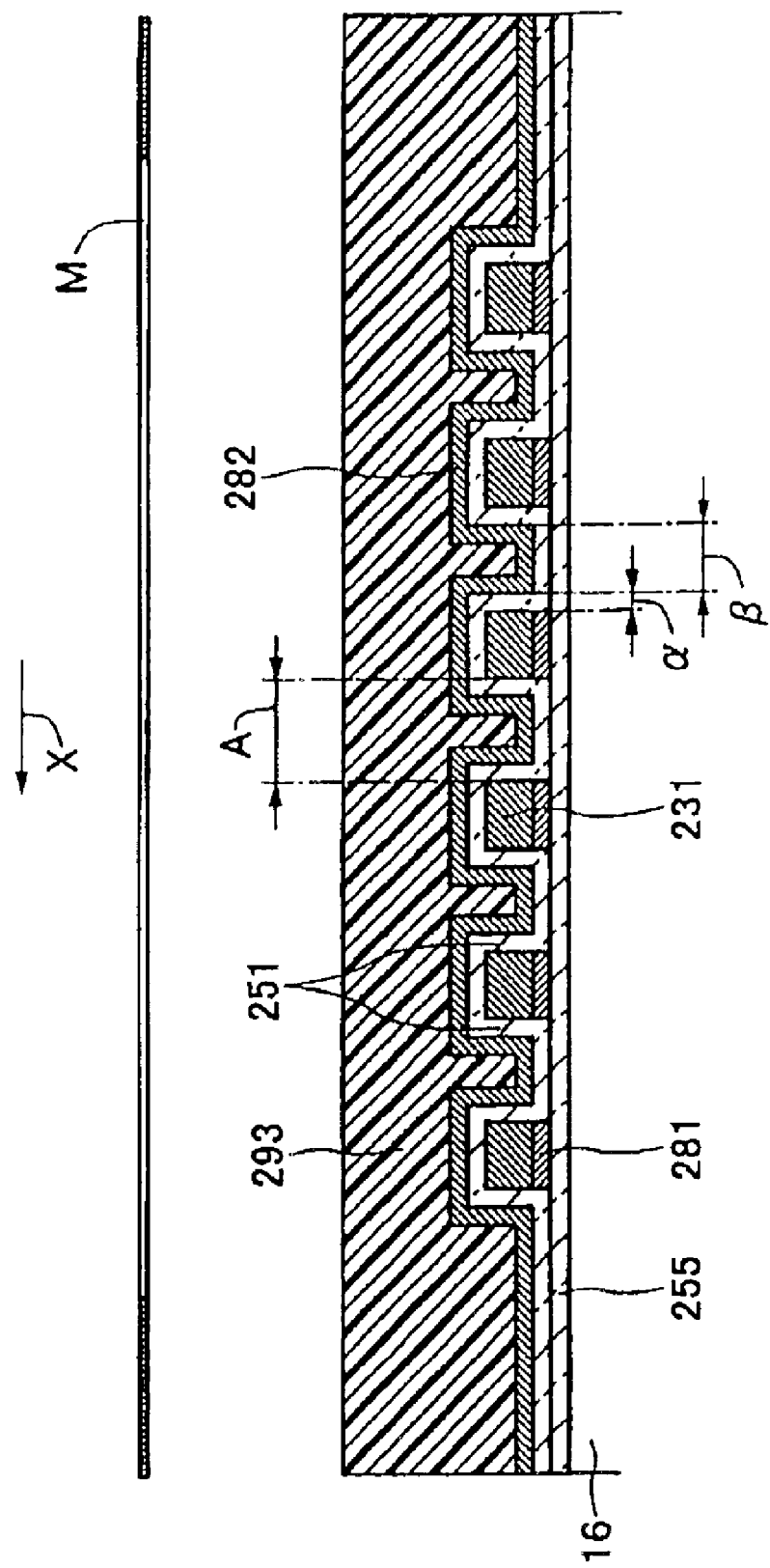
FIG. 15 is a schematic view showing the step after the step shown in FIG. 14.

Then, as shown in FIG. 15, the photoresist film 293 is exposed using a photo mask M, and then, the mask pattern is transcribed on the photoresist film 293 as a latent image. The photo mask M is required to have the mask pattern over the first thin film conductors 231. The photoresist film 293 may be heated after the transcription as occasion demands.

Figure 16:
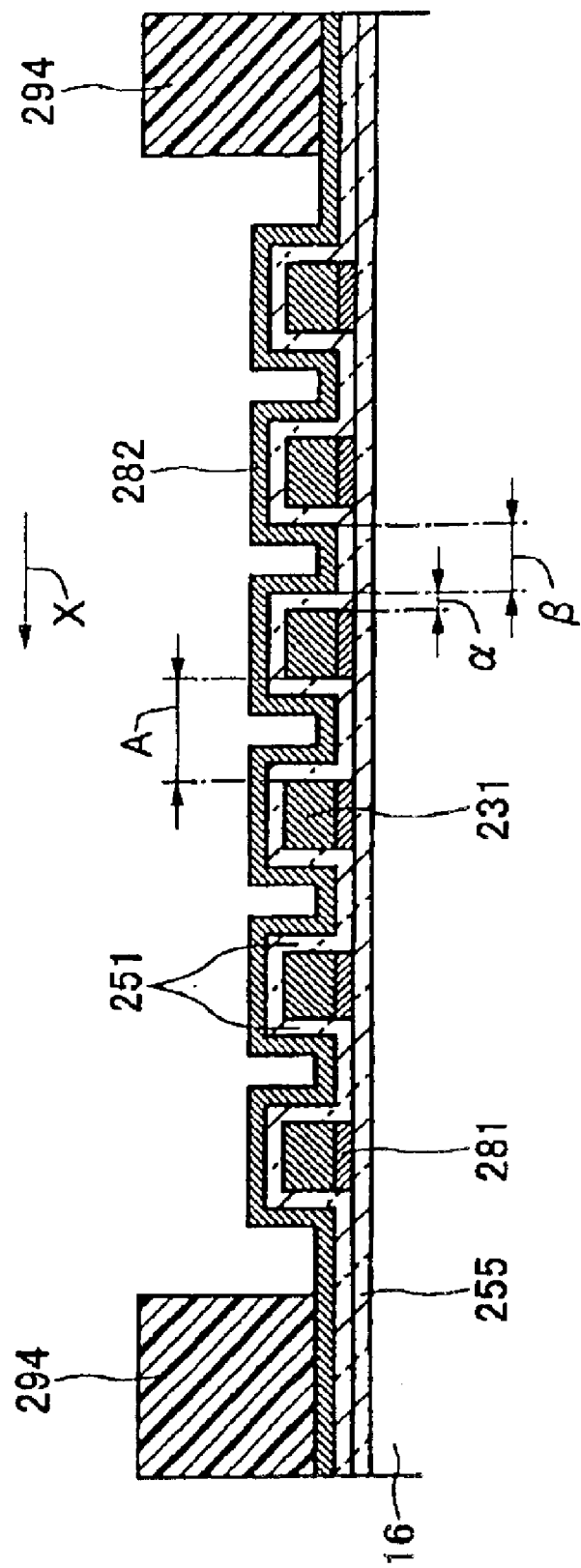
FIG. 16 is a schematic view showing the step after the step shown in FIG. 15.

Then, the photoresist film 293 is developed using a developing solution, washed and dried. As a result, as shown in FIG. 16, a resist frame 294 with a resist pattern over the first thin film conductors 231 is formed.

Figure 17:
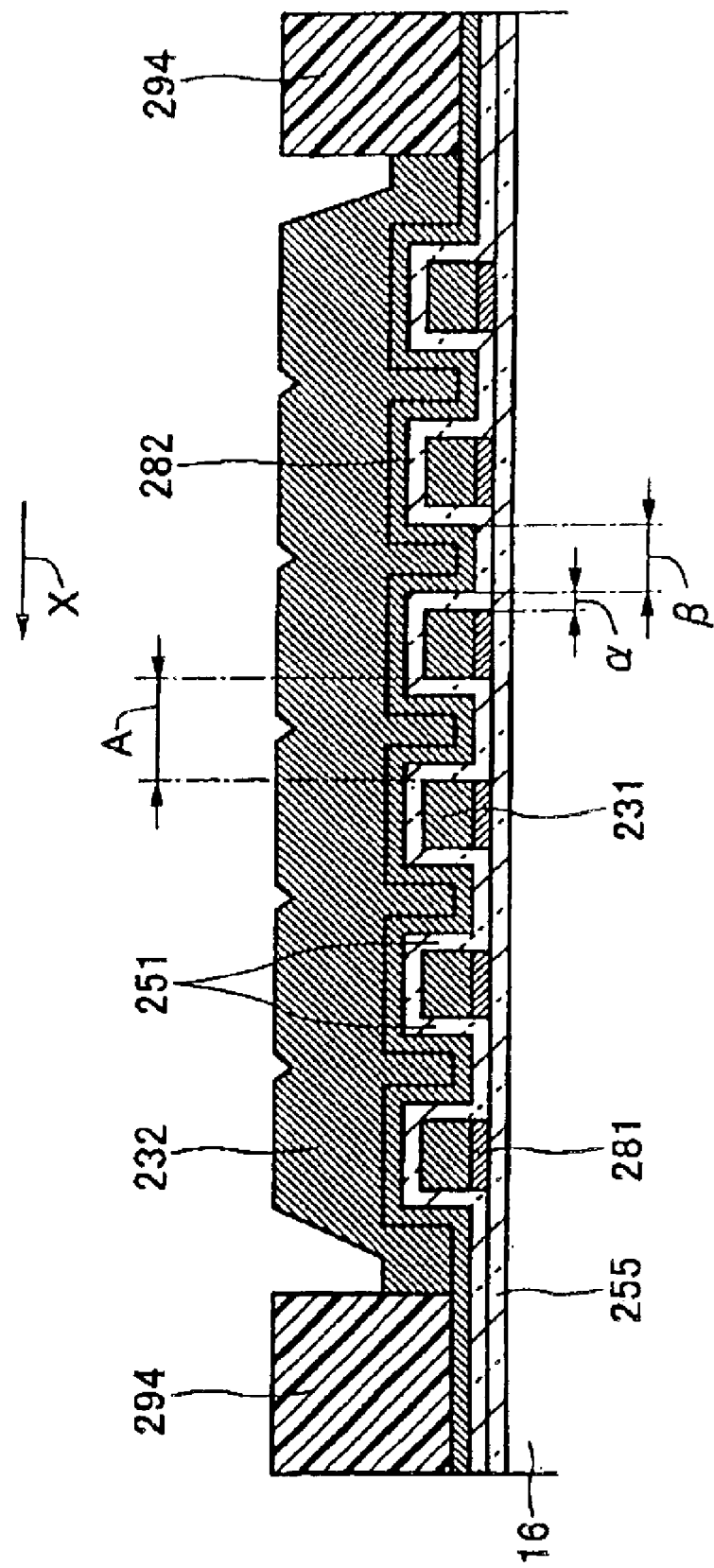
FIG. 17 is a schematic view showing the step after the step shown in FIG. 16.
Figure 18:
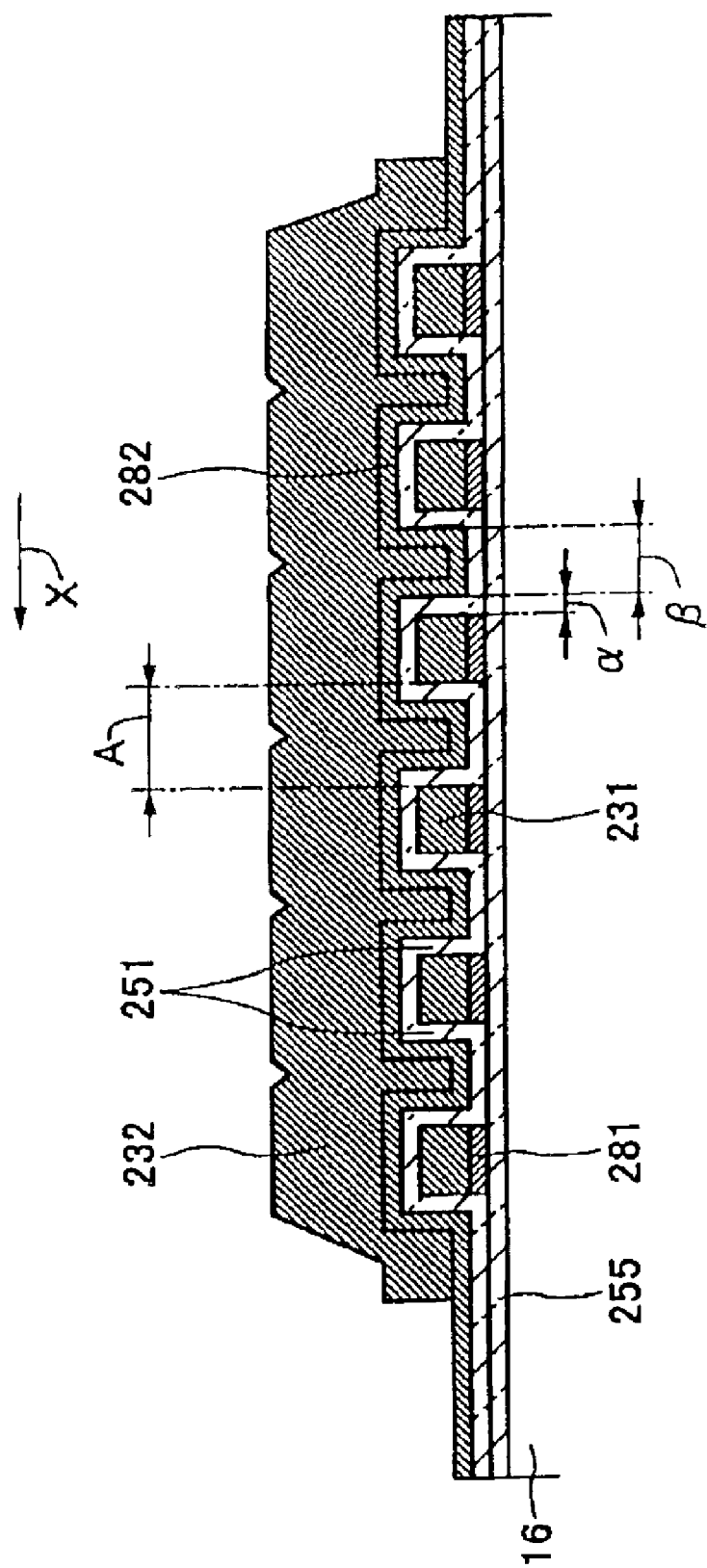
FIG. 18 is a schematic view showing the step after the step shown in FIG. 17.

Then, a frame plating is carried out using the conductor film 282 as a plating electrode film to form the second thin film conductor 232, as shown in FIG. 17. The second thin film conductor 232 may be a plating film made of Cu or Au. The second thin film conductor 232 is formed so as to embed the gaps between the adjacent first thin film conductors 231. Then, the resist frame 294 is removed by using an organic solvent or by means of ashing. As a result, as shown in FIG. 18, only the second thin film conductor 232 remains.

Then, a portion of the conductor film 282 located beyond the second thin film conductor 232 is removed by means of dry etching such as RIE or milling or wet etching using the second thin film conductor 232 as a mask. As a result, the inorganic insulating film 251 is exposed partially.

Figure 19:
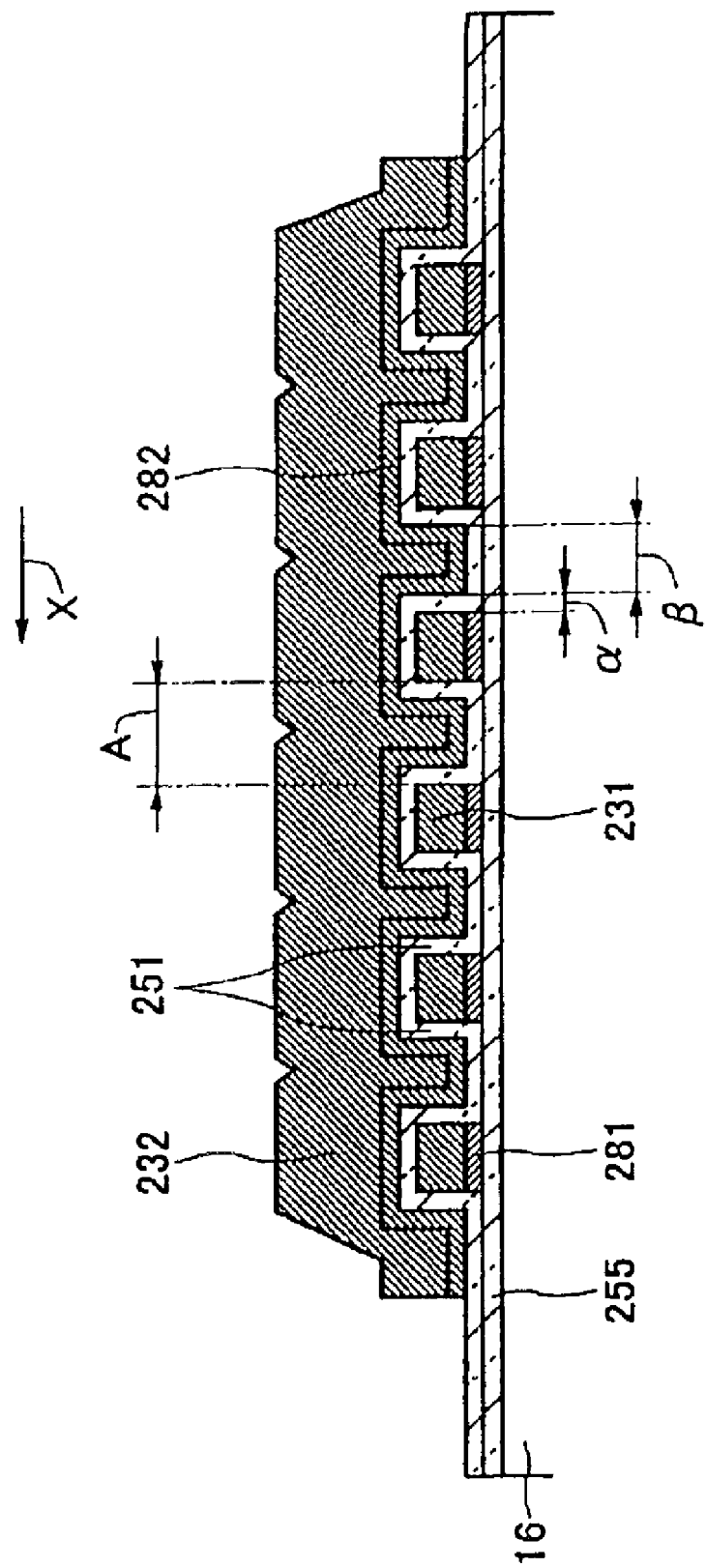
FIG. 19 is a schematic view showing the step after the step shown in FIG. 18.
Figure 20:
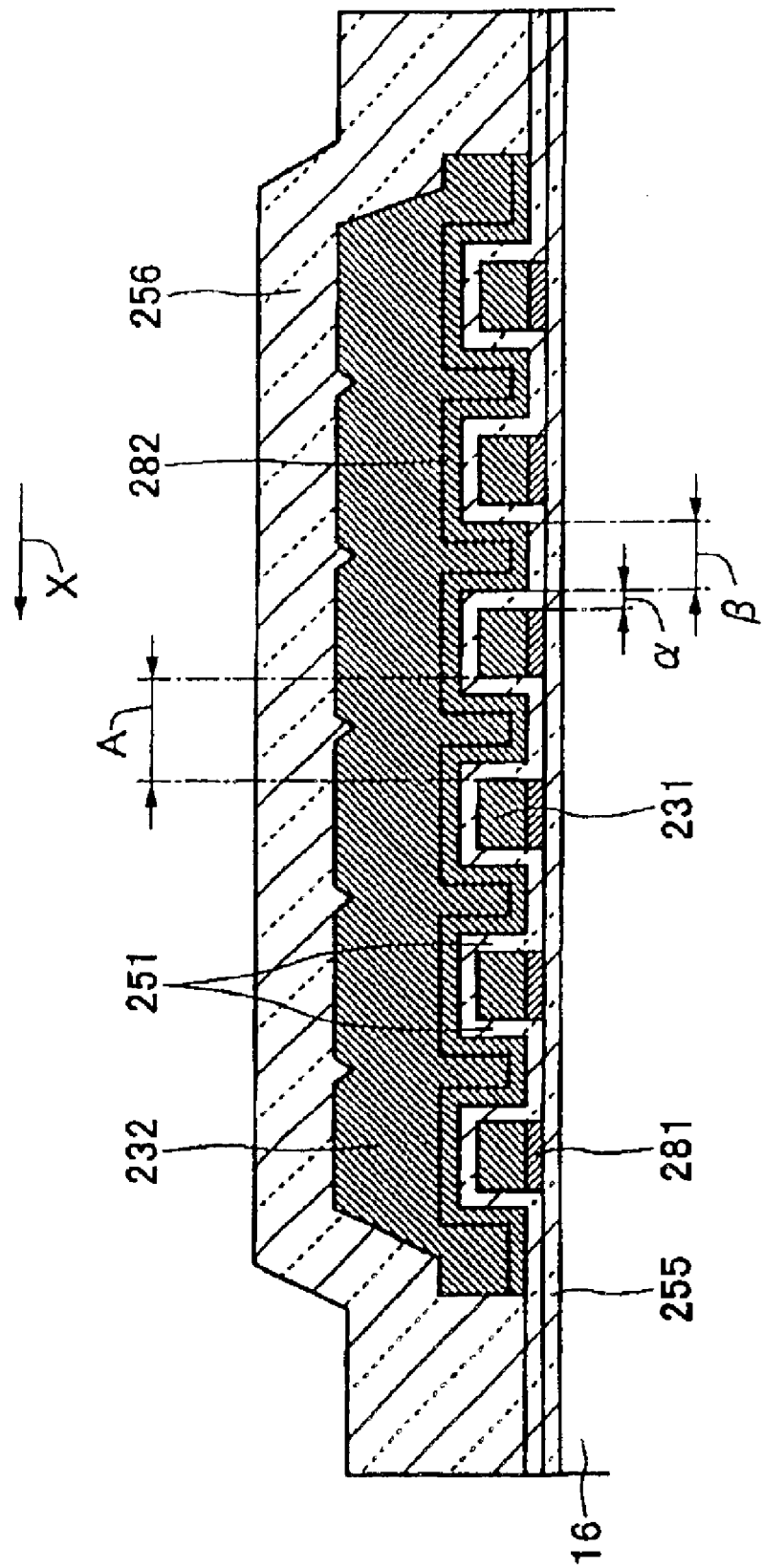
FIG. 20 is a schematic view showing the step after the step shown in FIG. 19.

Then, as shown in FIG. 20, an inorganic insulating film 256 is formed so as to flatten the assembly shown in FIG. 19. The inorganic insulating film 256 is made of $Al_2O_3$ or $SiO_2$ by means of dry film-forming method such as sputtering or CVD.

Then, the inorganic insulating film 256 is flattened by means of CMP to remove the inorganic insulating film 251 from on the first thin film conductors 231. In this case, as shown in FIG. 21, the first thin film conductor 231 and the second thin film conductor 232 are separated respectively by the inorganic insulating film 251, and the second thin film conductor 232 is located in between the adjacent first thin film conductors 231 (see, FIGS. 1 and 2). In this embodiment, at the outermost side of the assembly is located the second thin film conductor 232, which is not sandwiched by the first thin film conductors 231.

FIGS. 22–25 are explanatory views showing another method for fabricating a micro device with a thin film wiring structure. FIG. 22 shows an assembly after the steps shown in FIGS. 4–9, which corresponds to the one shown in FIG. 10. Thereafter, the conductor film 281 and the inorganic insulating film 255 are removed partially using the first thin film conductors 231 by means of dry etching such as RIE or milling or wet etching. In this case, the base 16 is partially exposed via the first thin film conductors 231.

Then, as shown in FIG. 24, the inorganic insulating film 251 is formed in a uniform thickness so as to cover the first thin film conductors 231 and the base 16 by means of sputtering or CVD.

Figure 25:
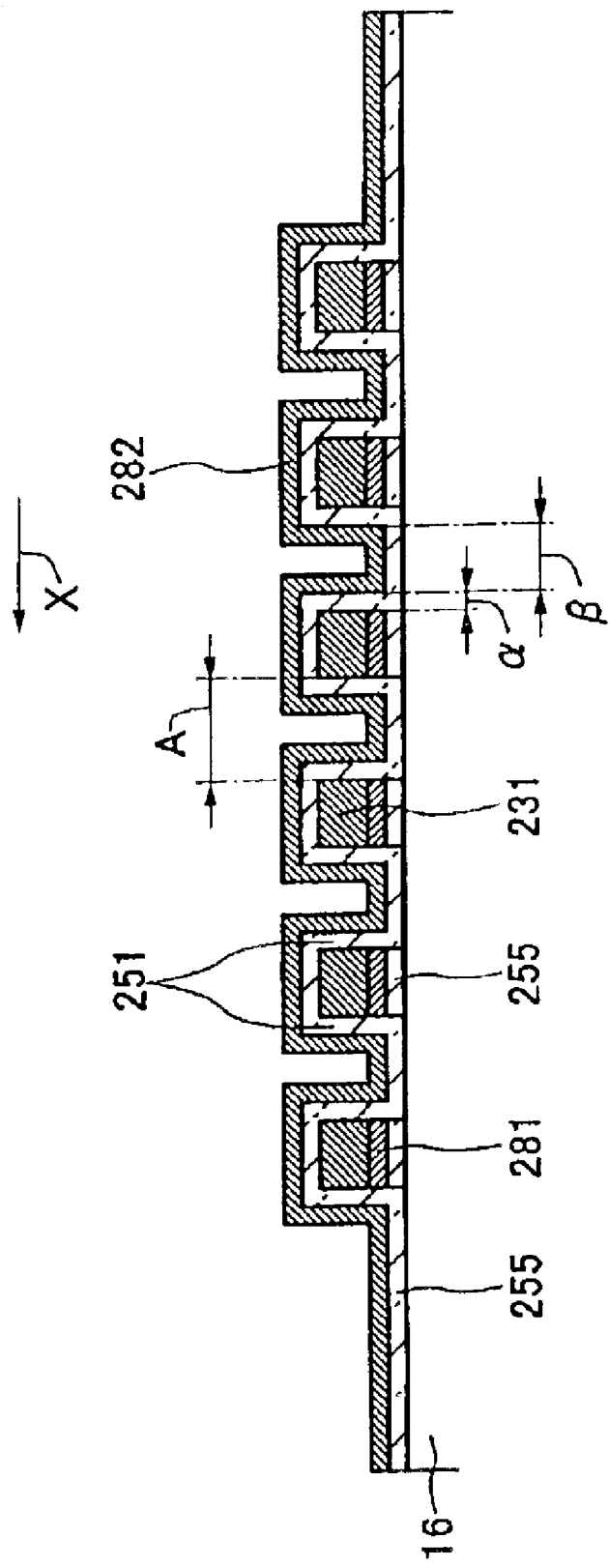
FIG. 25 is a schematic view showing the step after the step shown in FIG. 24.

Then, as shown in FIG. 25, the conductor film 282 as a plating electrode film is formed on the inorganic insulating film 251 by means of sputtering or CVD.

Thereafter, the steps shown in FIGS. 14–21 are performed on the assembly shown in FIG. 25 to fabricate the micro device shown in FIGS. 1 and 2.

In the fabricating process as mentioned above, the thickness of the first thin film conductor 231 is set almost equal to the thickness of the second thin film conductor 232 (see, FIGS. 1 and 2).

3. Micro Device as a Thin Film Inductor

Figure 26:
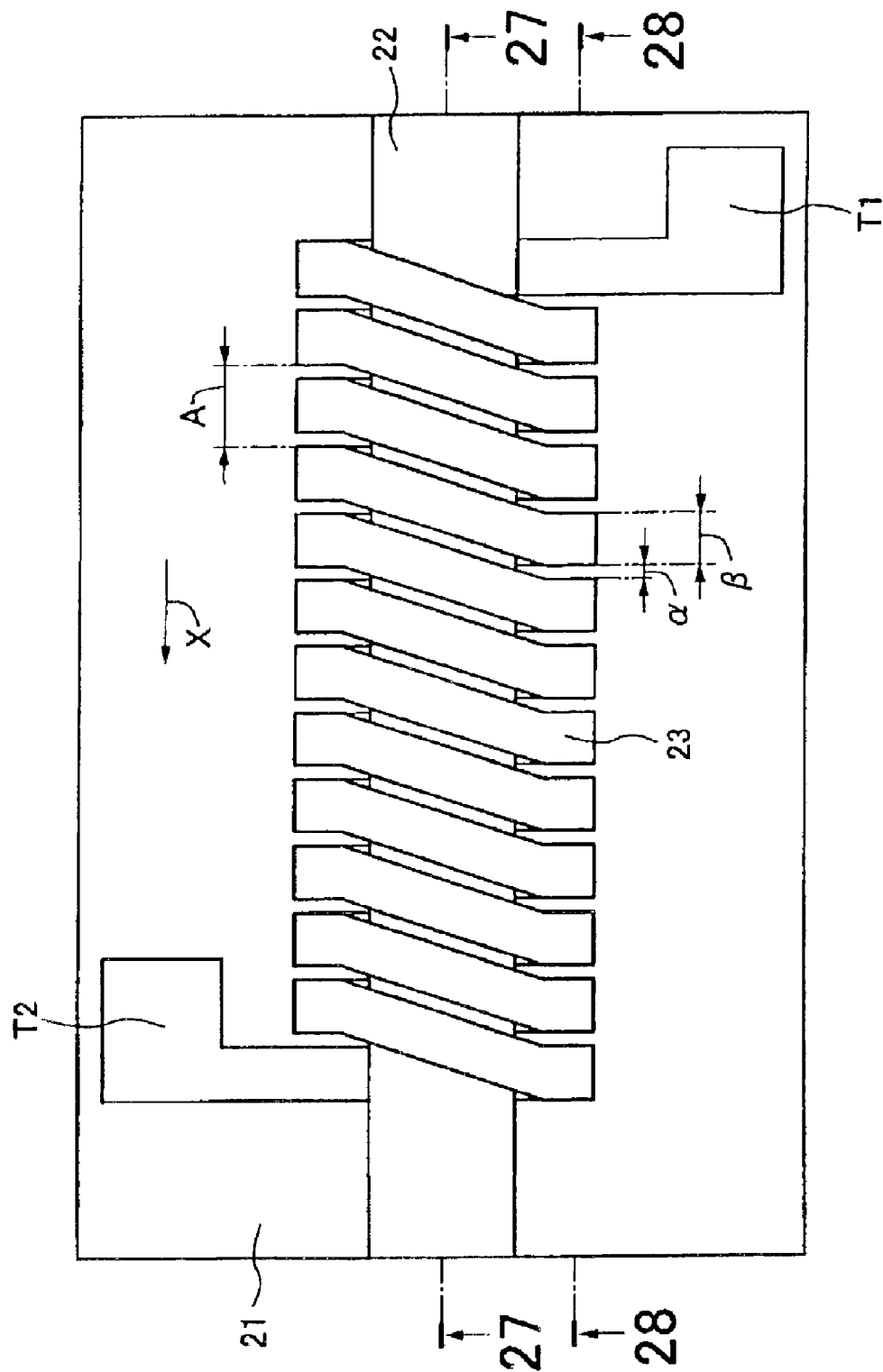
FIG. 26 is a plan view showing another micro device with a thin film coil structure according to the present invention.
Figure 27:
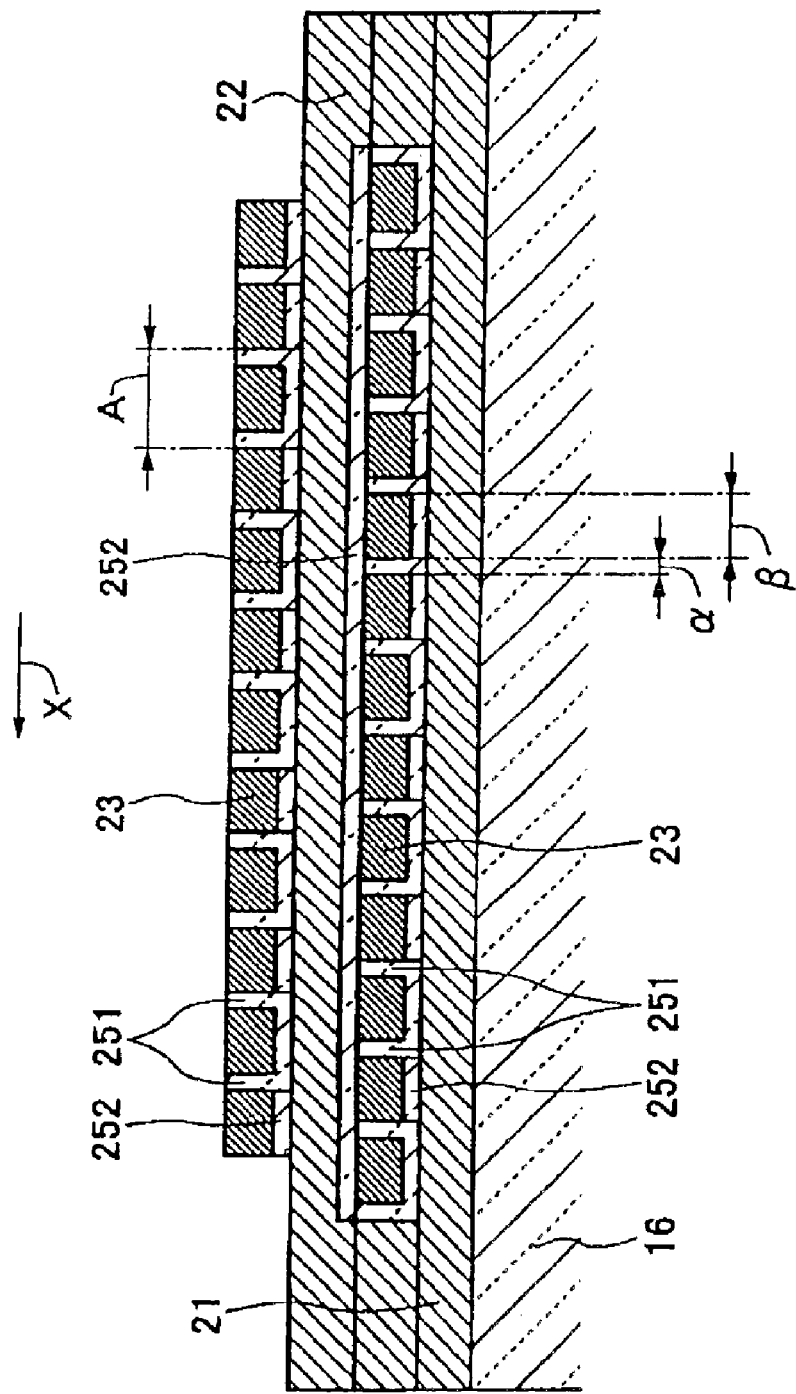
FIG. 27 is a cross sectional view of the micro device shown in FIG. 26, taken on line "27—27"
Figure 28:
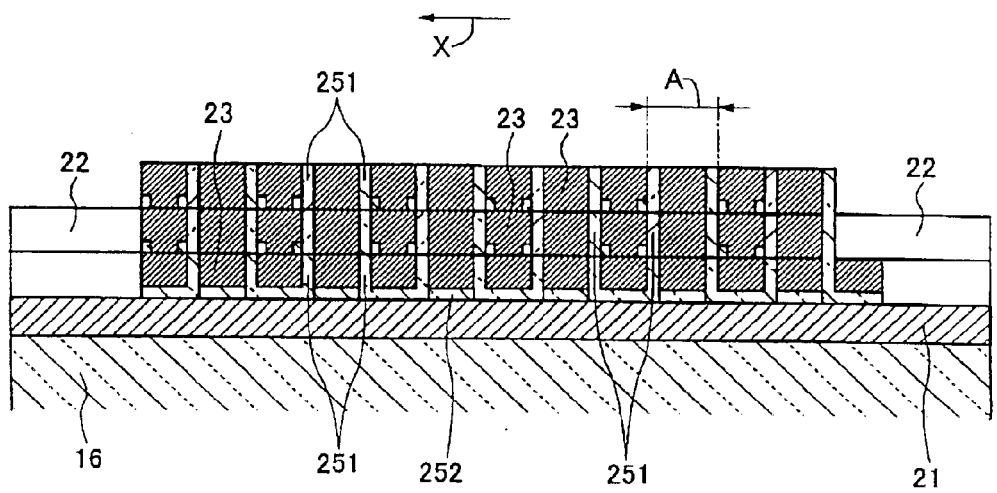
FIG. 28 is a cross sectional view of the micro device shown in FIG. 26, taken on line "28—28"

FIG. 26 is a plan view showing a micro device with a thin film coil structure according to the present invention, and FIG. 27 is a cross sectional view of the micro device shown in FIG. 26, taken on line "27—27", and FIG. 28 is a cross sectional view of the micro device shown in FIG. 26, taken on line "28—28". The illustrated micro device includes a thin film coil 23 and an inorganic insulating film 251.

The thin film coil 23 is wound helically around an axis "X". The thin film coil 23 is made of a conductive metallic material such as Cu. Both ends of the thin film coil 23 constitutes terminals T1 and T2. Under the terminals T1 and T2 are provided the insulating film 252 (see, FIG. 27). The winding number of the thin film coil 23 is not restricted.

As shown in FIG. 28, in the embodiment, the thin film coil 23 is composed of a three-layered structure at both ends thereof so as to maintain the uniform thickness entirely. The layer number of the thin film coil is determined on the required total thickness thereof.

The inorganic insulating film 251 is formed so as to embed the gaps $\alpha$ between the adjacent coil turns. The inorganic insulating film 251 may be made of $Al_2O_3$, $SiO_2$, AlN or DLC by means of dry thin film forming method such as sputtering or CVD.

In the thin film coil 23, each coil turn is located in the region defined by the distance "A", and is separated from the adjacent coil turn by the gap $\alpha$, which is set smaller than the coil width $\beta$ of each coil turn and defined by the thickness of the inorganic insulating film 251.

In the thin film inductor illustrated in FIGS. 26–28, the thin film coil 23 is wound helically around the axis "X". Therefore, the thin film coil 23 has a perpendicular winding structure shifted from a normal planer winding structure by 90 degrees. As a result, the thin film coil 23 can have several advantages in the perpendicular winding structure.

In the thin film coil 23, the distance "A" is determined on the bottom width of the resist frame, and an additional coil turn is formed in the region "A" between the inherent adjacent coil turns.

Therefore, the density of the coil turn can be increased, so that the total length of the thin film coil can be shortened and thus, the impedance of the thin film coil can be reduced. As a result, the high frequency performance can be enhanced.

The inorganic insulating film 251 may be made by means of sputtering or CVD. Therefore, the lower limited value of the gap width $\alpha$ can be determined on the film-forming technique.

Preferably, the gap width $\alpha$ is set within 0.01–0.05 $\mu$m. Such a gap width can be realized by the above-mentioned film-forming technique. Moreover, the adjacent coil turns can be electrically insulated by the gap width $\alpha$.

Preferably, the gap width $\alpha$ and the coil width $\beta$ satisfies the following relation:

$$(1/300) \leq \alpha/\beta \leq (1/5)$$

In the above relation, if the gap width $\alpha$ is set within 0.01–0.05 $\mu$m, the coil width $\beta$ is set within 0.25–3 $\mu$m. In this case, the thin film coil 23 can exhibit its inherent performance in the thin film inductor.

In the embodiment shown in FIGS. 26–28, a first magnetic layer 21 and a second magnetic layer 22 are formed. The first magnetic layer 21 is supported by an insulating layer 16 constituting a base and provided outside the thin film coil 23. The insulating layer 16 may be made of an inorganic insulating material such as $Al_2O_3$, $SiO_2$, AlN or DLC.

In the embodiment, the first magnetic layer 21 is formed in plane beyond the thin film coil 23. The second magnetic layer 22 is formed in and beyond the thin film coil 23 along the direction X.

The first and the second magnetic layers 21 and 22 may be made of a magnetic material such as NIFe, CoFe, FeN or FeZrN. The first and the second magnetic layers 21 and 22 may be composed of a single layered structure or a multi-layered structure. The thickness of the first and the second magnetic layers may be set within 0.5–3 $\mu$m by means of frame plating.

The first and the second magnetic layers are magnetically joined beyond the thin film coil 23 to complete a magnetic circuit. Therefore, the first and the second magnetic layers constitutes a thin film core of the magnetic circuit.

In this embodiment, the thin film coil 23 is connected to the first and the second magnetic layers 21 and 22 via the inorganic insulating film 252, which may be made in the same manner as the inorganic insulating film 251 to embed the gaps between their respective adjacent coil turns.

In another embodiment, the first and the second magnetic layers 21 and 22 may be omitted. In this case, an air-core type thin film inductor can be provided.

In this embodiment shown in FIGS. 26–28, the thin film coil 23 is made of a single coil layer, but may be made of plural coil layers, for example, which are provided independently or joined in series or in parallel. The thin film inductor can be fabricated as a complete electronic part or as a part of an integrated circuit and the like.

4. Micro Device as a Thin Film Magnetic Head

Figure 29:
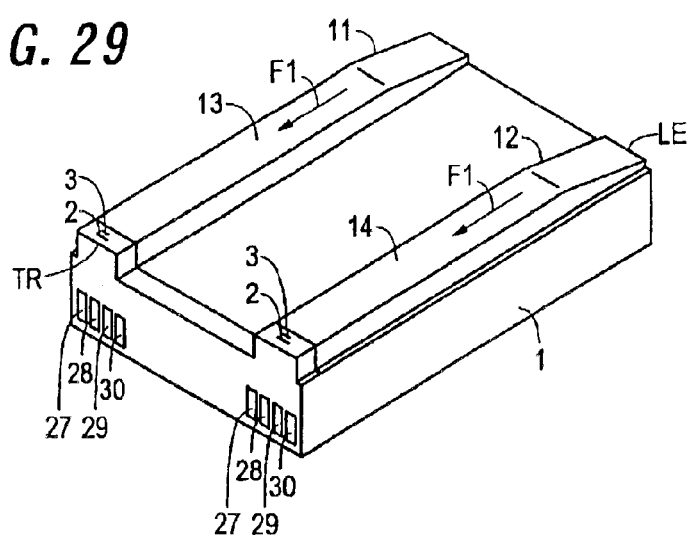
FIG. 29 is a thin film magnetic head as a micro device according to the present invention.
Figure 30:
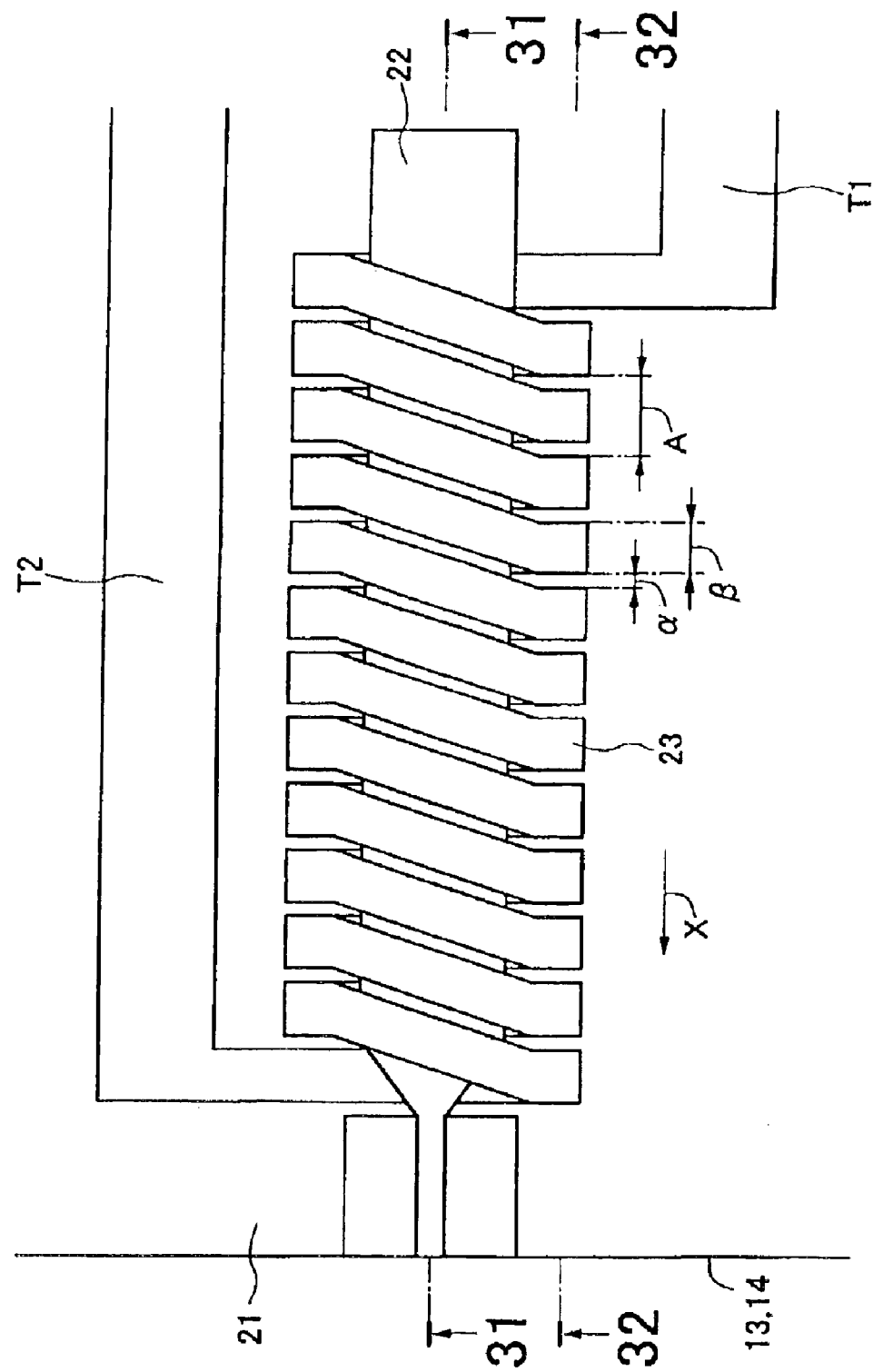
FIG. 30 is an enlarged plan view showing the thin film magnetic head shown in FIG. 29.
Figure 31:
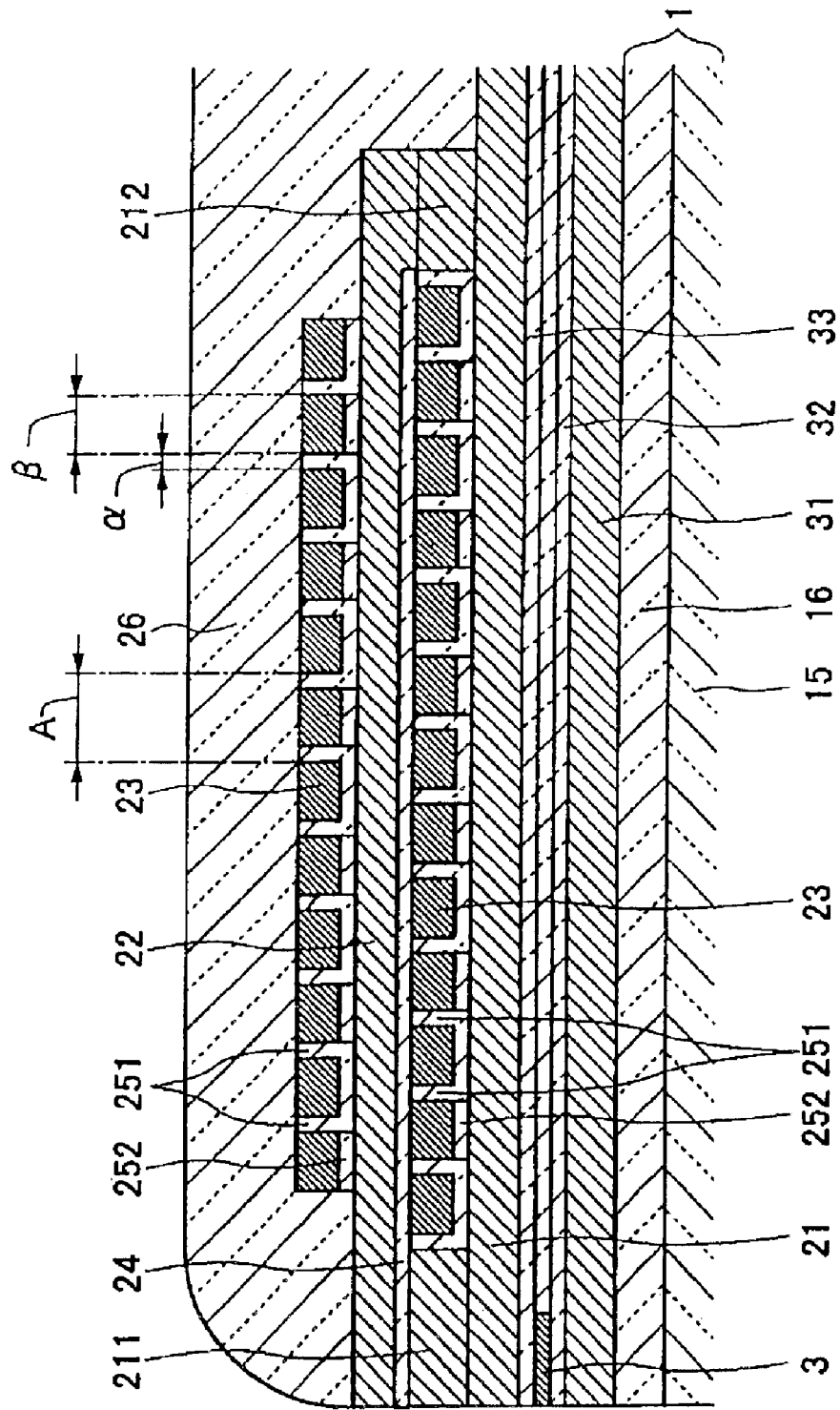
FIG. 31 is a cross sectional view of the thin film magnetic head shown in FIG. 30, taken on line "31—31"
Figure 32:
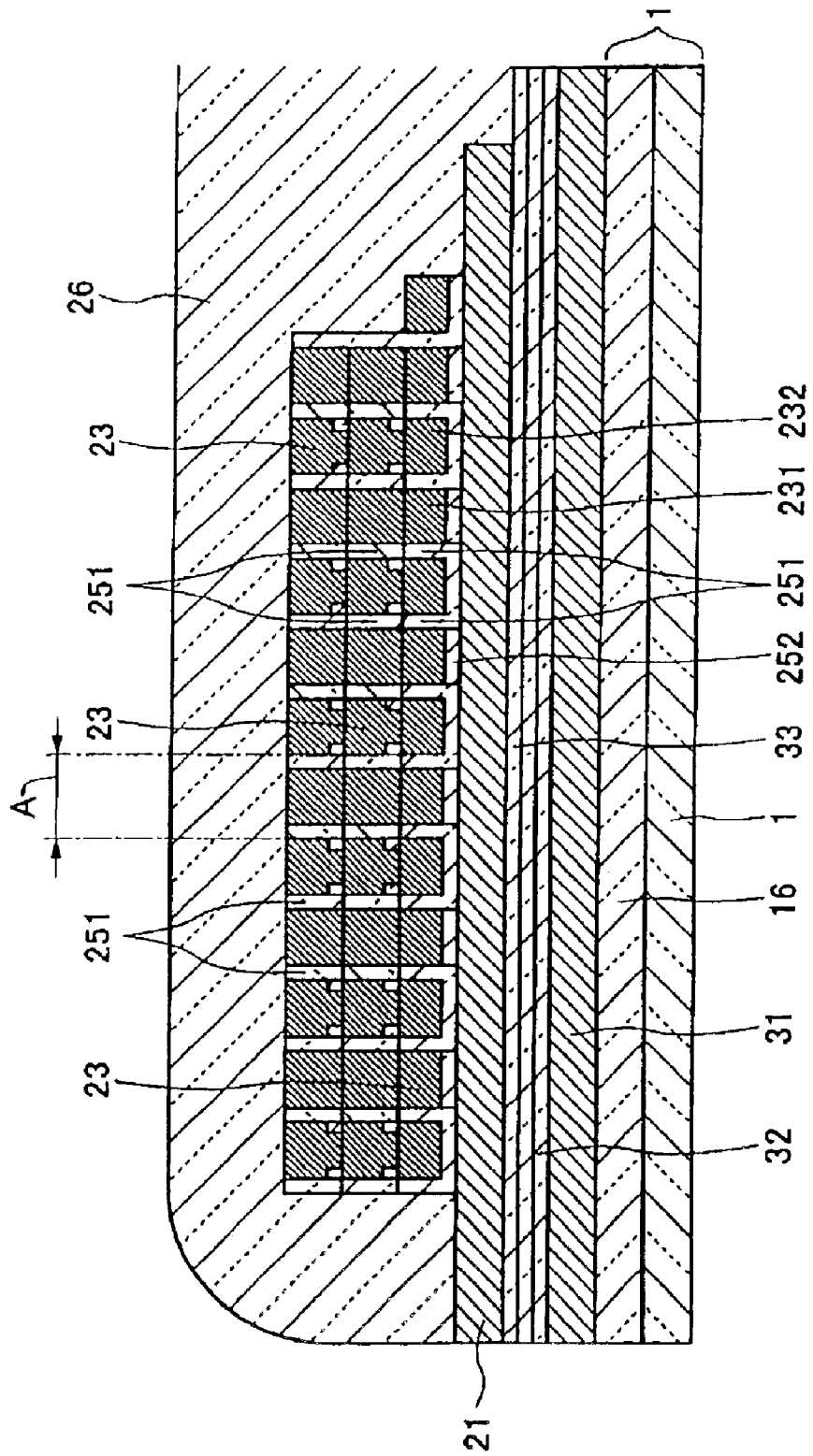
FIG. 32 is a cross sectional view of the thin film magnetic head shown in FIG. 30, taken on line "32—32"

FIG. 29 is a thin film magnetic head as a micro device according to the present invention, and FIG. 30 is an enlarged plan view showing the thin film magnetic head shown in FIG. 29. FIG. 31 is a cross sectional view of the thin film magnetic head shown in FIG. 30, taken on line "31—31", and FIG. 32 is a cross sectional view of the thin film magnetic head shown in FIG. 30, taken on line "32—32". In this embodiment, the illustrated thin film magnetic head includes a slider 1, a writing element 2 and a reading element 3.

The slider 1 has rail portions 11 and 12 on its medium opposing surface, and the surfaces of the rail portions 11 and 12 are employed as ABSs 13 and 14. The slider 1 is not always required to have the two rail portions 11 and 12. For example, it may have one to three rail parts or a flat surface without the rail. For improving its floating performance, the slider 1 may have rail portions with geometrical shapes. This invention can be applied for any kind of slider. The slider 1 may have a protection film with a thickness of 3–8 nm made of DLC or the like on the rail portions, and in this case, the ABSs 13 and 14 are composed of the surfaces of the protection film. The slider 1 is a ceramic structural body which is composed of a base 15 made of $Al_2O_3$—TiC or the like and an insulating layer 16 made of $Al_2O_3$, $SiO_2$ or the like on the base 15.

Generally, the writing element 2 is composed of an inductive type magnetic conversion element, and the reading element 3 is composed of a MR element. The writing element 2 and the reading element 3 are provided on either or both of the ABSs 13 and 14 of the rail portions 11 and 12 in an air outflow edge (trailing edge) TR, as viewed from the airflow direction. On the side adjacent to the air outflow edge TR are provided pull-out electrodes 27 and 28 for the writing element 2 and pull-out electrodes 29 and 30 for the reading element 3.

The writing element 2 includes a first magnetic layer 21, a second magnetic layer 22, a thin film coil 23, a gap layer made of alumina, etc., inorganic insulating films 251 and 252, and a protective layer 26. The first magnetic layer 21 may function as a second shielding layer for the reading element 3. The second shielding layer may be provided independently from the first magnetic layer 21.

The thin film coil 23 is wound helically around an axis "X". The thin film coil 23 is made of a conductive metallic material such as Cu. Both ends of the thin film coil 23 constitutes terminals T1 and T2, which are connected to the pull-out electrodes 27 and 28. The winding number of the thin film coil 23 is not restricted.

In the thin film coil 23, each coil turn is provided in the region defined by a distance "A" and separately from the adjacent coil turn. In this case, the gap width $\alpha$ is defined by the thickness of the inorganic insulating film 251.

The inorganic insulating film 251 is formed so as to embed the gaps $\alpha$ between the adjacent coil turns. The inorganic insulating film 251 may be made of $Al_2O_3$, $SiO_2$, AlN or DLC by means of dry thin film forming method such as sputtering or CVD.

In the thin film magnetic head in FIGS. 29–32, the thin film coil 23 is wound helically around the axis "X". Therefore, the thin film coil 23 has a perpendicular winding structure shifted from a normal planer winding structure by 90 degrees. As a result, the thin film coil 23 can have several advantages in the perpendicular winding structure.

In the thin film coil 23, the distance "A" is determined on the bottom width of the resist frame, and an additional coil turn is formed in the region "A" between the inherent adjacent coil turns.

Therefore, the density of the coil turn can be increased, so that the total length of the thin film coil can be shortened and thus, the impedance of the thin film coil can be reduced. As a result, the high frequency performance can be enhanced.

The inorganic insulating film 251 may be made by means of sputtering or CVD. Therefore, the lower limited value of the gap width $\alpha$ can be determined on the film-forming technique.

Preferably, the gap width $\alpha$ is set within 0.01–0.05 $\mu$m. Such a gap width can be realized by the above-mentioned film-forming technique. Moreover, the adjacent coil turns can be electrically insulated by the gap width $\alpha$.

Preferably, the gap width $\alpha$ and the coil width $\beta$ satisfies the following relation:

$$(1/300) \leq \alpha/\beta \leq (1/5).$$

In this case, the coil width $\beta$ is defined by the thickness of the coil turn as viewed along the direction X.

In the above relation, if the gap width $\alpha$ is set within 0.01–0.05 $\mu$m, the coil width $\beta$ is set within 0.25–3 $\mu$m. In this case, the thin film coil 23 can exhibit its inherent performance in the thin film magnetic head.

The first magnetic layer 21 is supported by insulating layers 32 and 33, and provided outside the thin film coil 23. The insulating layers 32 and 33 may be made of an inorganic insulating material such as $Al_2O_3$, $SiO_2$, AlN or DLC. The second magnetic layer 22 is formed in and beyond the thin film coil 23 along the direction X.

The first and the second magnetic layers 21 and 22 may be made of a magnetic material such as NIFe, CoFe, FeN or FeZrN. The first and the second magnetic layers 21 and 22 may be composed of a single layered structure or a multi-layered structure for improving the performance of the writing head. The thickness of the first and the second magnetic layers may be set within 0.5–3 $\mu$m by means of frame plating.

The forefronts of the first and the second magnetic films 21 and 22 are opposed each other via the gap layer 24 with a minute thickness, and thereby, constitute a pole portion for writing. For the improvement of the writing element, such as the reduction in track width or the enhancement in recording performance, various pole portion structures have been proposed. In this embodiment, any kind of pole portion structure can be employed. The gap layer 24 is made of an inorganic insulating layer such as alumina, etc.

The second magnetic layer 22 is formed so as to be opposite to the first magnetic layer 21 by a minute gap, and one end of the second magnetic layer 22 is magnetically joined to the first magnetic layer 21 via a backward joint. Therefore, a given thin film magnetic circuit is composed of the first and the second magnetic layers 21 and 22, and the gap layer 24.

In this embodiment, the thin film coil 23 is connected to the first and the second magnetic layers 21 and 22 via the inorganic insulating film 252, which may be made in the same manner as the inorganic insulating film 251.

The writing element 2 is covered with an protective layer 26 entirely. The protective layer 26 is made of an inorganic insulating material such as $Al_2O_3$ or $SiO_2$.

Around the reading element 3 are provided a first shielding layer 31, the insulating layers 32; 33, and the first magnetic layer 21 functioning as the second shielding layer 21. The first shielding layer 31 is made of permalloy. The reading element 3 is disposed in between the first and the second shielding layers 31 and 21. The edge of the reading element 3 is exposed to the ABSs 13 and 14.

The reading element 3 includes a giant magnetoresistive effective element (GMR element) made of a spin-valve film or a ferromagnetic tunnel junction element.

5. Method for Fabricating a Thin Film Magnetic Head

Figure 33:
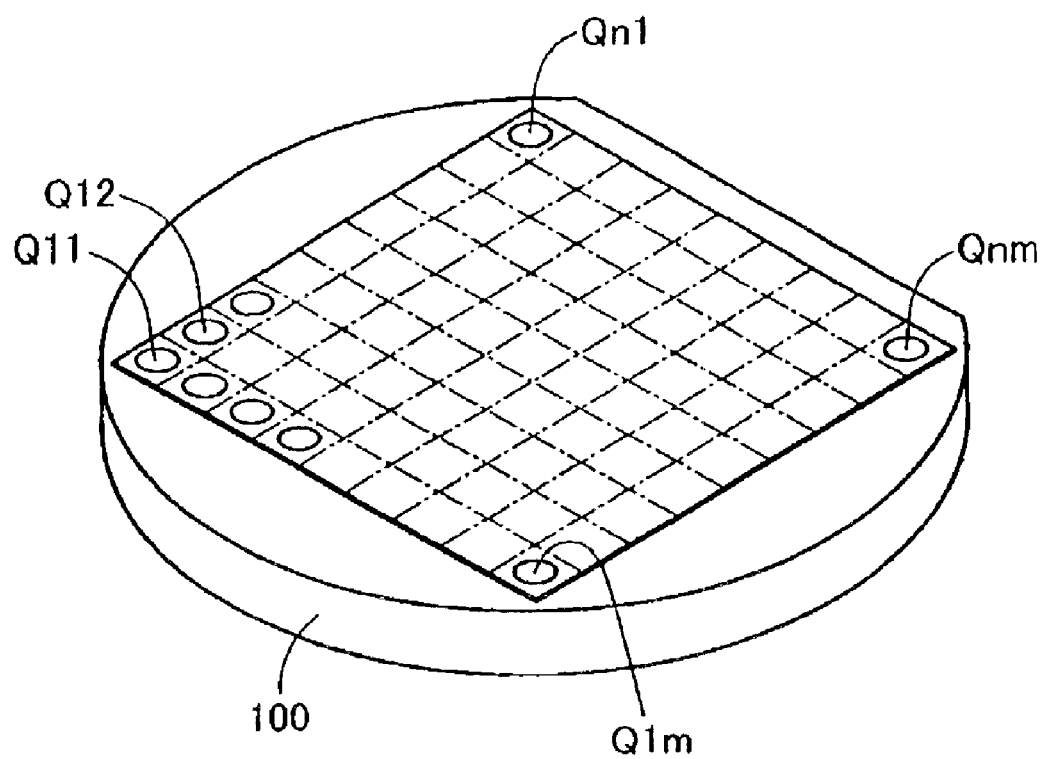
FIG. 33 is a perspective view showing a wafer where the fabricating method of thin film magnetic head as shown in FIGS. 29–32 is carried out.
Figure 99:
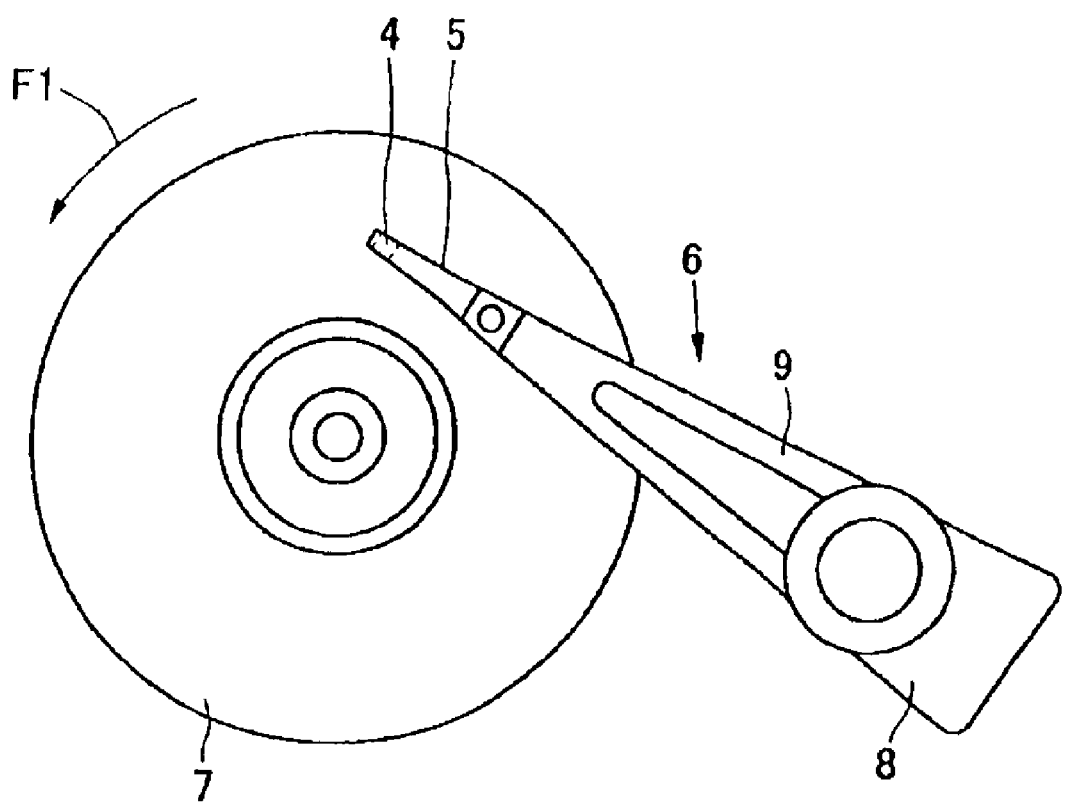
FIG. 99 is a plan view showing a magnetic recording/reproducing device according to the present invention.

FIGS. 33–99 are explanatory views for the fabricating method of the thin film magnetic head shown in FIGS. 29–32. Herein, the above-mentioned thin film inductor may be fabricated by the following fabricating method.

The fabricating steps to be shown in FIGS. 33–99 are performed on a wafer 100 shown in FIG. 33. In this embodiment, thin film magnetic head elements Q11~Qnm constituting reading elements are prepared on the wafer 100 through a given fabrication process in advance. In this embodiment, the following fabricating steps is typically made for one thin film magnetic head element.

Figure 34:
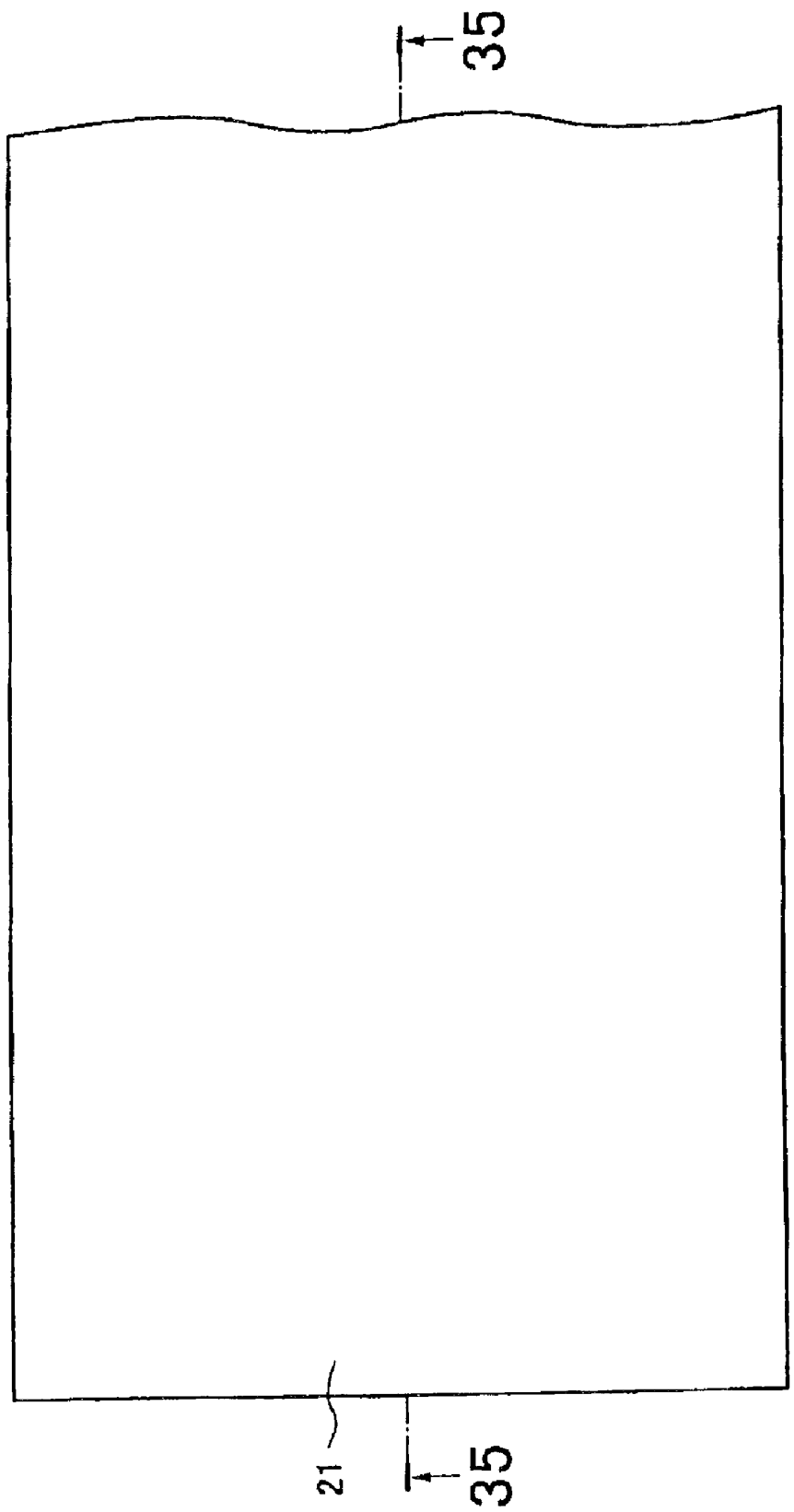
FIG. 34 is a plan view showing an area on the wafer shown in FIG. 33 where a thin film magnetic head element is fabricated.
Figure 35:
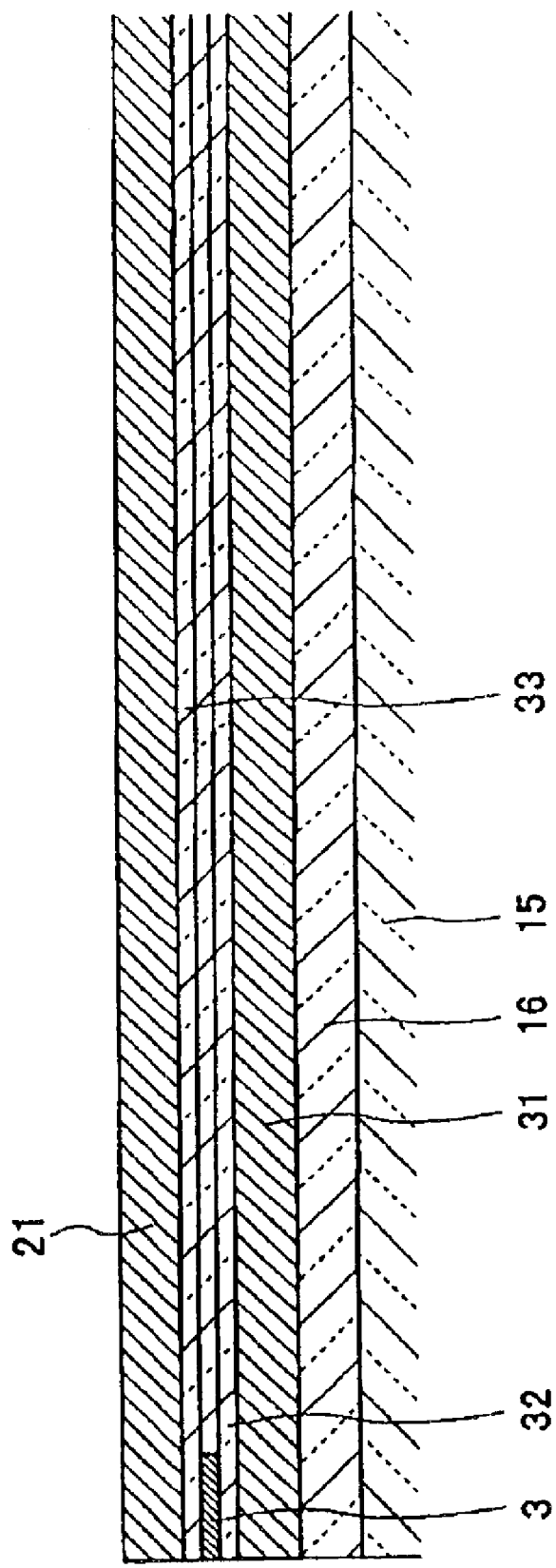
FIG. 35 is cross sectional view showing the area shown in FIG. 34, taken on line "35—35"

FIG. 34 is a plan view showing one thin film magnetic head element on the wafer 100 shown in FIG. 33, and FIG. 35 is cross sectional view showing the one thin film magnetic head element shown in FIG. 34, taken on line "35—35". In the one thin film magnetic head element, the reading element 3 is embedded between the insulating layers 32 and 33. As shown in FIGS. 34 and 35, the first magnetic layer 21 is formed on the insulating layer 33. The first magnetic layer 21 is made of a magnetic material such as NiFe, CoFe, FeN or FeZrN in a thickness of 0.5–3 $\mu$m by means of frame plating or the like.

Figure 36:
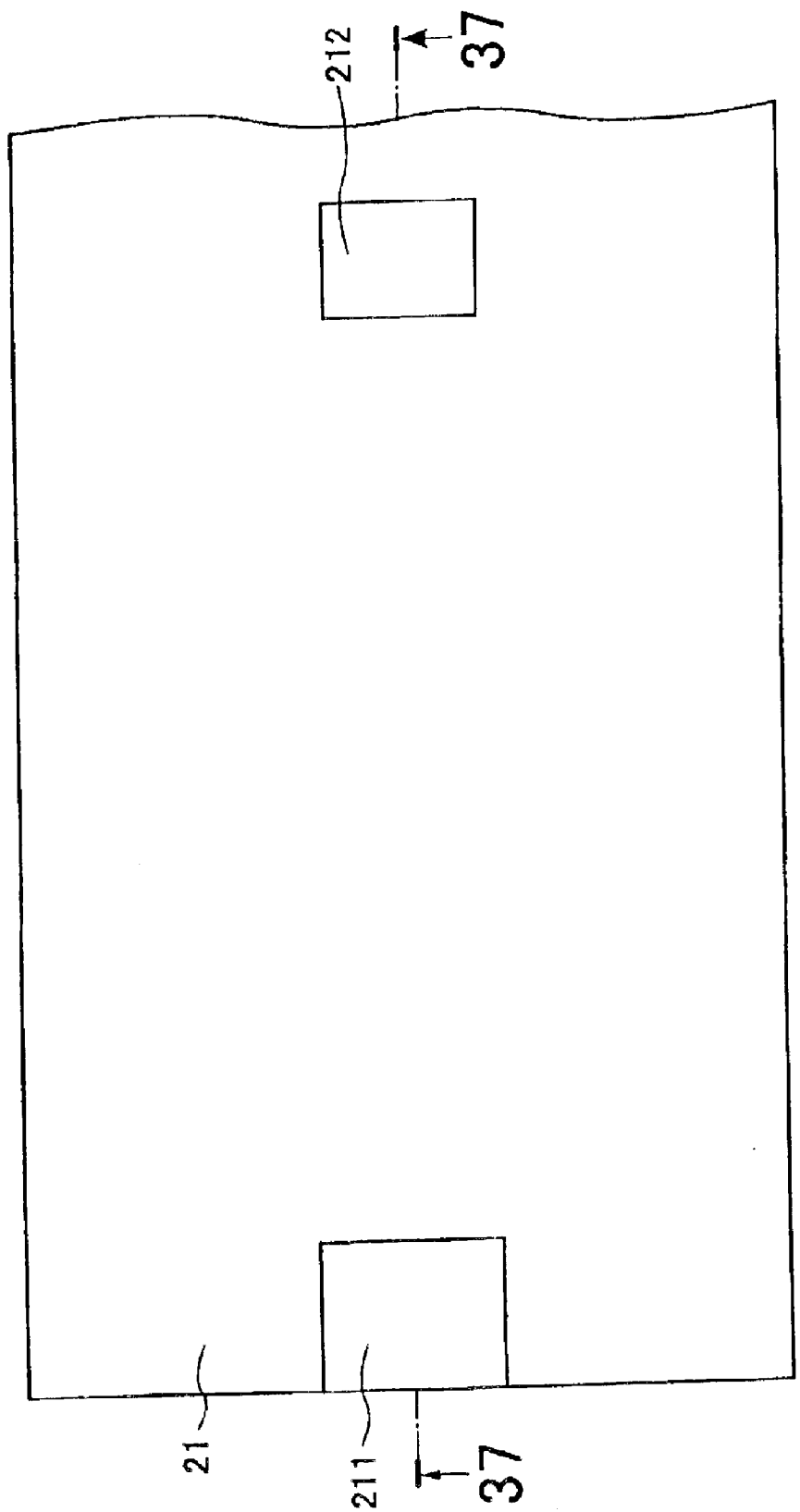
FIG. 36 is a plan view showing the area where the above-mentioned fabricating method is performed.
Figure 37:
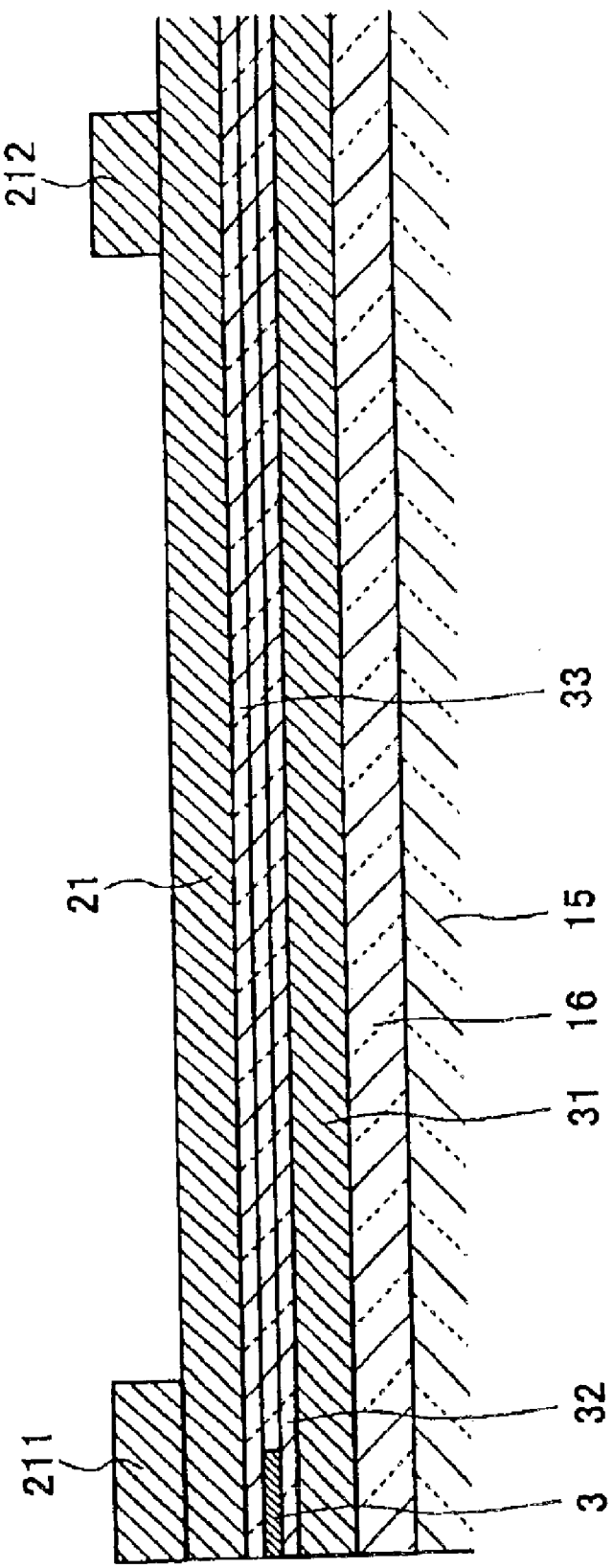
FIG. 37 is a cross sectional view showing the area shown in FIG. 36, taken on line "37—37"

FIG. 36 is a plan view showing the step after the step shown in FIGS. 34 and 35, and FIG. 37 is a cross sectional view of the assembly shown in FIG. 36, taken on line "37—37". Then, as shown in FIGS. 36 and 37, a magnetic pole edge layer 211 and a backgap layer 212 are formed of a magnetic material such as NiFe, CoFe, FeN or FeZrN in a thickness of 0.5–3 $\mu$m on the first magnetic layer 21 by means of frame plating.

Figure 38:
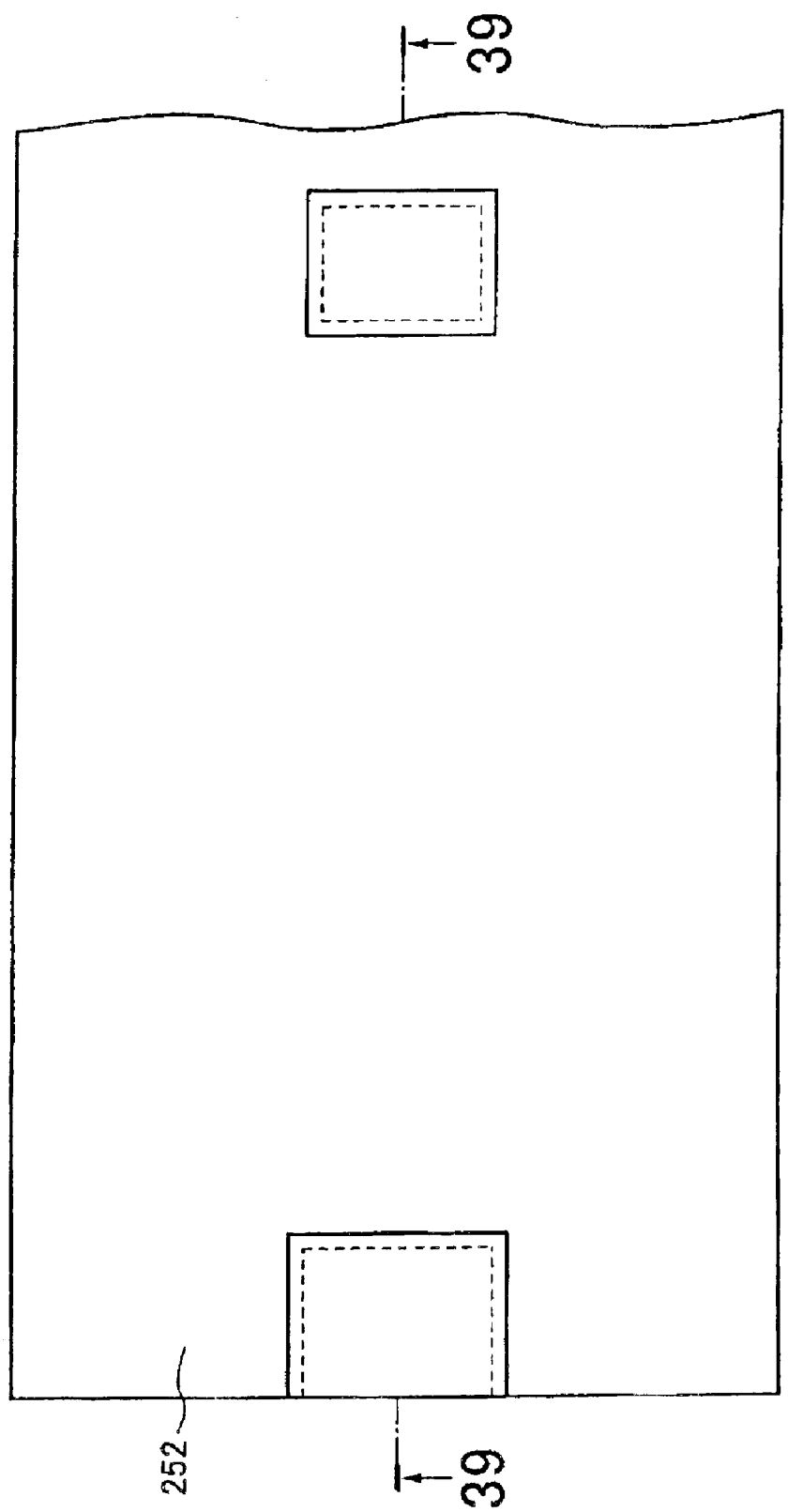
FIG. 38 is a plan view showing the step after the step shown in FIGS. 36 and 37.
Figure 39:
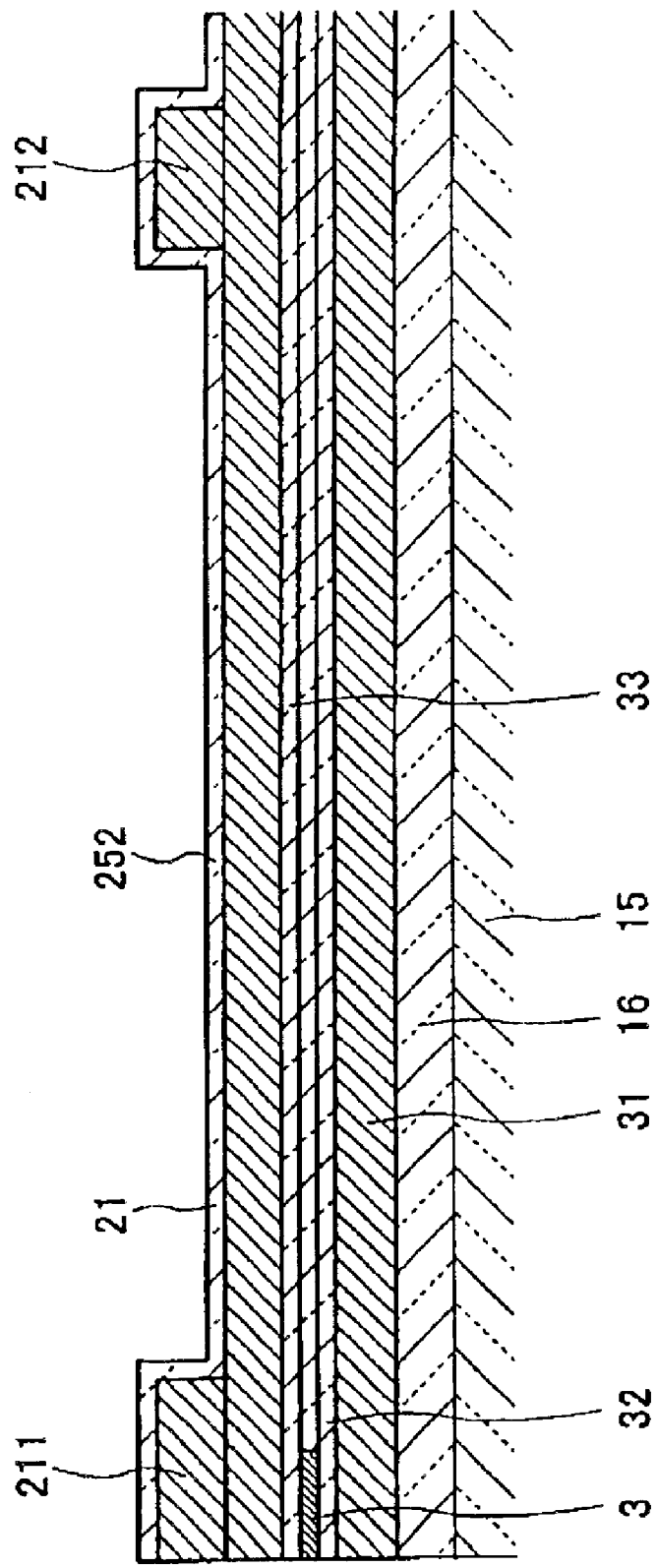
FIG. 39 is a cross sectional view showing the area shown in FIG. 38, taken on line "39—39"

FIG. 38 is a plan view showing the step after the step shown in FIGS. 36 and 37, and FIG. 39 is a cross sectional view showing the area shown in FIG. 38, taken on line "39—39". Then, as shown in FIGS. 38 and 39, the inorganic insulating film 252 is formed of $Al_2O_3$, $SiO_2$, AlN, DLC or the like in a thickness of 0.01–0.05 $\mu$m over the magnetic pole edge layer 211, the first magnetic layer 21 and the backgap layer 211 by means of dry film forming method such as sputtering or CVD.

Figure 40:
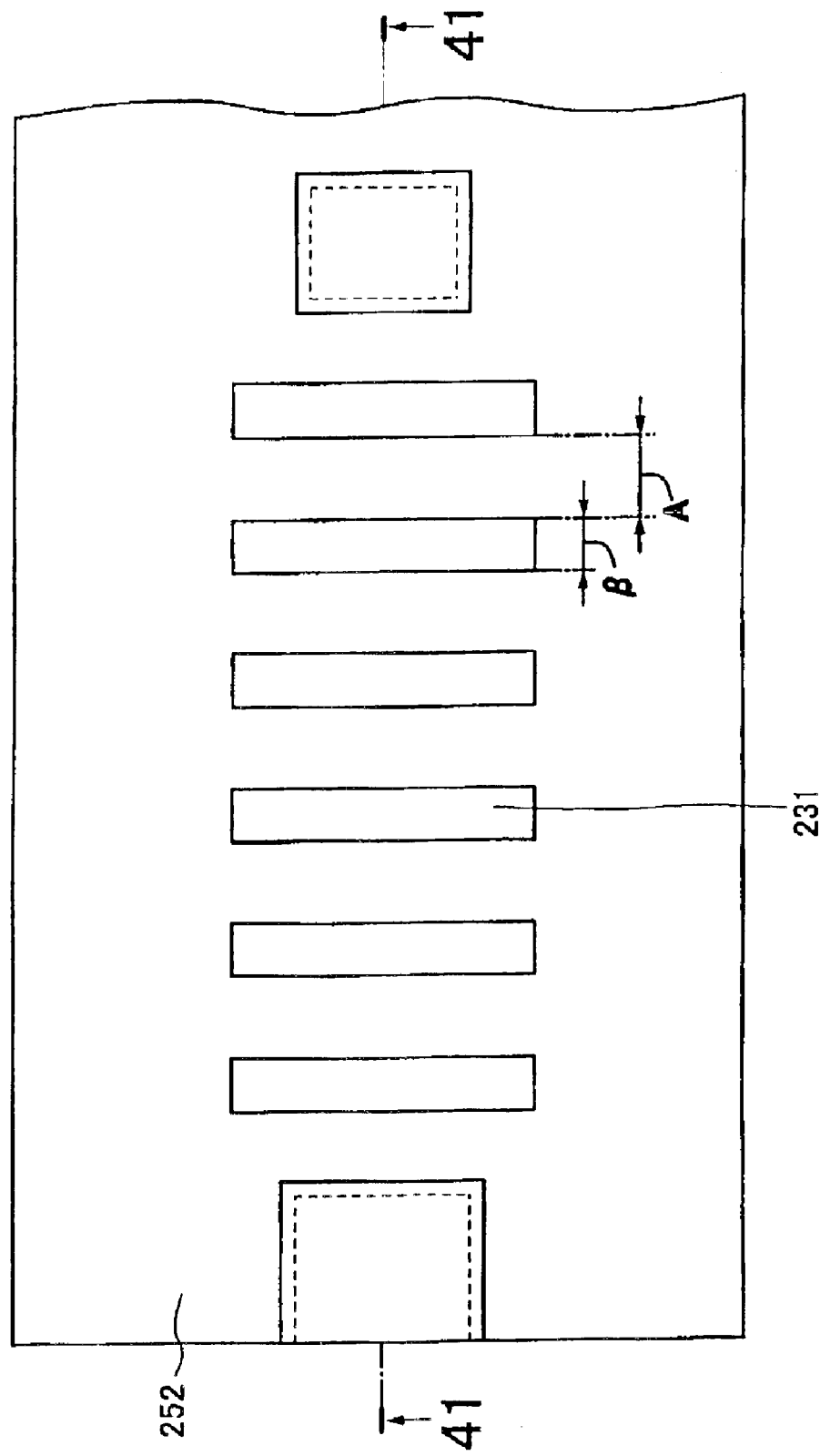
FIG. 40 is a plan view showing the step after the step shown in FIGS. 38 and 39.
Figure 41:
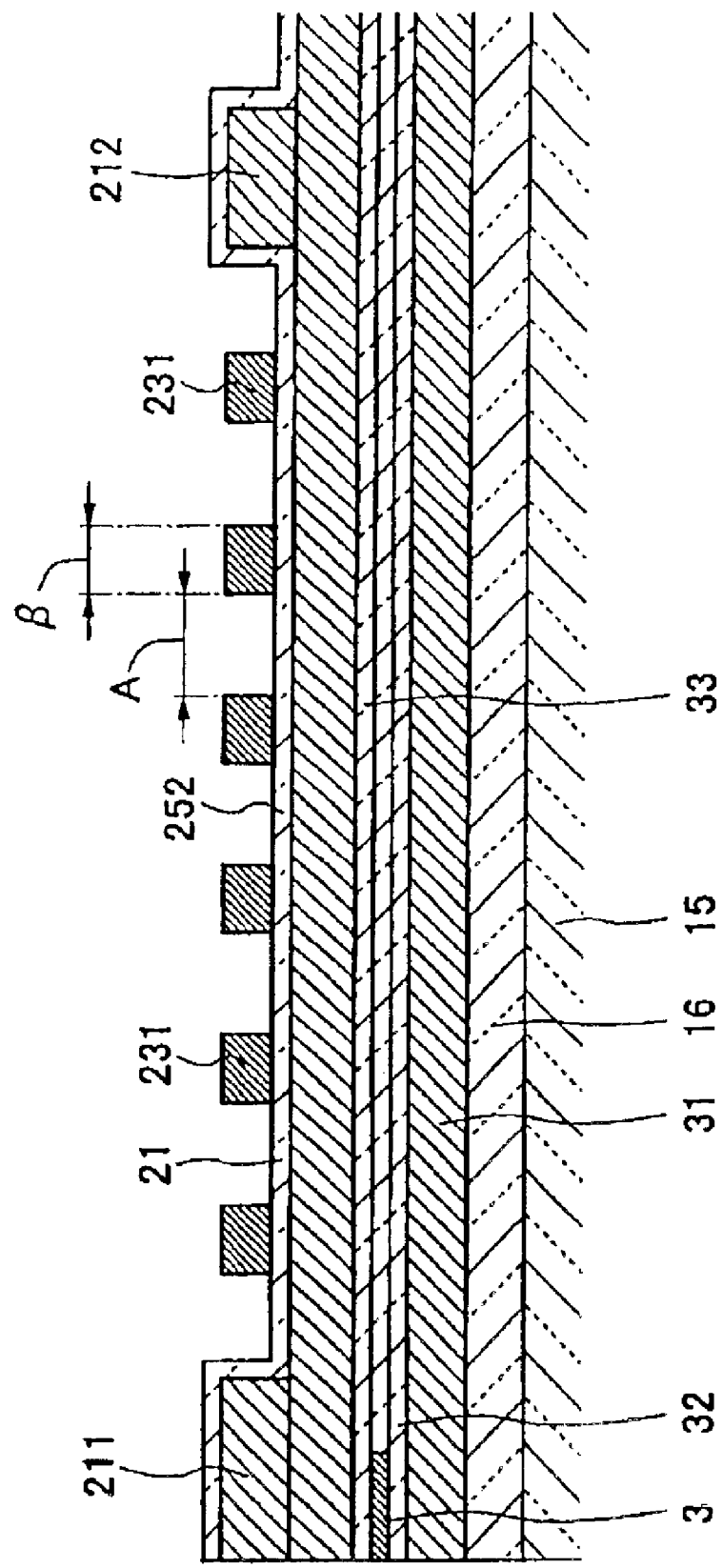
FIG. 41 is a cross sectional view showing the area shown in FIG. 40, taken on line "41—41"

FIG. 40 is a plan view showing the step after the step shown in FIGS. 38 and 39, and FIG. 41 is a cross sectional view showing the area shown in FIG. 40, taken on line "41—41". Thereafter, as shown in FIGS. 40 and 41, plural first thin film conductors 231 are formed on the inorganic insulating film 252 so as to be separated from one another by the distance A and to be arranged in the direction X. Each thin film conductor 231 is made of a conductive material such as Cu in band-like shape by means of frame plating. The first thin film conductors 231 can be fabricated by the steps shown in FIGS. 5–11.

The width $\beta$ of the first thin film conductor 231, which is defined by the thickness as viewed from the direction X, is preferably set within 0.25–3 $\mu$m. The inherent thickness of the first thin film conductor 231, which is defined by the thickness as viewed from the vertical direction, is preferably made thicker, and concretely, can be made twice as thick as the width $\beta$ by means of frame plating.

Figure 42:
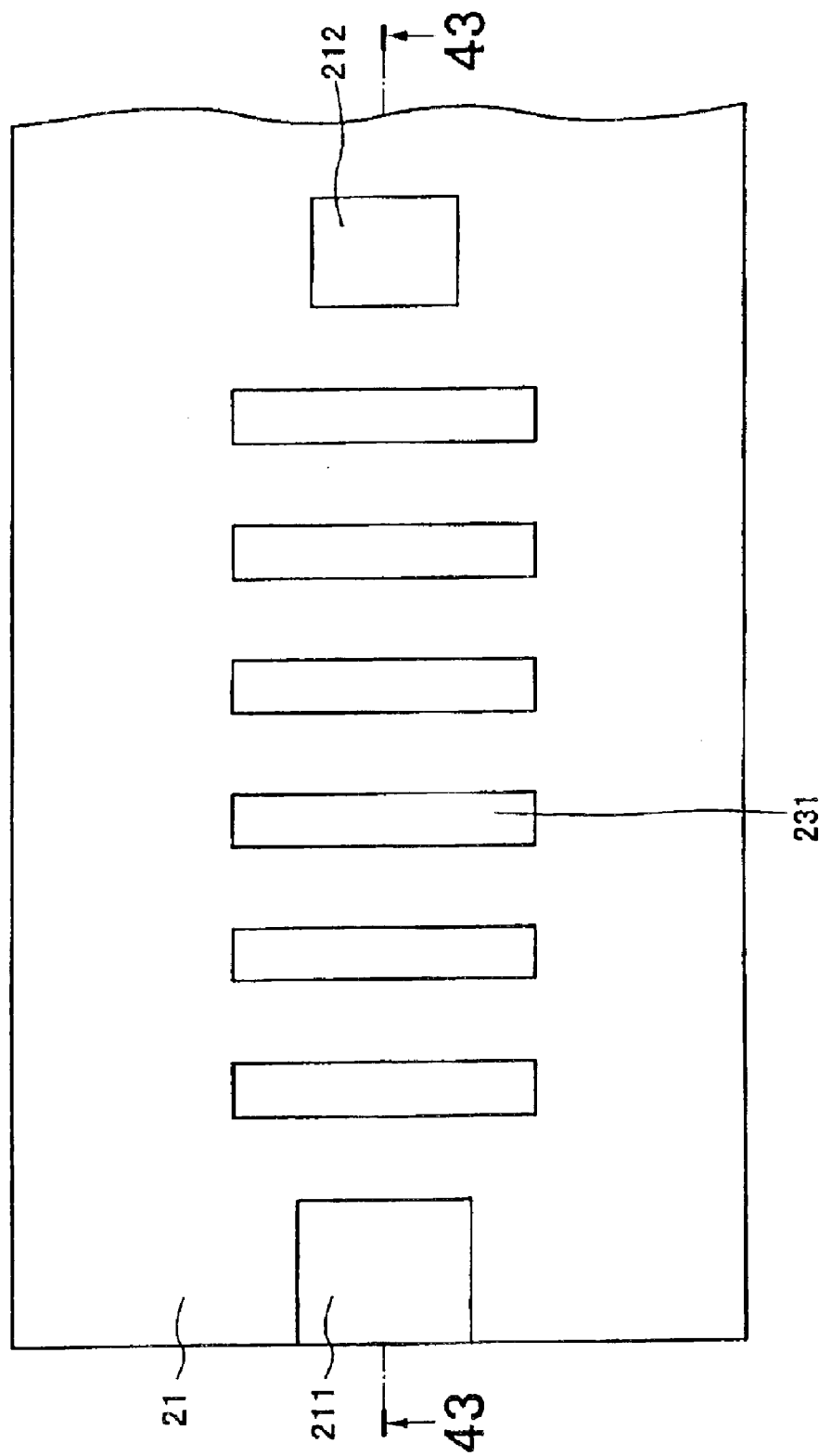
FIG. 42 is a plan view showing the step after the step shown in FIGS. 40 and 41.
Figure 43:
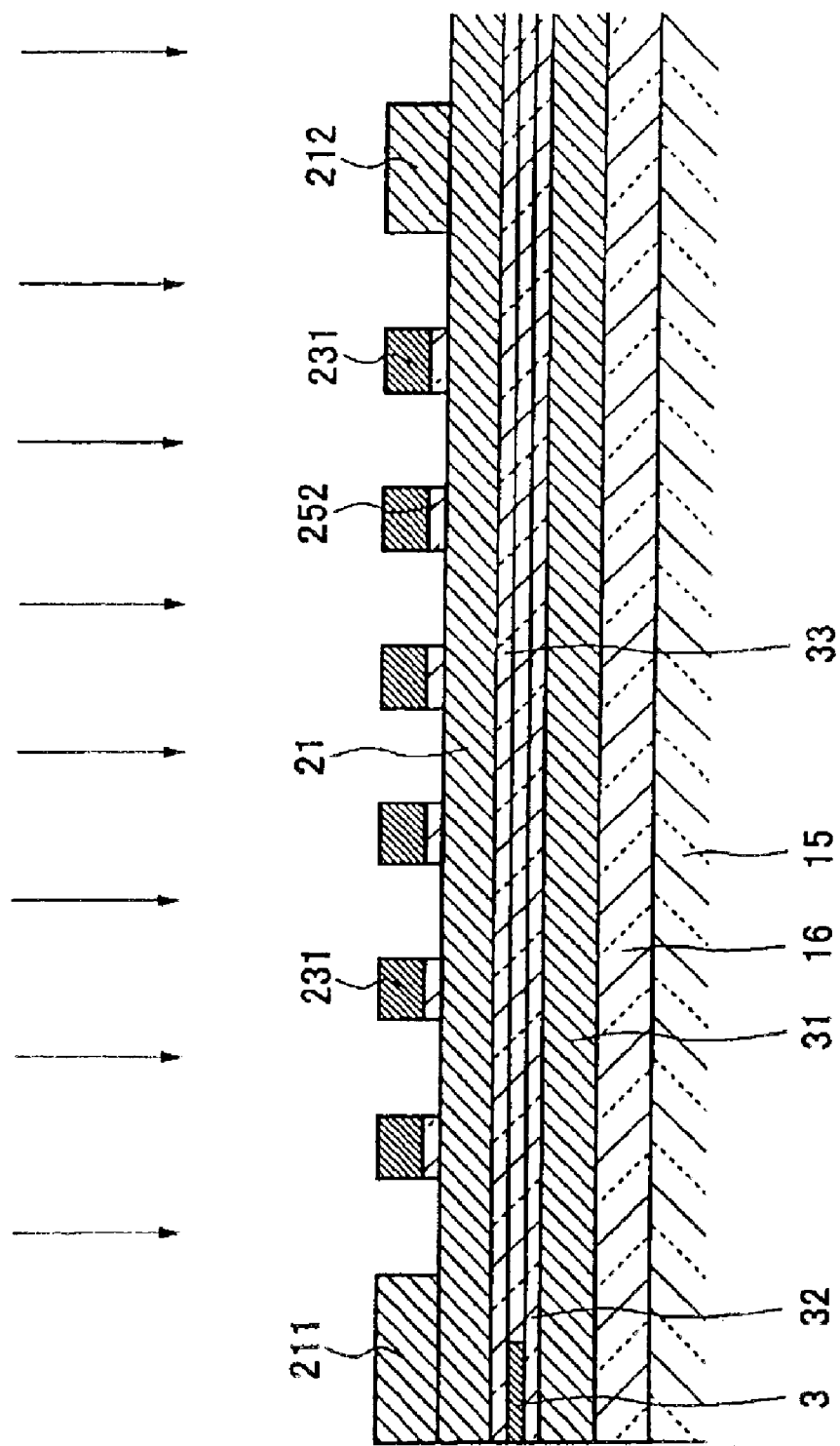
FIG. 43 is a cross sectional view showing the area shown in FIG. 42, taken on line "43—43"

FIG. 42 is a plan view showing the step after the step shown in FIGS. 40 and 41, and FIG. 43 is a cross sectional view showing the area shown in FIG. 42, taken on line "43—43". Then, as shown in FIGS. 42 and 43, the inorganic insulating film 252 is partially removed from in between the adjacent first thin film conductors 231 by means of dry etching such as milling or RIE using the first thin film conductors 231 as a mask.

Figure 44:
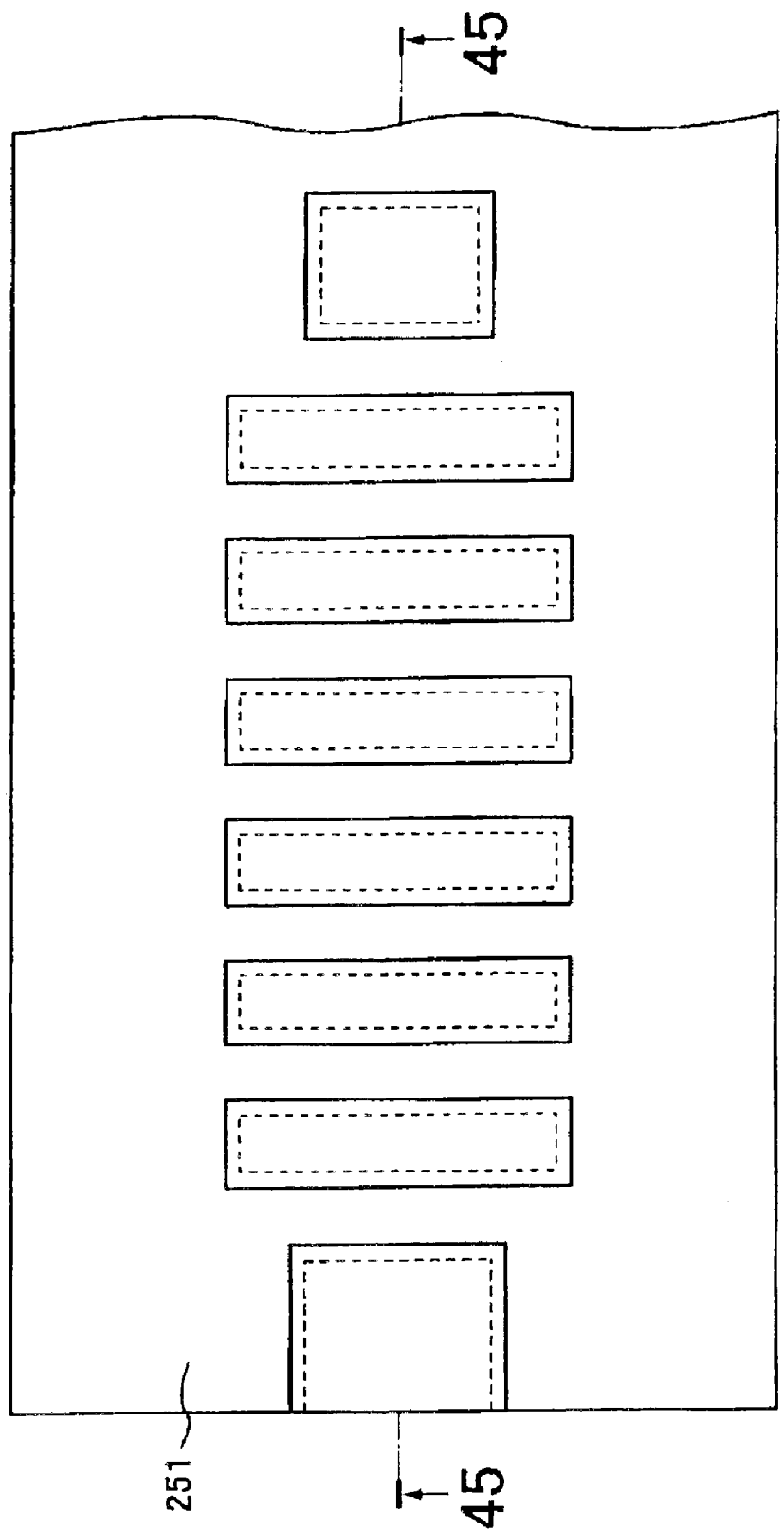
FIG. 44 is a plan view showing the step after the step shown in FIGS. 42 and 43.
Figure 45:
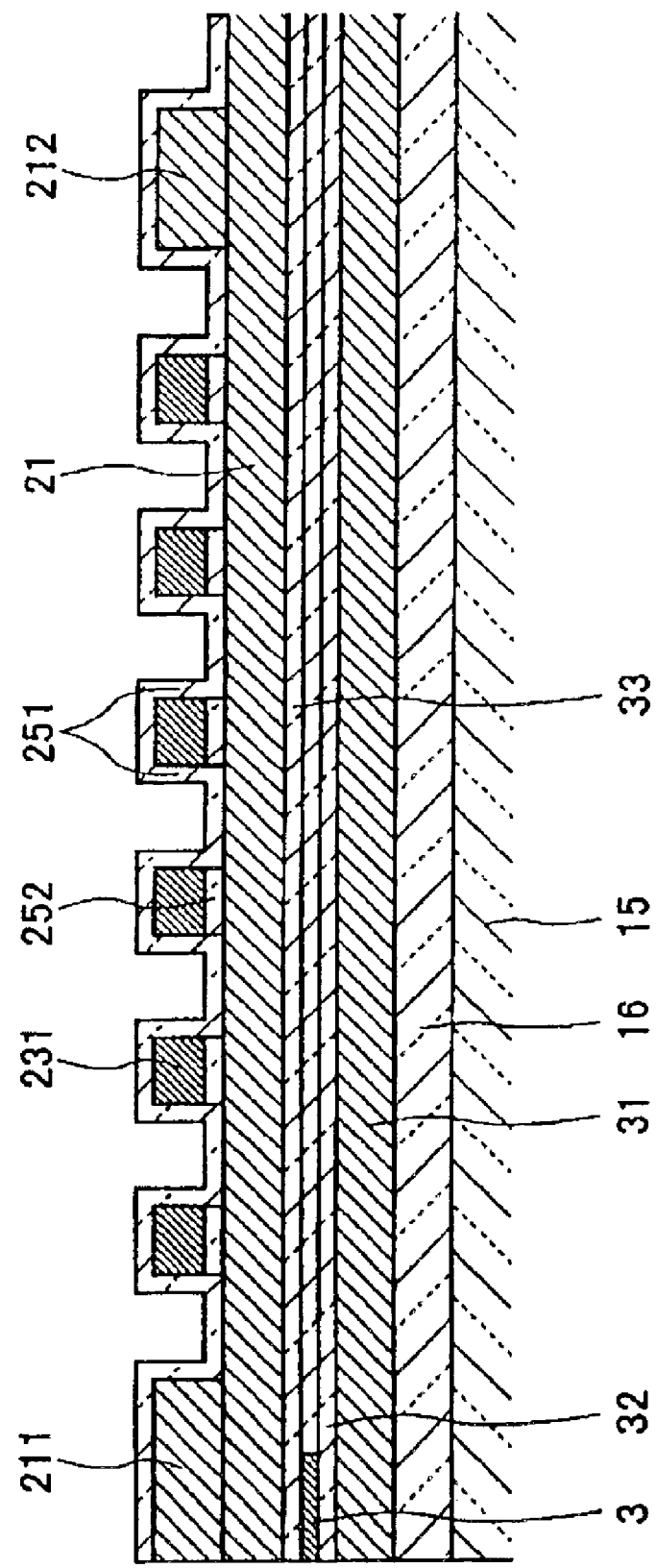
FIG. 45 is a cross sectional view showing the area shown in FIG. 44, taken on line "45—45"

FIG. 44 is a plan view showing the step after the step shown in FIGS. 42 and 43, and FIG. 45 is a cross sectional view showing the area shown in FIG. 44, taken on line "45—45". Then, as shown in FIGS. 44 and 45, the inorganic insulating film 251 is formed in a uniform thickness over the first thin film conductors 231 and the first magnetic layer 21 exposed in between the adjacent thin film conductors 231.

The inorganic insulating film 251 is made of $Al_2O_3$, $SiO_2$, AlN, DLC or the like as the inorganic insulating film 252 in a thickness of 0.01–0.05 $\mu$m by means of dry etching method such as sputtering or CVD.

Figure 46:
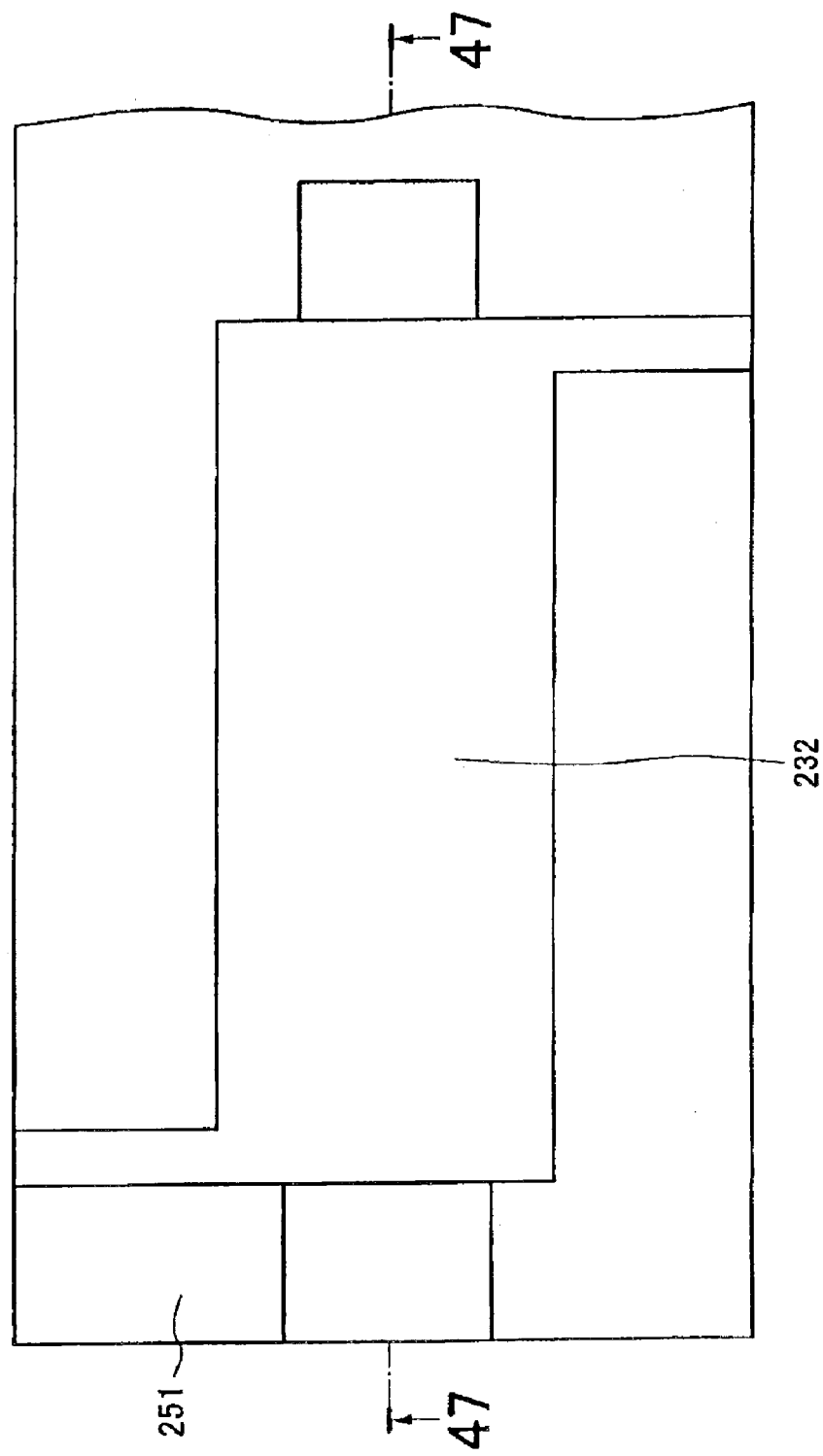
FIG. 46 is a plan view showing the step after the step shown in FIGS. 44 and 45.
Figure 47:
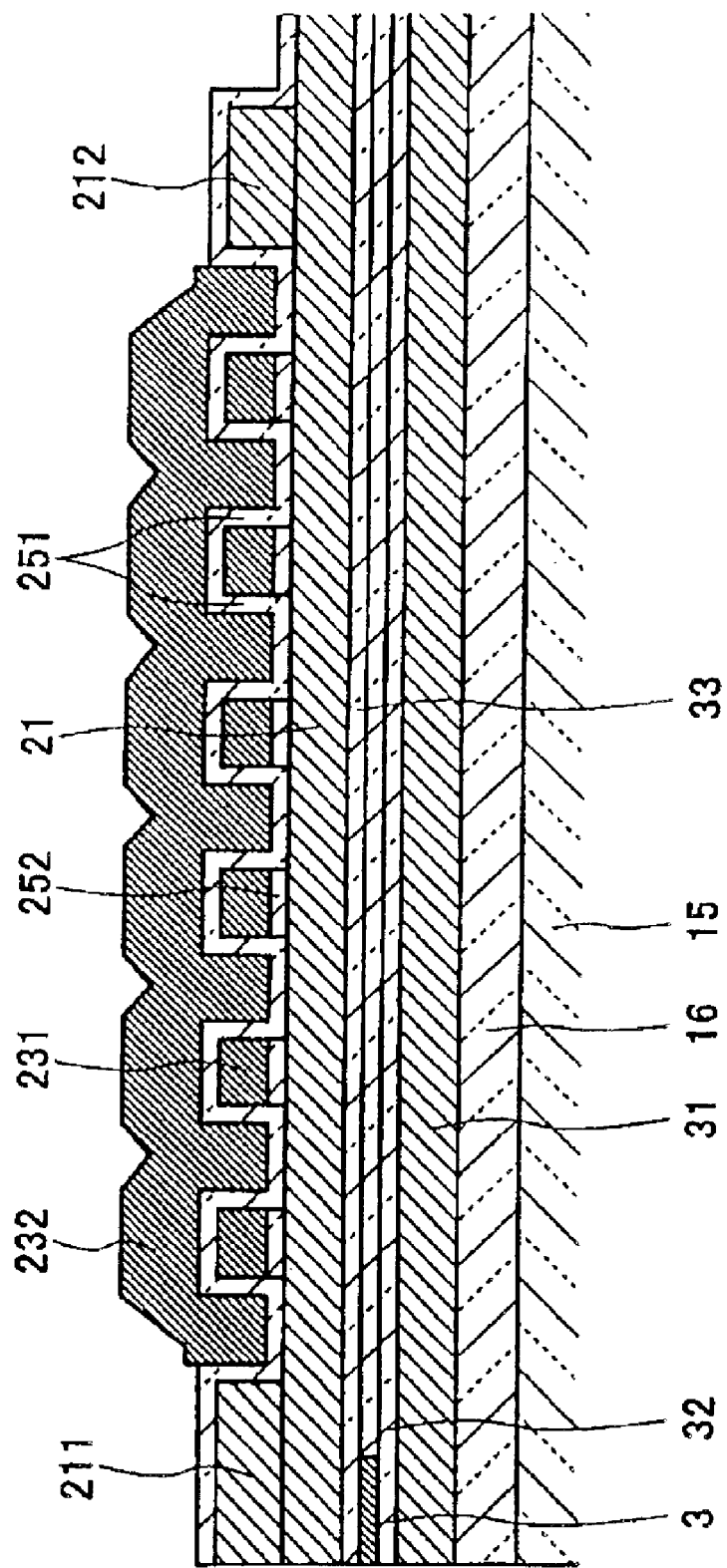
FIG. 47 is a cross sectional view showing the area shown in FIG. 46, taken on line "47—47"

FIG. 46 is a plan view showing the step after the step shown in FIGS. 44 and 45, and FIG. 47 is a cross sectional view showing the area shown in FIG. 46, taken on line "47—47". As shown in FIGS. 46 and 47, the second thin film conductor 232 is formed over the first thin film conductors 231 via the inorganic insulating film 251 by means of frame plating method so as to embed the gaps between the adjacent thin film conductors 231.

Figure 48:
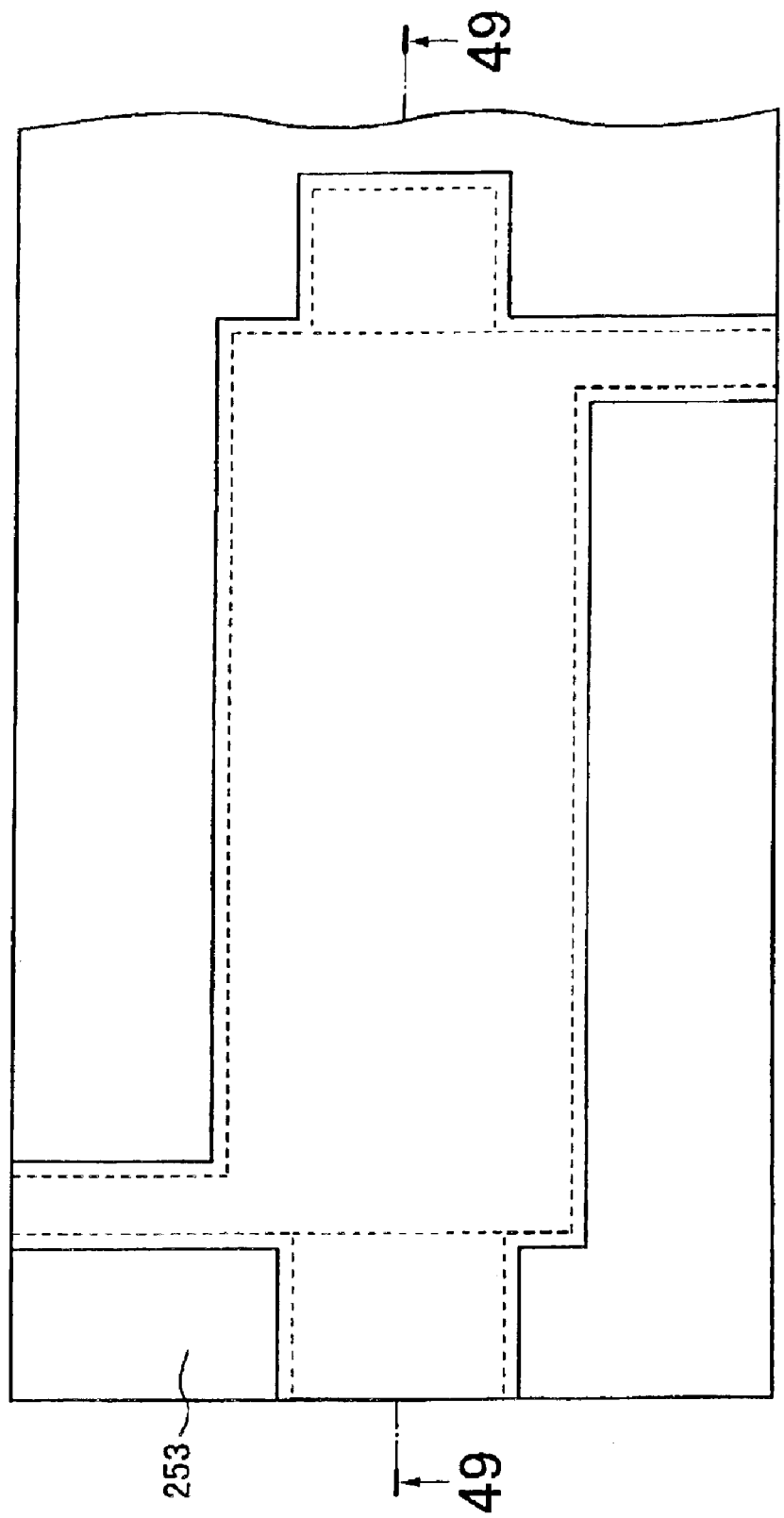
FIG. 48 is a plan view showing the step after the step shown in FIGS. 46 and 47.
Figure 49:
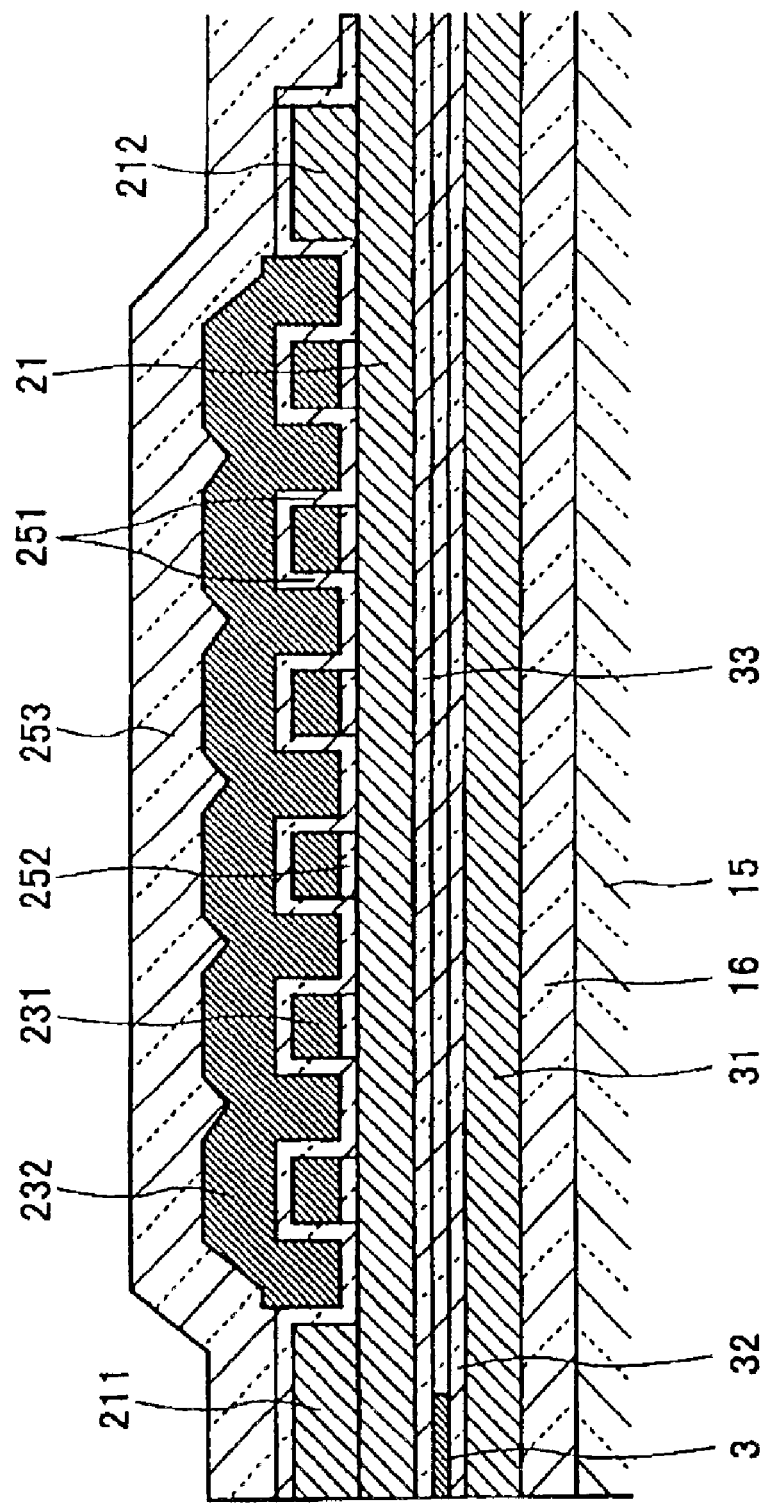
FIG. 49 is a cross sectional view showing the area shown in FIG. 48, taken on line "49—49"

FIG. 48 is a plan view showing the step after the step shown in FIGS. 46 and 47, and FIG. 49 is a cross sectional view showing the area shown in FIG. 48, taken on line "49—49". Then, as shown in FIGS. 48 and 49, the inorganic insulating film 253 is formed of $Al_2O_3$, $SiO_2$ or the like over the first thin film conductors 231, the second thin film conductor 232, the magnetic pole edge portion 211 and the backgap 212 by means of dry etching method such as sputtering method or CVD.

Figure 50:
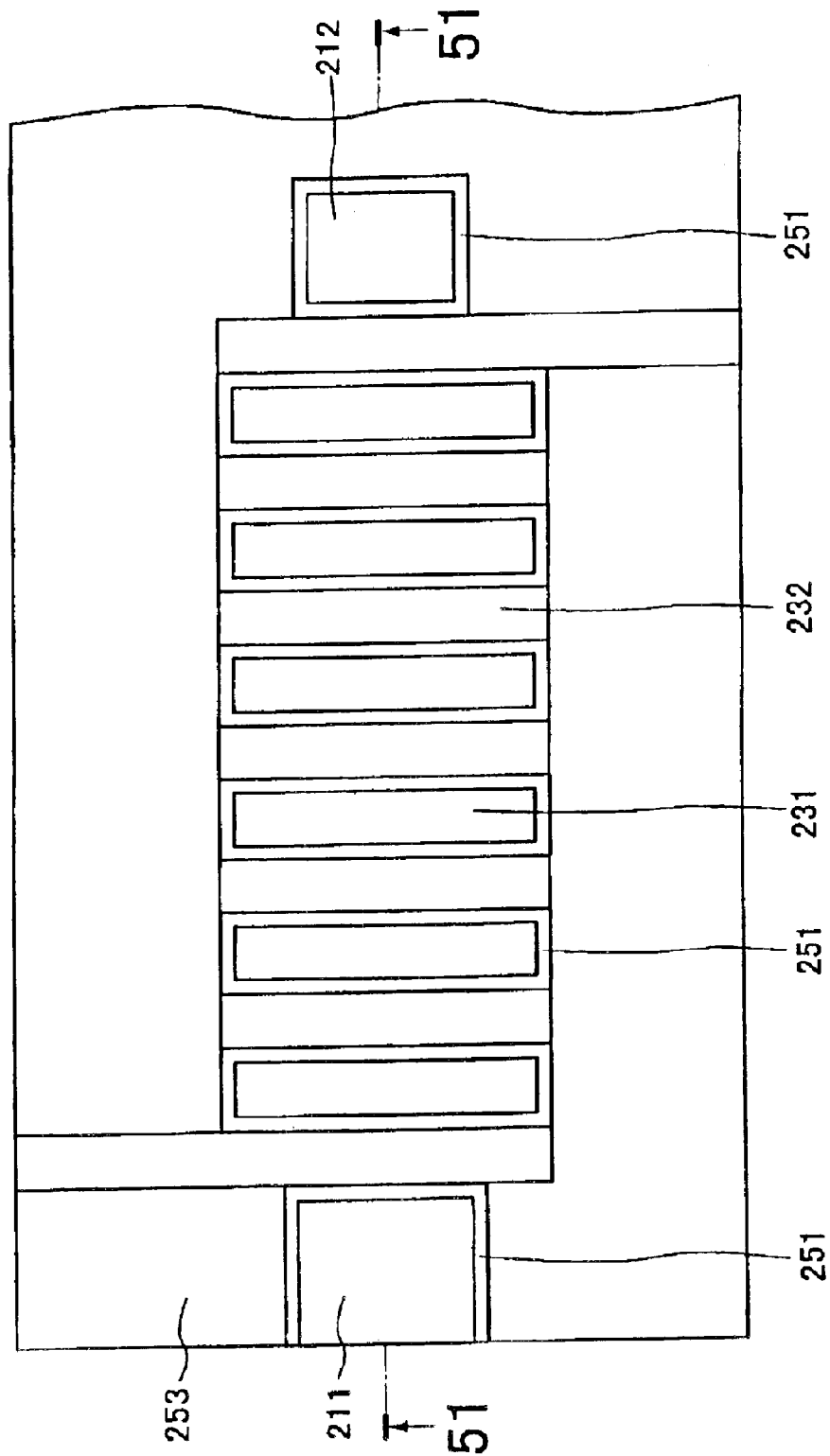
FIG. 50 is a plan view showing the step after the step shown in FIGS. 48 and 49.
Figure 51:
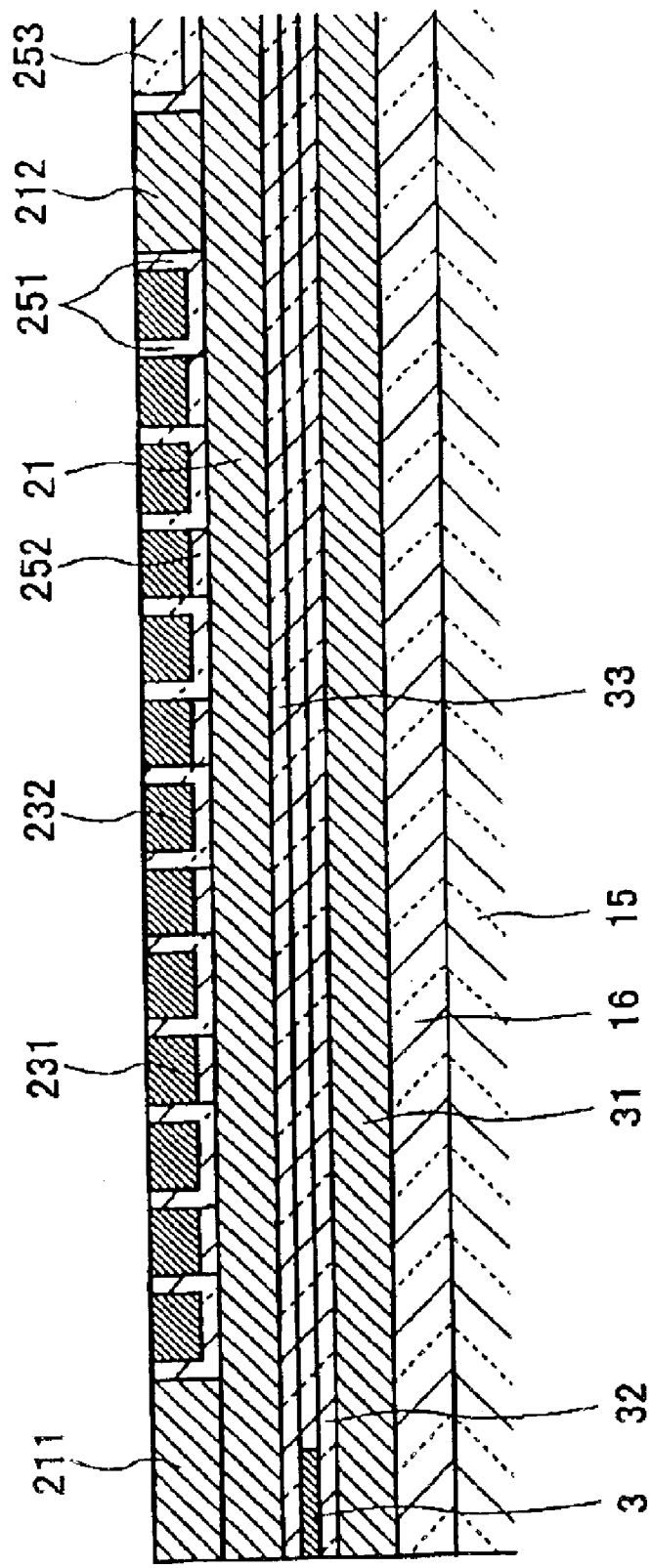
FIG. 51 is a cross sectional view showing the area shown in FIG. 50, taken on line "51—51"

FIG. 50 is a plan view showing the step after the step shown in FIGS. 48 and 49, and FIG. 51 is a cross sectional view showing the area shown in FIG. 50, taken on line "51—51". As shown in FIGS. 50 and 51, the inorganic insulating film 253 is flattened by means of CMP. The residual inorganic insulating film 253 remains around the backgap layer 212 and the magnetic pole edge portion 211.

With the inorganic insulating layer 253 through CMP, the assembly is flattened as shown in FIG. 51.

Figure 52:
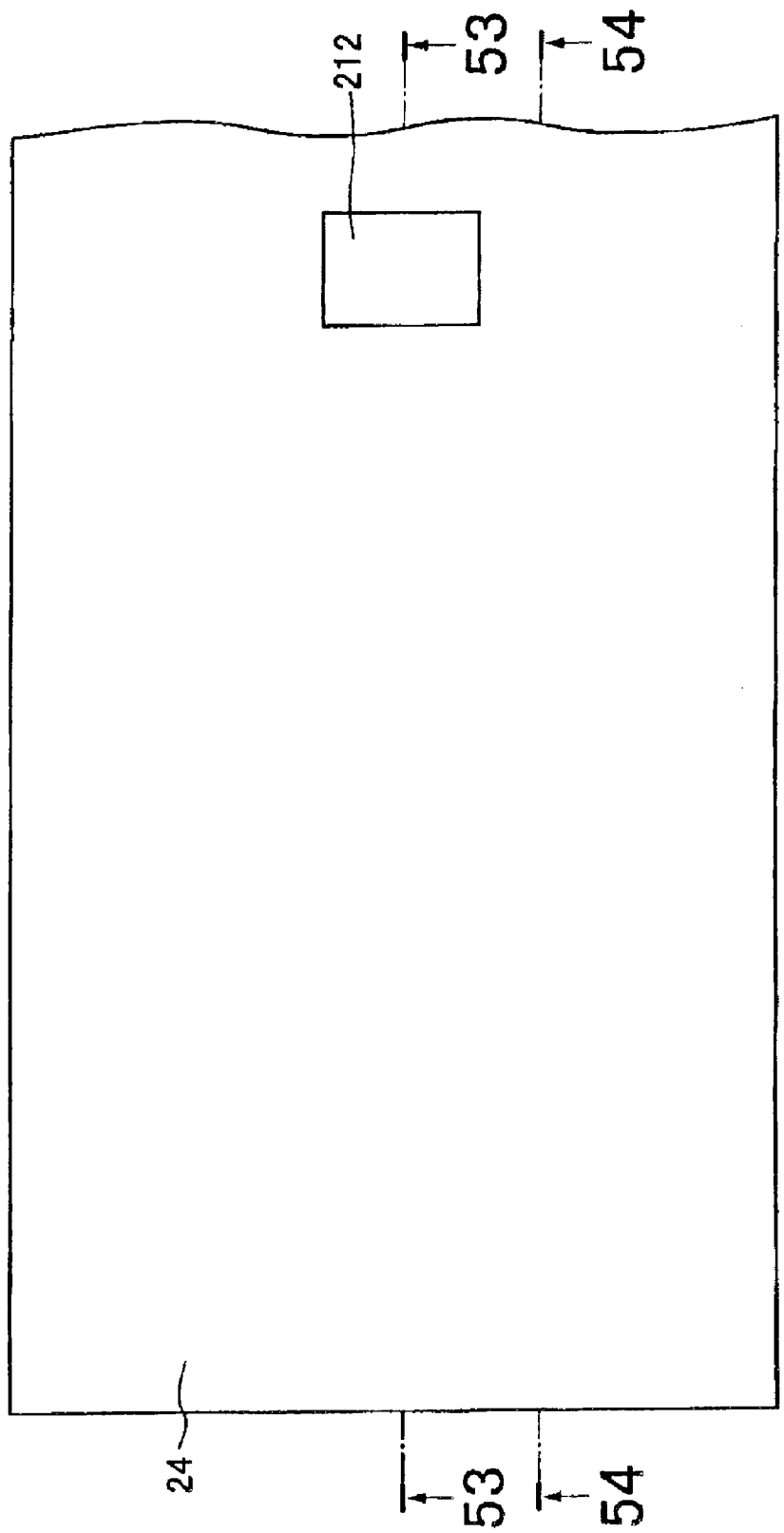
FIG. 52 is a plan view showing the step after the step shown in FIGS. 50 and 51.
Figure 53:
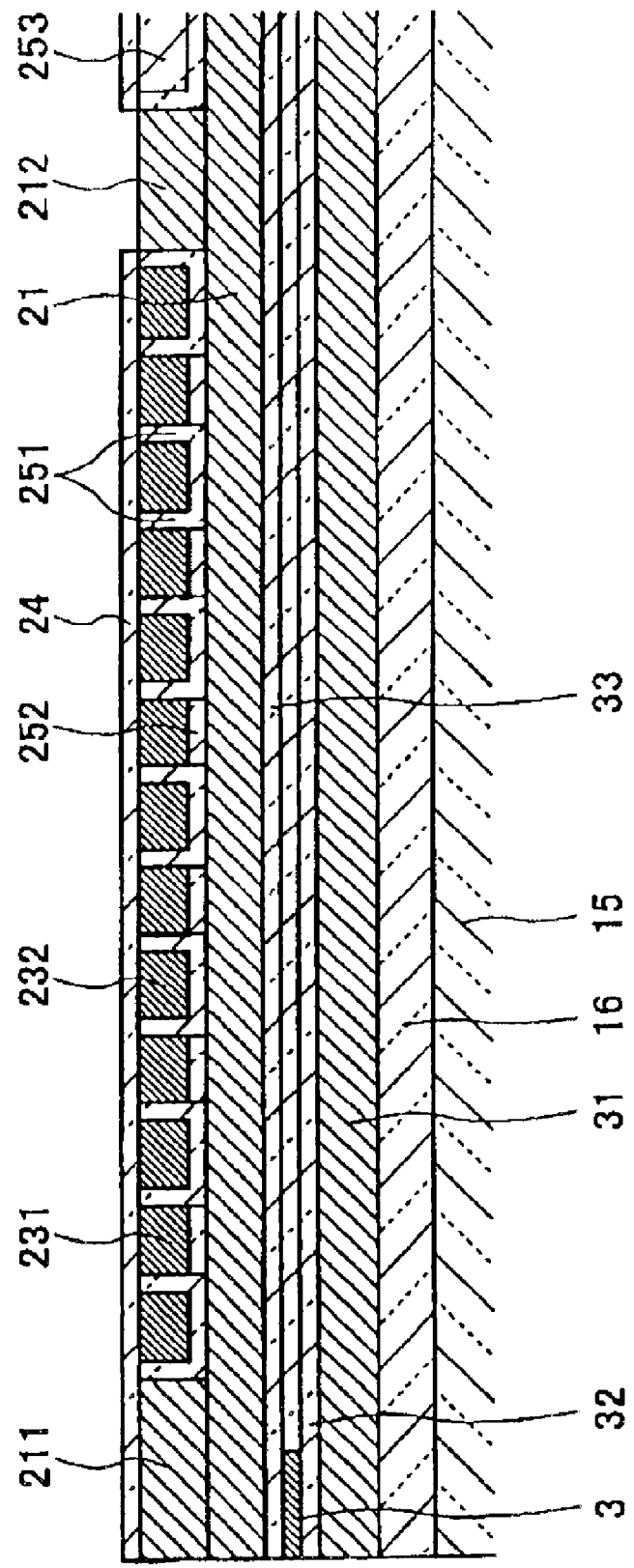
FIG. 53 is a cross sectional view showing the area shown in FIG. 52, taken on line "53—53"
Figure 54:
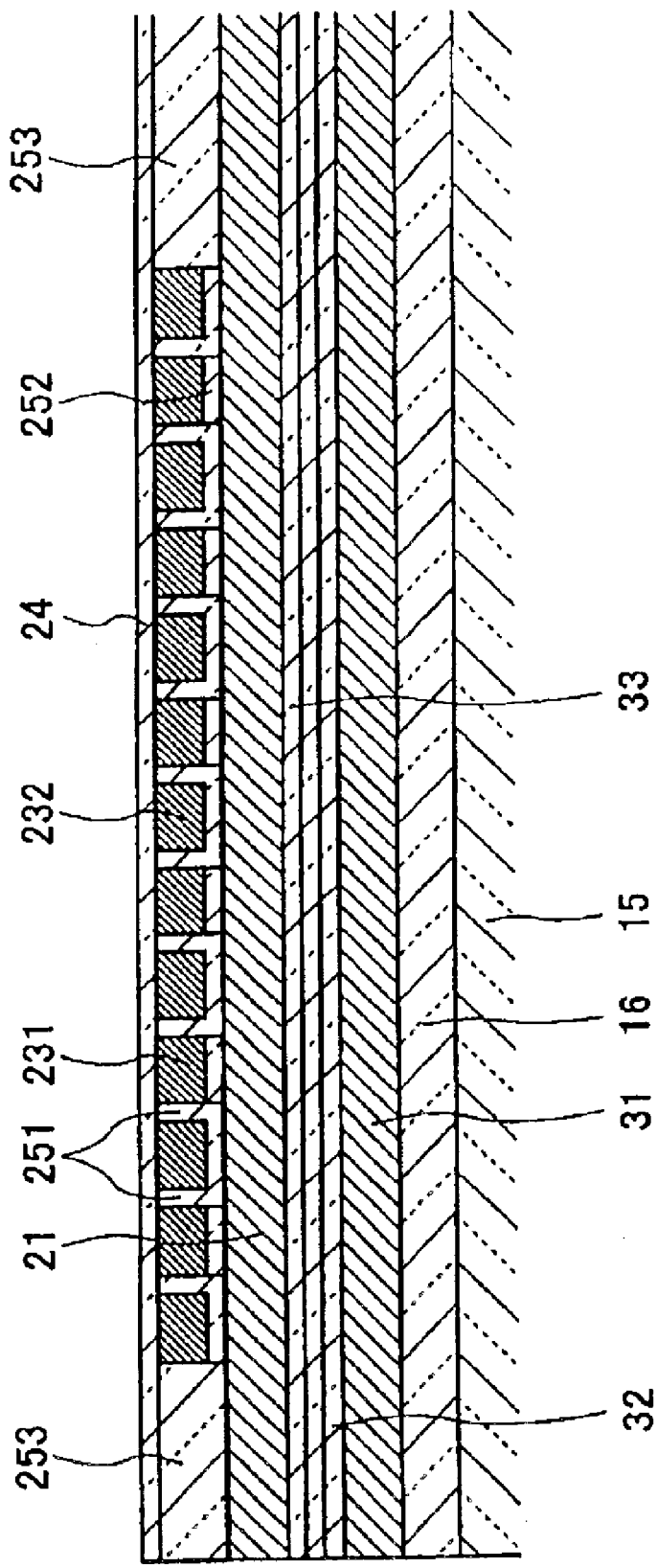
FIG. 54 is a cross sectional view showing the area shown in FIG. 52, taken on line "54—54"

FIG. 52 is a plan view showing the step after the step shown in FIGS. 50 and 51, and FIG. 53 is a cross sectional view showing the area shown in FIG. 52, taken on line "53—53", and FIG. 54 is a cross sectional view showing the area shown in FIG. 52, taken on line "54—54". A shown in FIGS. 52-54, the gap layer 24 is formed of $Al_2O_3$, $SiO_2$, AlN, DLC or the like in a thickness of 0.01–0.05 $\mu$m on the flattened inorganic insulating film 253, the first and the second thin film conductor 231 and 232 by means of dry etching method such as sputtering or CVD.

The gap layer 24 is partially removed from on the backgap layer 212 by means of dry etching method such as milling or RIE using a given resist pattern as a mask, which is removed with solvent or by means of ashing.

Figure 55:
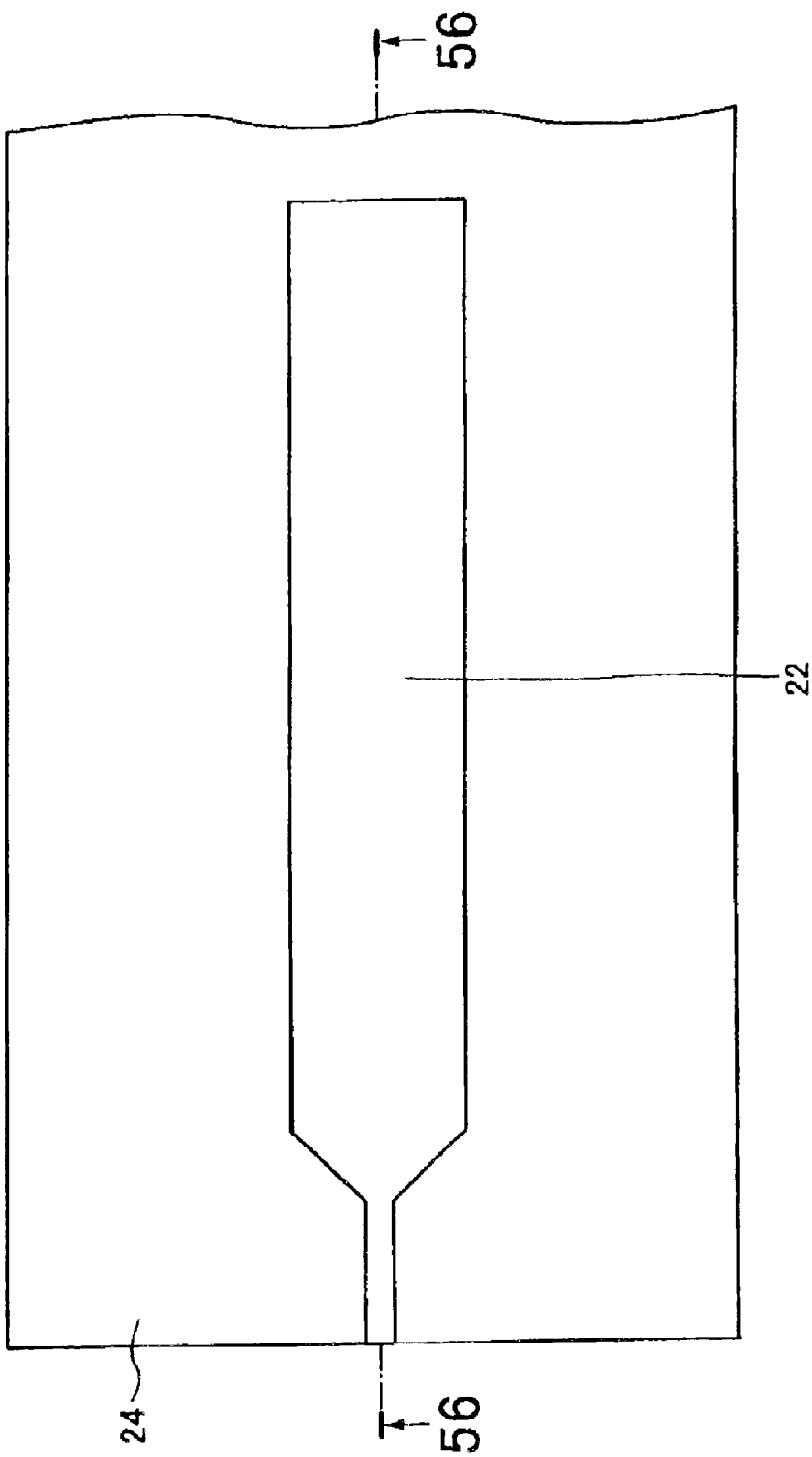
FIG. 55 is a plan view showing the step after the step shown in FIGS. 52–54.
Figure 56:
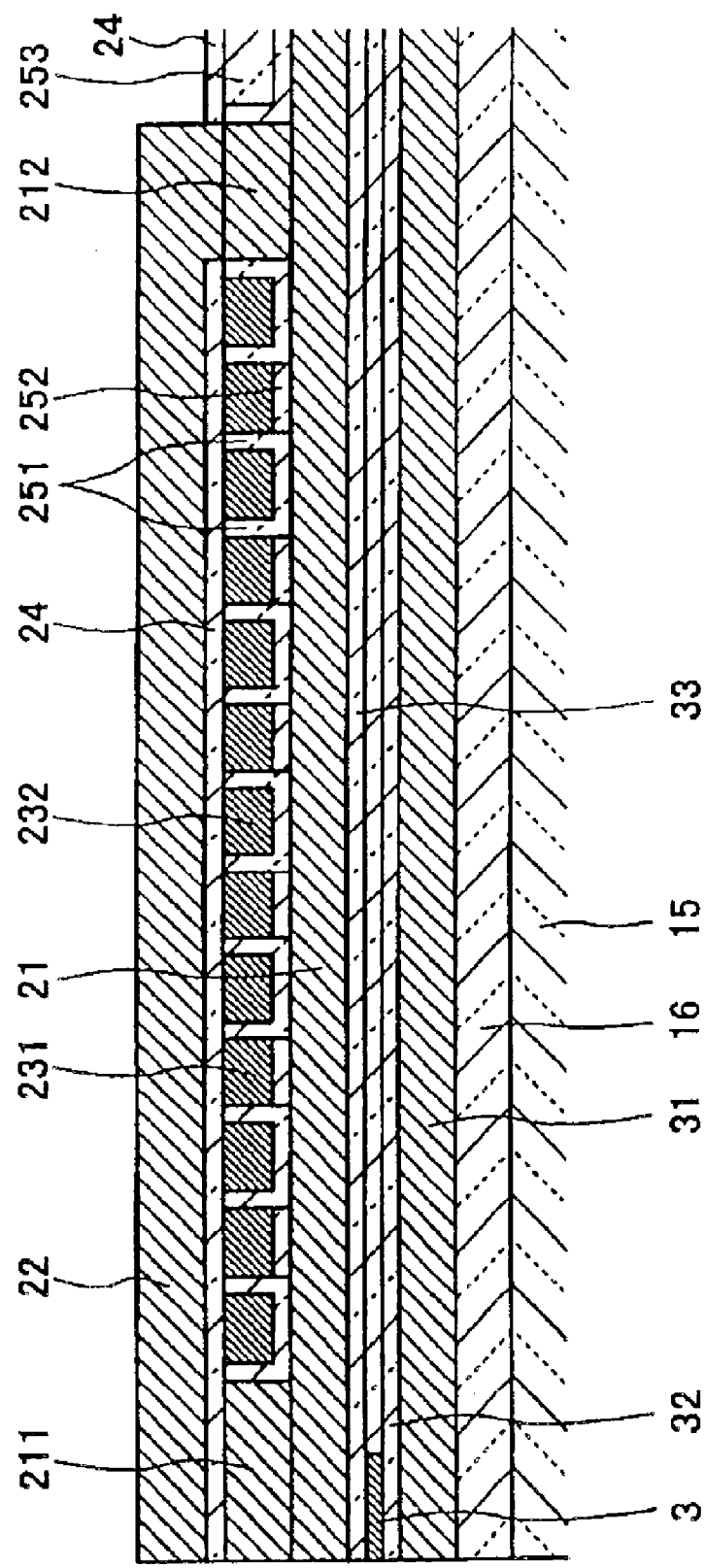
FIG. 56 is a cross sectional view showing the area shown in FIG. 55, taken on line "56—56"

FIG. 55 is a plan view showing the step after the step shown in FIGS. 52-54, and FIG. 56 is a cross sectional view showing the area shown in FIG. 55, taken on line "56—56". Then, as shown in FIGS. 55 and 56, the second magnetic layer 22 is formed of NiFe, CoFeNi, CoFe, FeN, FeZrN or the like in a thickness of 0.5–3 $\mu$m over the gap layer 24. The second magnetic layer 22 is supported by the gap layer 24 and magnetically joined with the first magnetic layer 21 via the backgap layer 212. Therefore, a given thin film magnetic circuit is made of the first and the second magnetic layers 21 and 22, and the gap layer 24. The second magnetic layer 22 may be made of a single layered structure or a multilayered structure.

Then, a portion of the gap layer 24 uncovered with the second magnetic layer 22 is removed by means of dry etching method such as milling or RIE.

Figure 57:
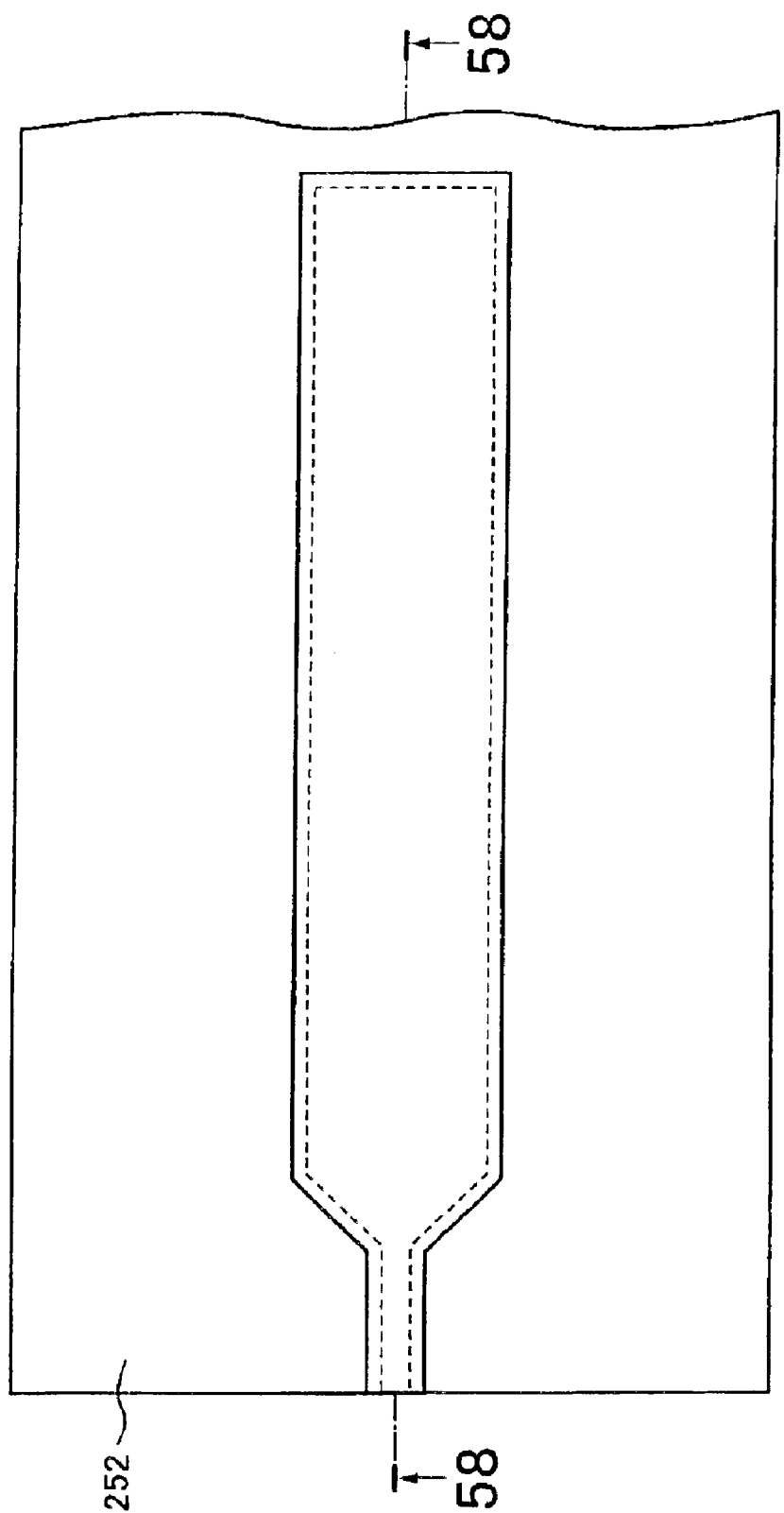
FIG. 57 is a plan view showing the step after the step shown in FIGS. 55 and 56.
Figure 58:
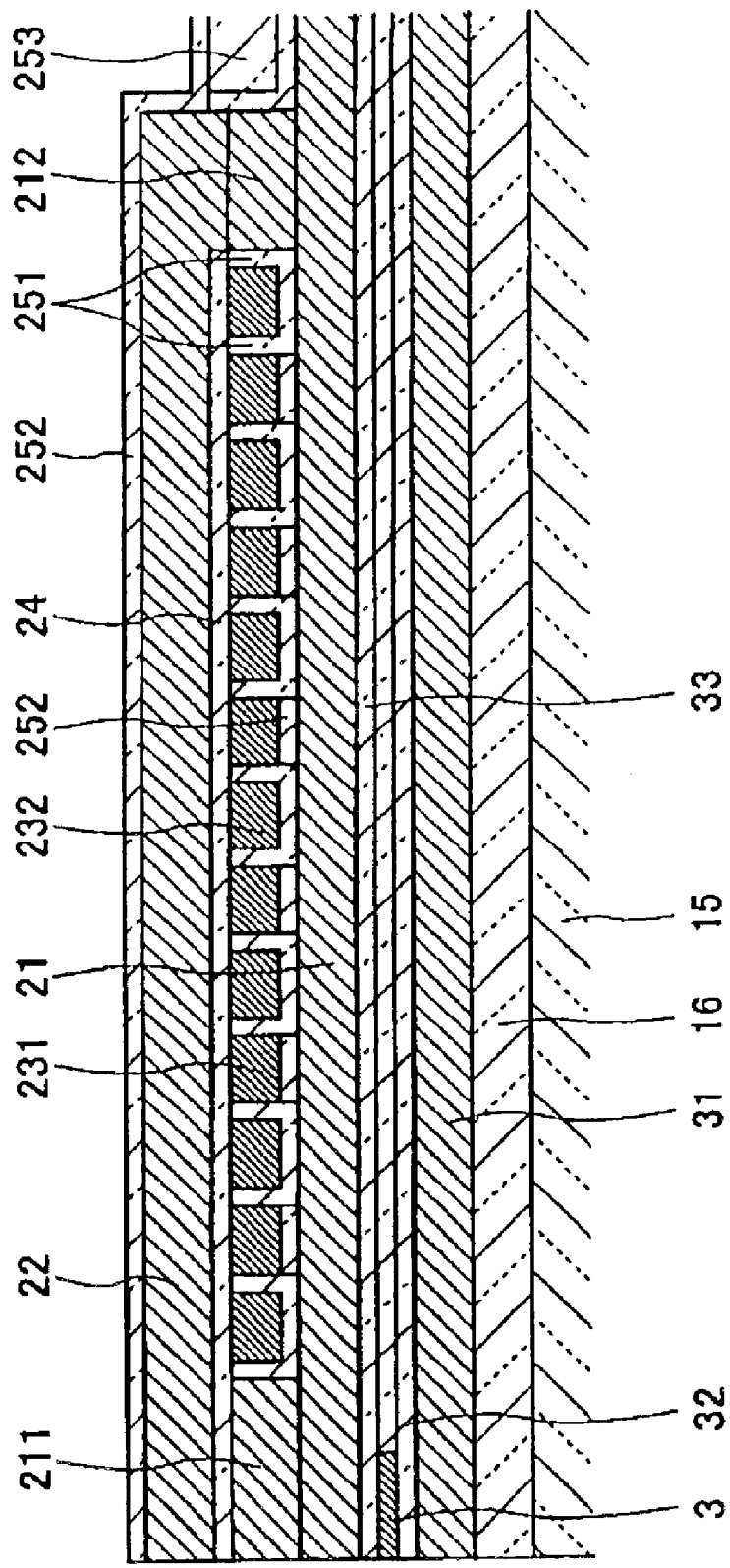
FIG. 58 is a cross sectional view showing the area shown in FIG. 57, taken on line "58—58"

FIG. 57 is a plan view showing the step after the step shown in FIGS. 55 and 56, and FIG. 58 is a cross sectional view showing the area shown in FIG. 57, taken on line "58—58". As shown in FIGS. 57 and 58, the inorganic insulating film 252 is formed over the second magnetic layer 22 in the same manner as mentioned above.

Figure 59:
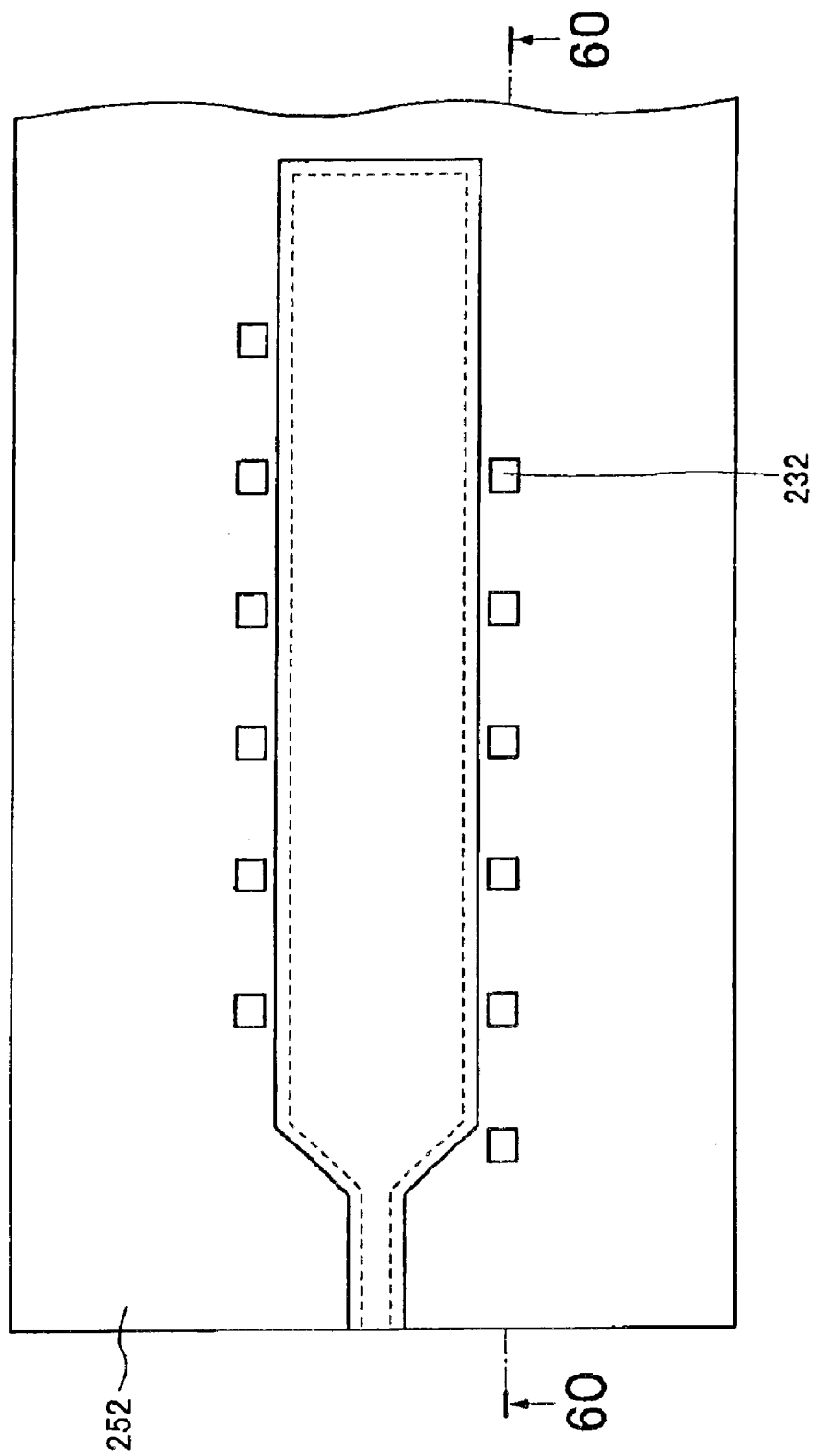
FIG. 59 is a plan view showing the step after the step shown in FIGS. 57 and 58.
Figure 60:
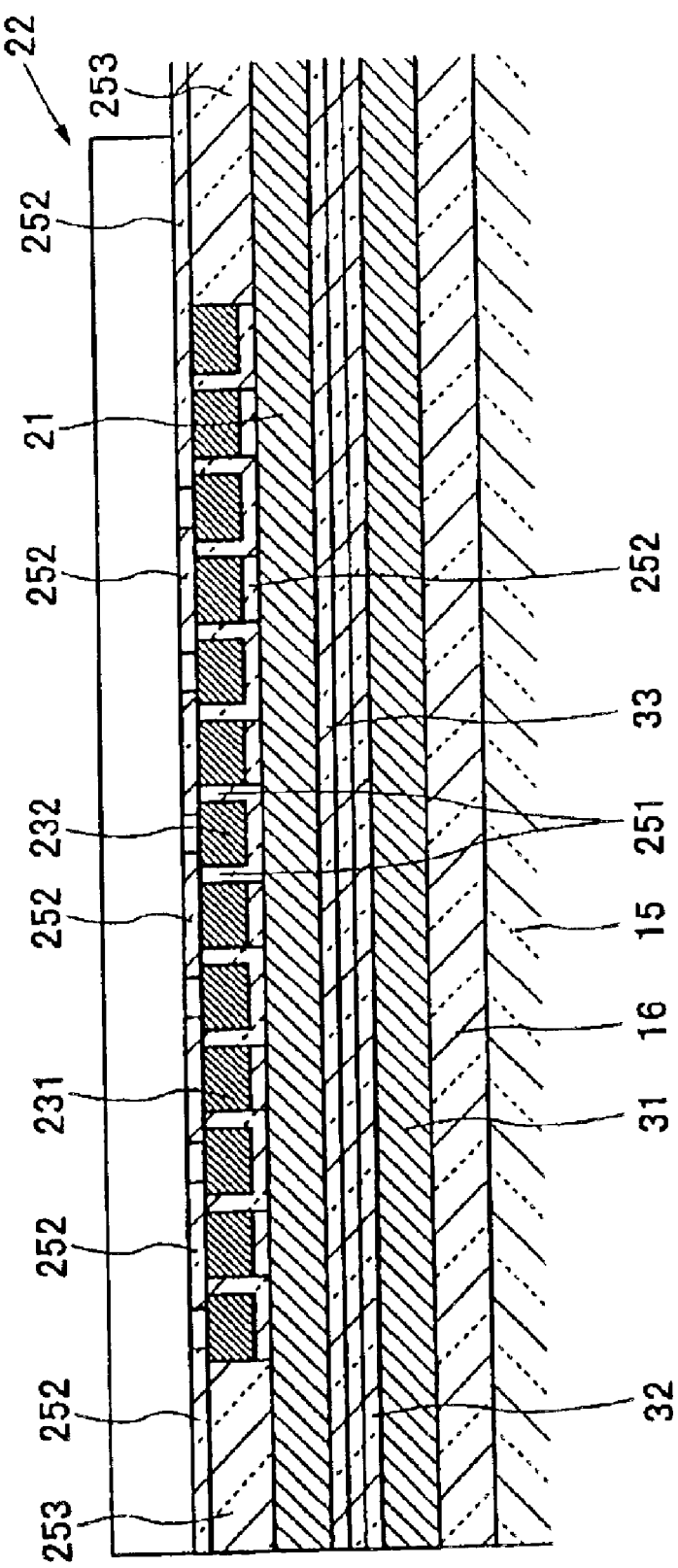
FIG. 60 is a cross sectional view showing the area shown in FIG. 59, taken on line "60—60"

FIG. 59 is a plan view showing the step after the step shown in FIGS. 57 and 58, and FIG. 60 is a cross sectional view showing the area shown in FIG. 59, taken on line "60—60". Then, as shown in FIGS. 59 and 60, the gap layer 24 and the inorganic insulating film 252 are partially removed by means of dry etching method such as milling or RIE using a resist mask to expose the top surfaces of the second thin film conductors 232. The resist mask is removed by a solvent or by means of ashing. In this case, openings are formed in the inorganic insulating films 252.

Figure 61:
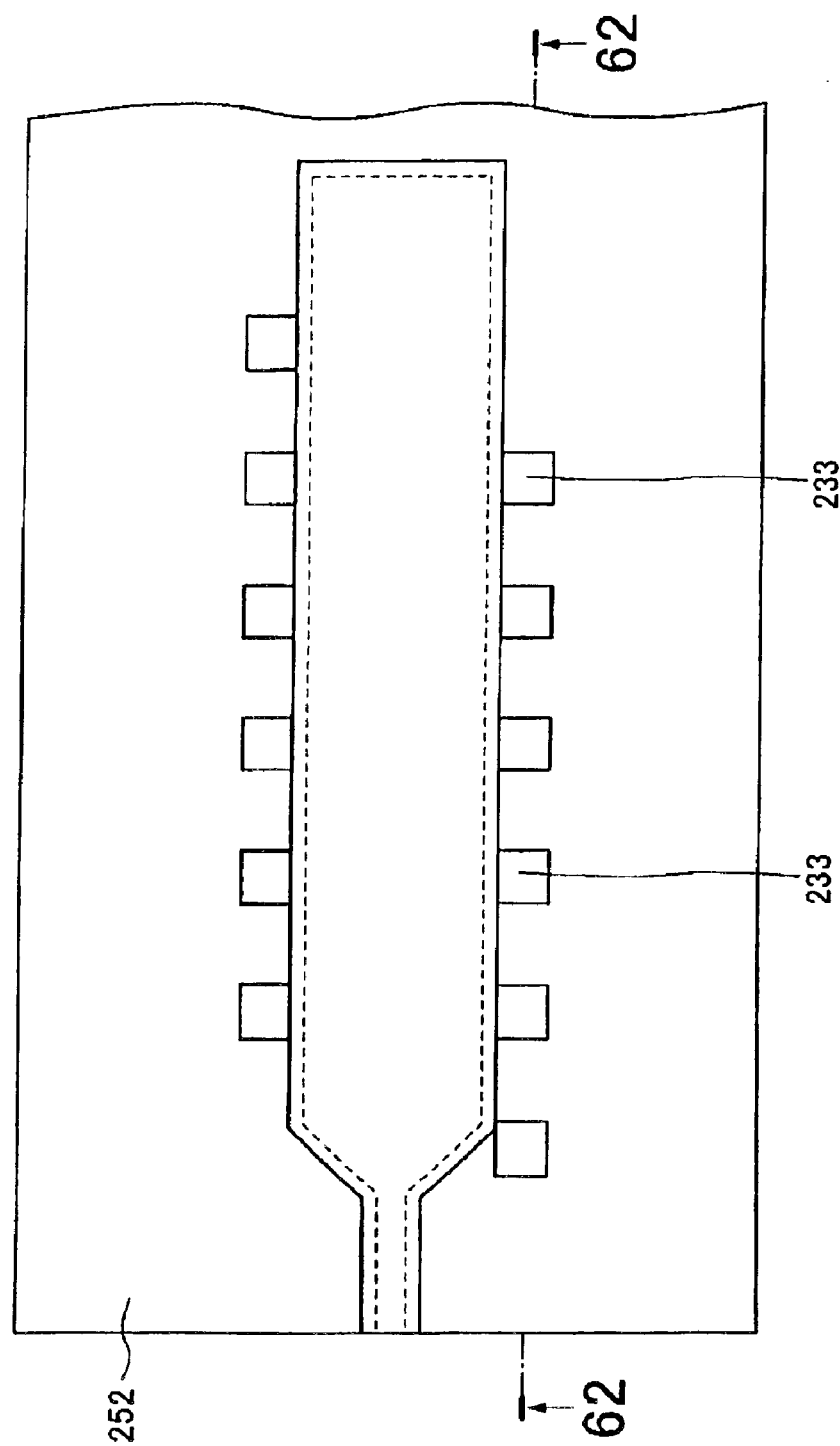
FIG. 61 is a plan view showing the step after the step shown in FIGS. 59 and 60.
Figure 62:
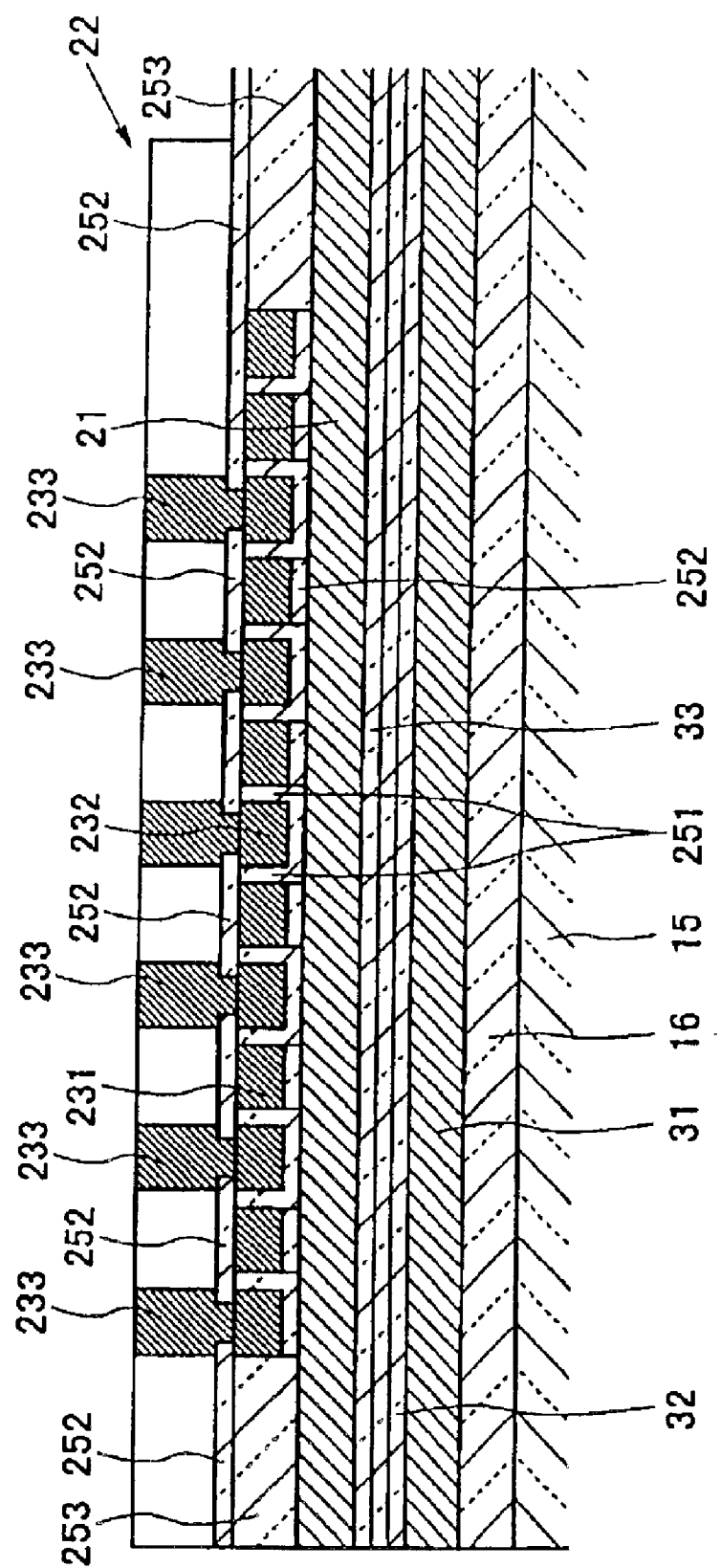
FIG. 62 is a cross sectional view showing the area shown in FIG. 61, taken on line "62—62"

FIG. 61 is a plan view showing the step after the step shown in FIGS. 59 and 60, and FIG. 62 is a cross sectional view showing the area shown in FIG. 61, taken on line "62—62". As shown in FIGS. 61 and 62, plural third thin film conductors 233 are formed of a conductive metallic material such as Cu by means of frame plating so as to be connected to the plural second thin film conductors 232 through their respective openings. The thickness of each third thin film conductor 233 is preferably set within 1.5–4 $\mu$m. The third thin film conductors 233 are made by the fabricating process shown in FIGS. 5–11.

Figure 63:
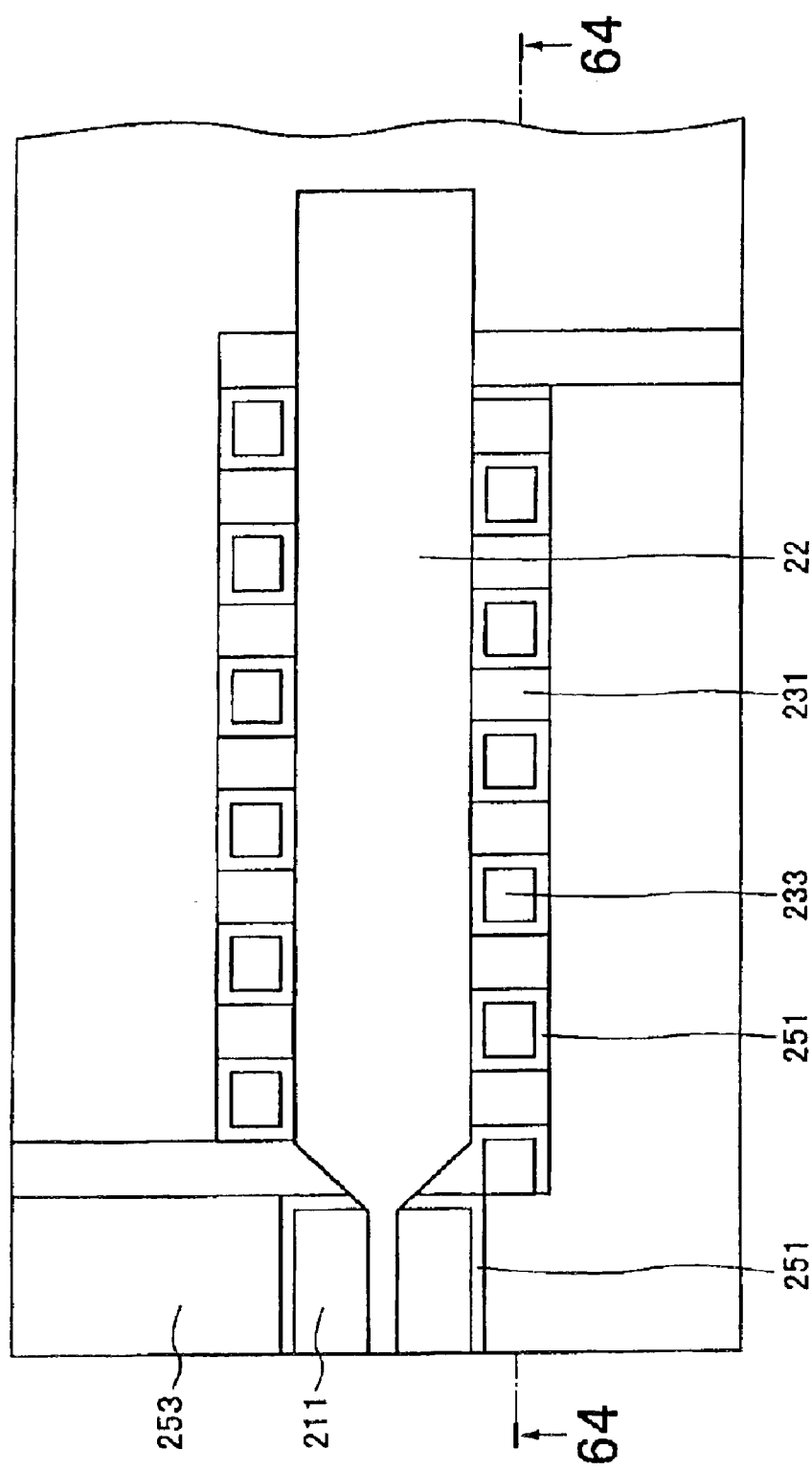
FIG. 63 is a plan view showing the step after the step shown in FIGS. 61 and 62.
Figure 64:
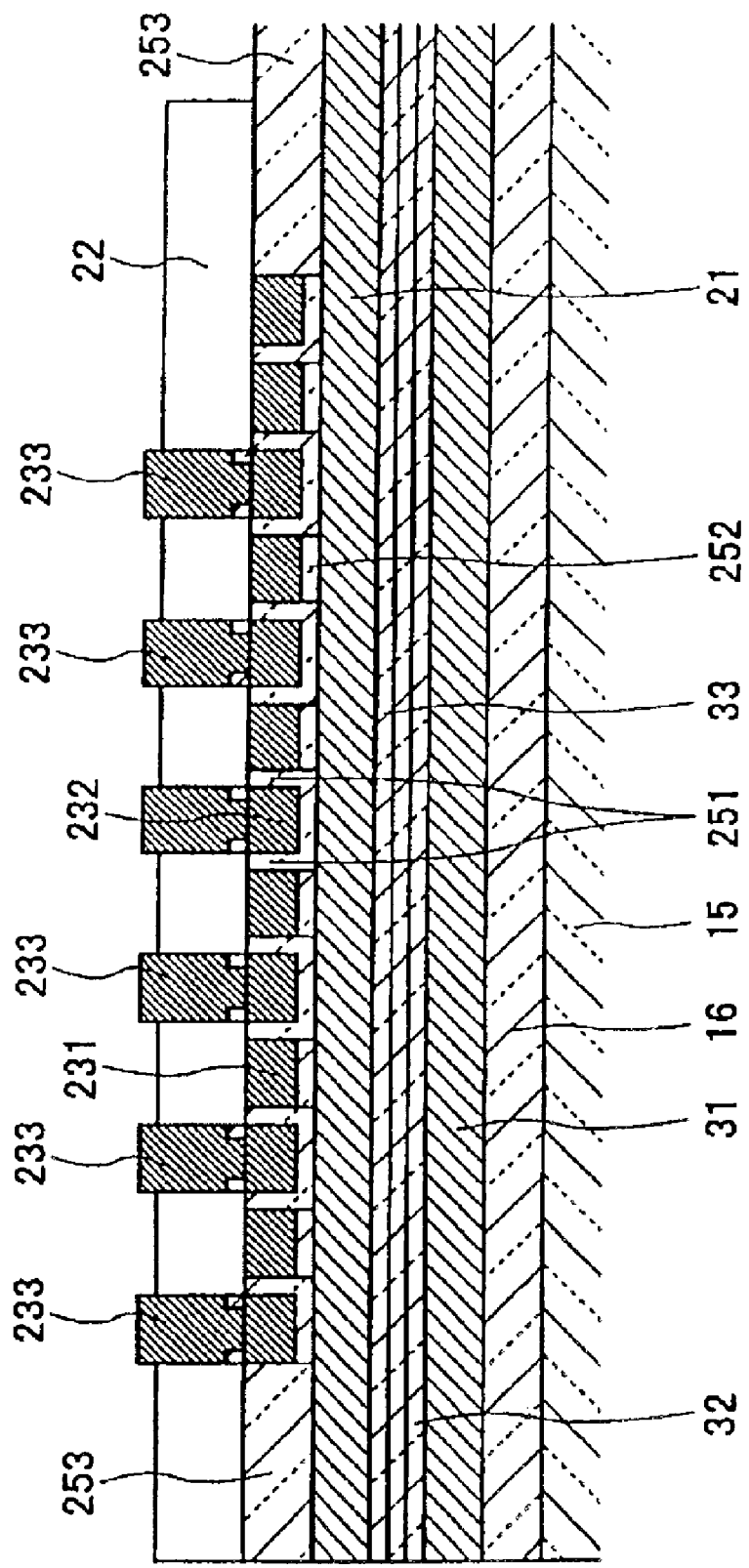
FIG. 64 is a cross sectional view showing the area shown in FIG. 63, taken on line "64—64"

FIG. 63 is a plan view showing the step after the step shown in FIGS. 61 and 62, and FIG. 64 is a cross sectional view showing the area shown in FIG. 63, taken on line "64—64". Then, as shown in FIGS. 63 and 64, the remnant inorganic insulating film 252 is removed by means of dry etching method such as milling or RIE using the third thin film conductors 233 as a mask.

Figure 65:
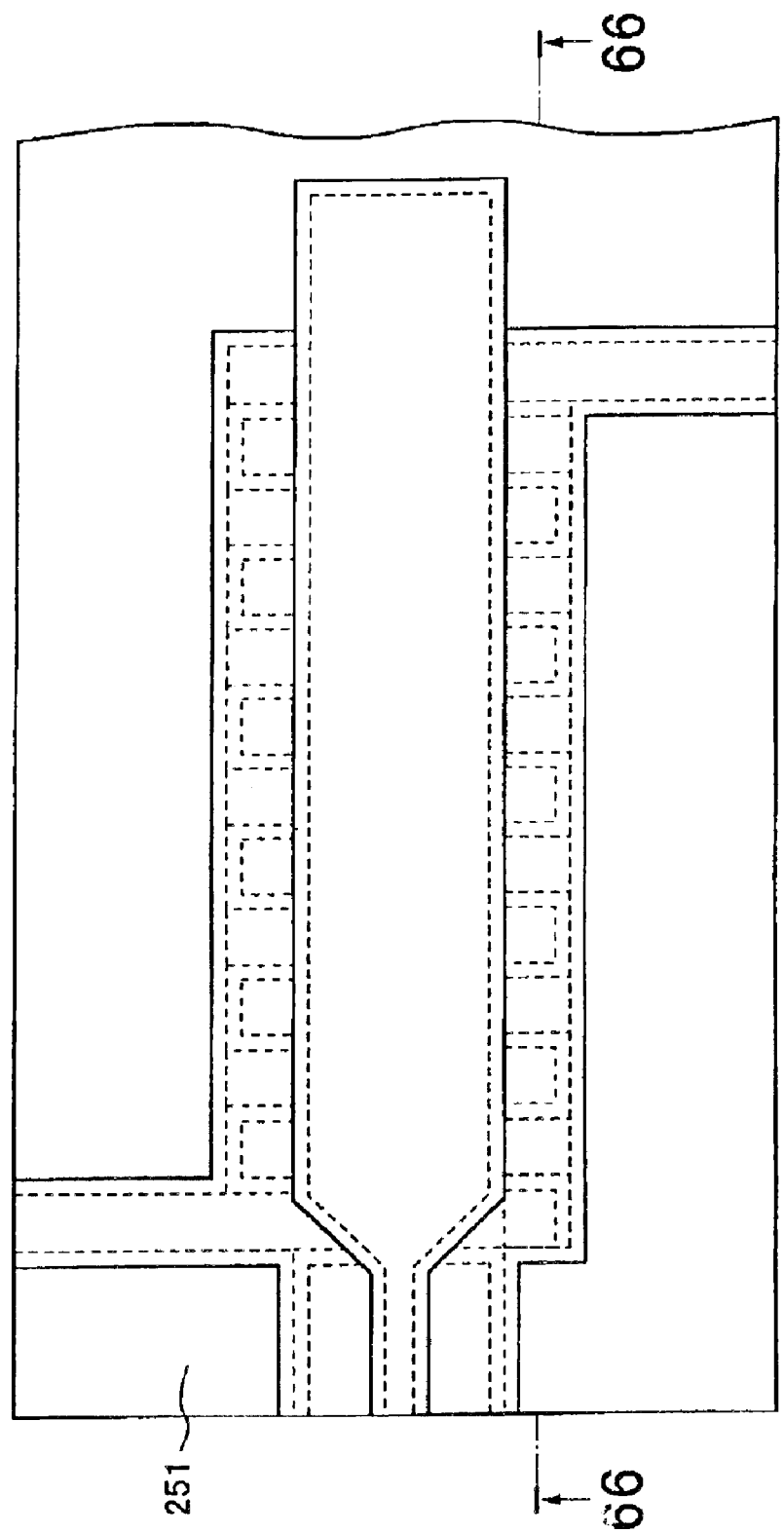
FIG. 65 is a plan view showing the step after the step shown in FIGS. 63 and 64.
Figure 66:
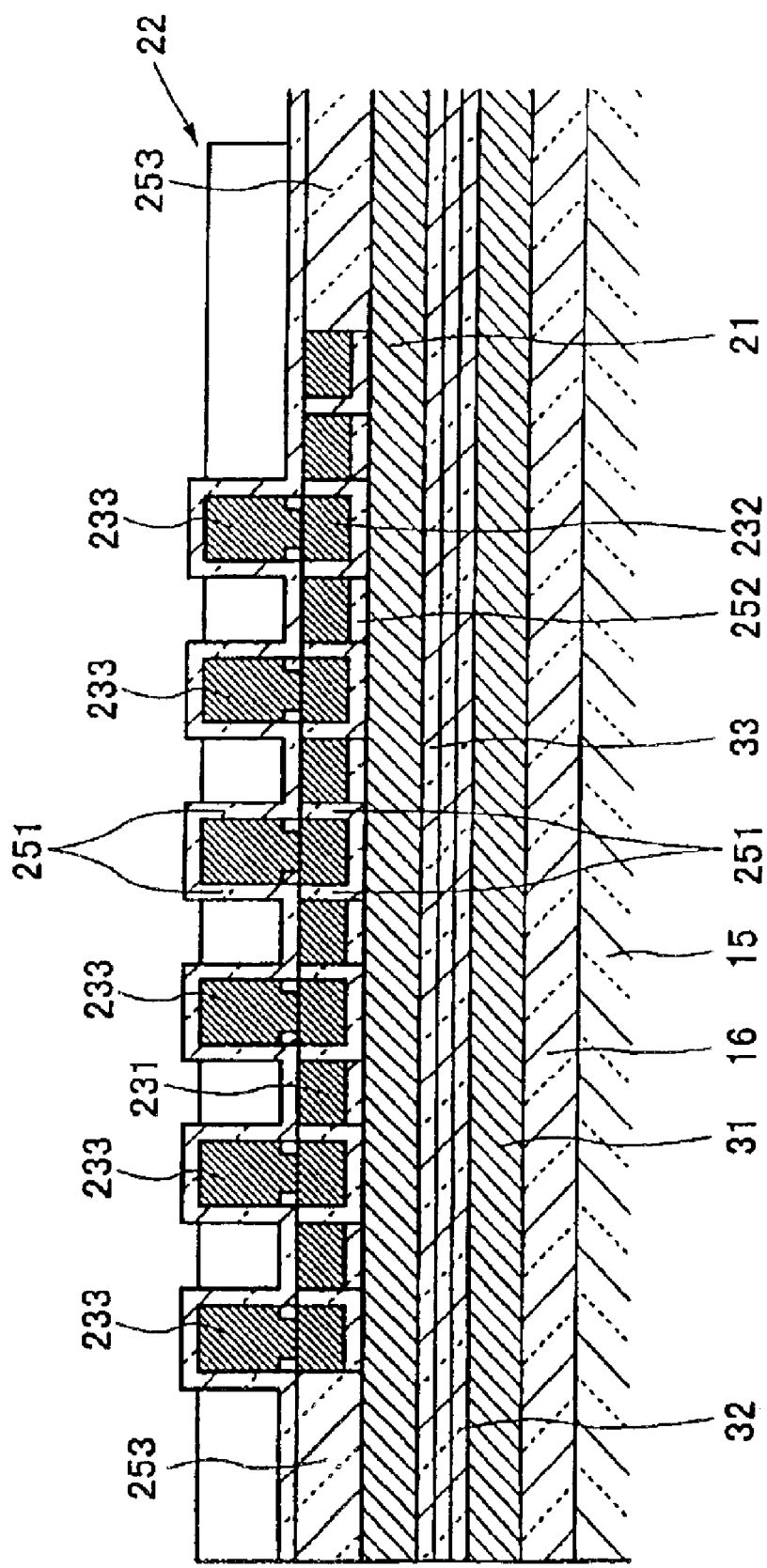
FIG. 66 is a cross sectional view showing the area shown in FIG. 65, taken on line "66—66"

FIG. 65 is a plan view showing the step after the step shown in FIGS. 63 and 64, and FIG. 66 is a cross sectional view showing the area shown in FIG. 65, taken on line "66—66". Then, as shown in FIGS. 65 and 66, the inorganic insulating film 251 is formed in a uniform thickness over the third thin film conductors 233 and the first thin film conductors 231 exposed between the adjacent third thin film conductors 233. The inorganic insulating film 251 is made in the same manner as mentioned above.

Figure 67:
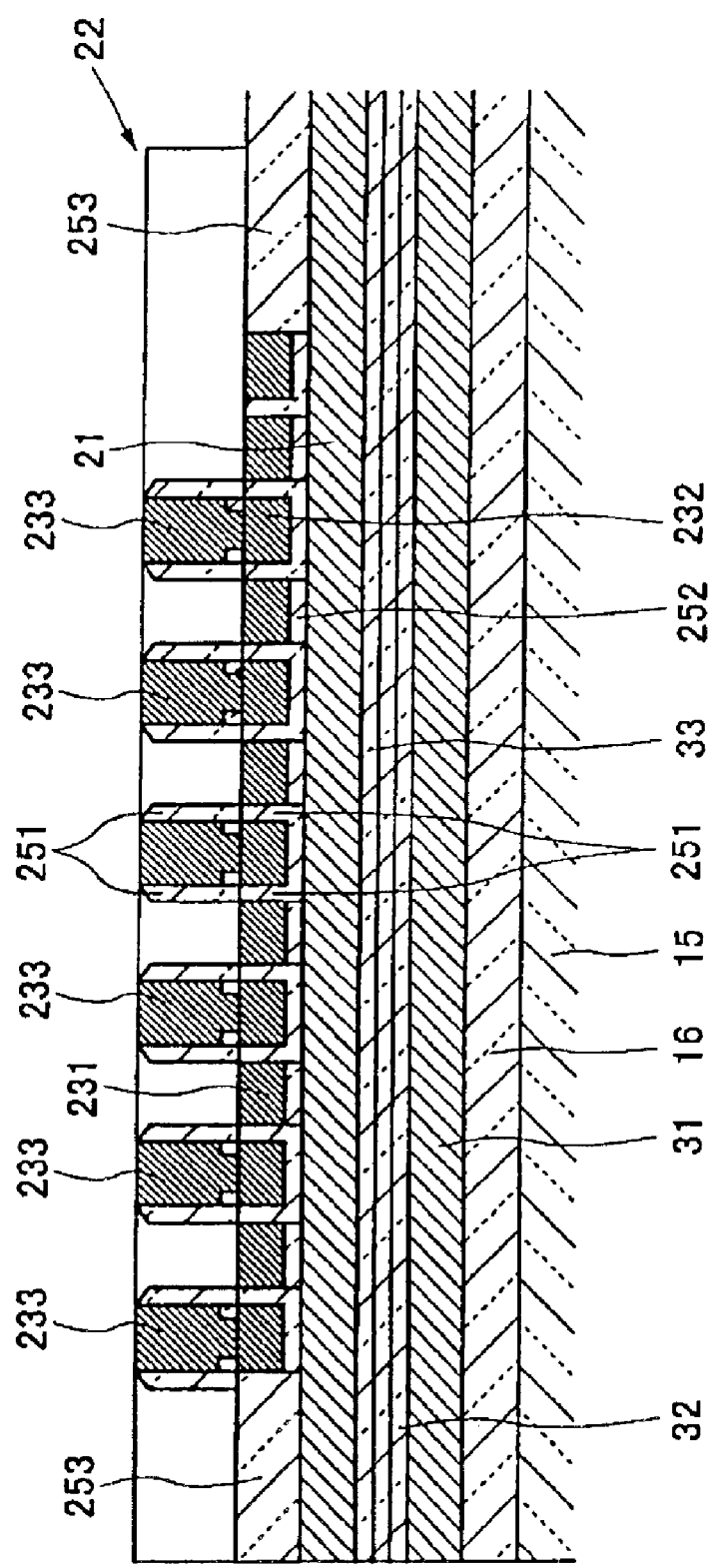
FIG. 67 is a cross sectional view showing the step after the step shown in FIGS. 65 and 66.

FIG. 67 is a cross sectional view showing the step after the step shown in FIGS. 65 and 66. Then, as shown in FIGS. 67, the top surfaces of the inorganic insulating film 251 located on the third thin film conductors 233 are removed by means of dry etching such as milling or RIE to expose the top surfaces of the third thin film conductors 233 to be functioned as conductors. In this case, the upper edges of the remnant inorganic insulating film 251 are removed slightly.

Figure 68:
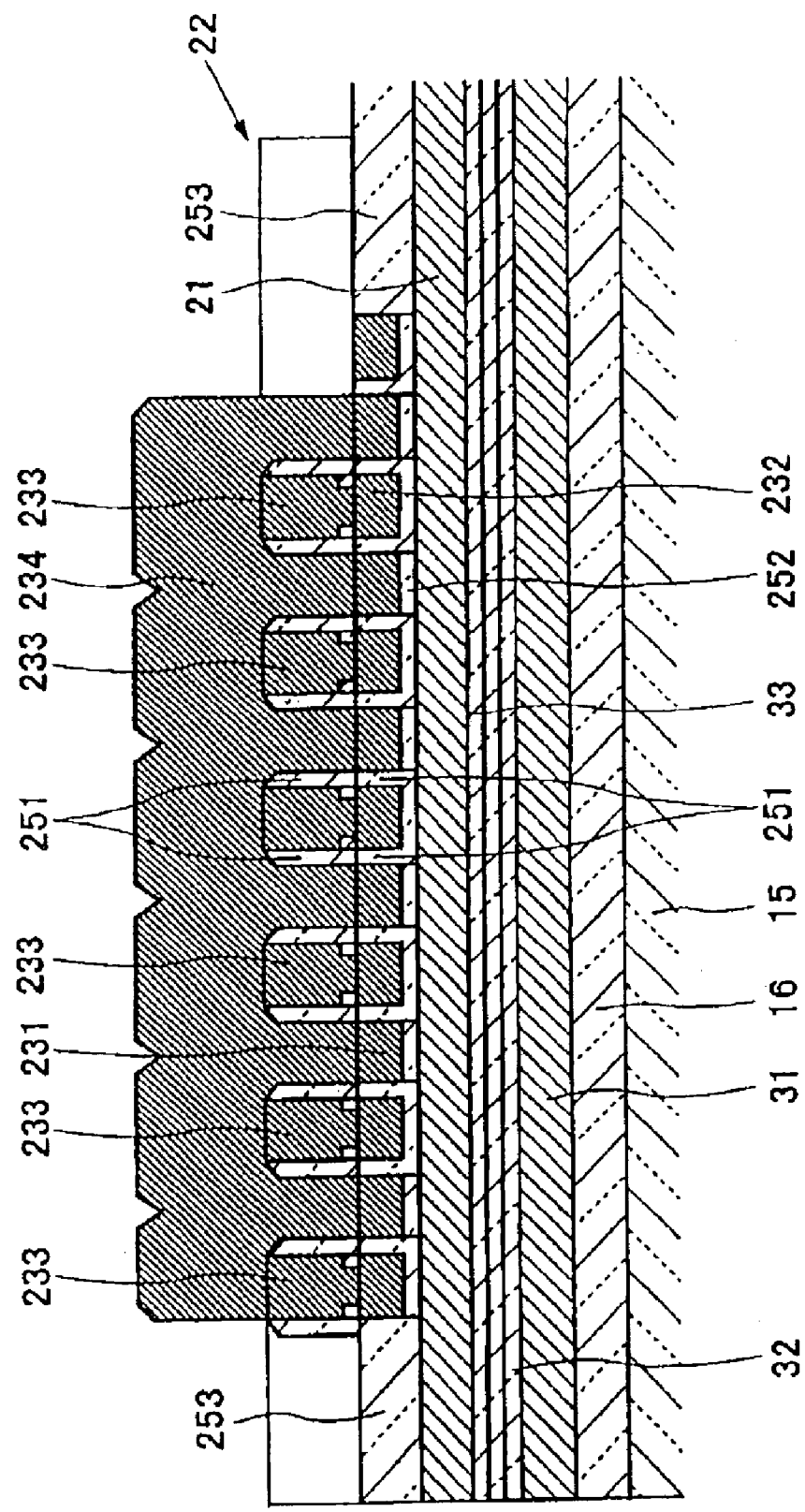
FIG. 68 is a cross sectional view showing the step after the step shown in FIG. 67.

FIG. 68 is a cross sectional view showing the step after the step shown in FIG. 67. Then, as shown in FIG. 68, a fourth thin film conductor 234 is formed over the third thin film conductors 233 and the first thin film conductor 231 exposed in between the adjacent third thin film conductors 233 by means of frame plating.

In this case, the gaps between the adjacent third thin film conductors 233 are embedded with the fourth thin film conductors 234. The fourth thin film conductor 234 is electrically connected to the third thin film conductor 233. The fourth thin film conductor 234 is made of a conductive metallic material such as Cu in a thickness of 1.5–4 $\mu$m.

Figure 69:
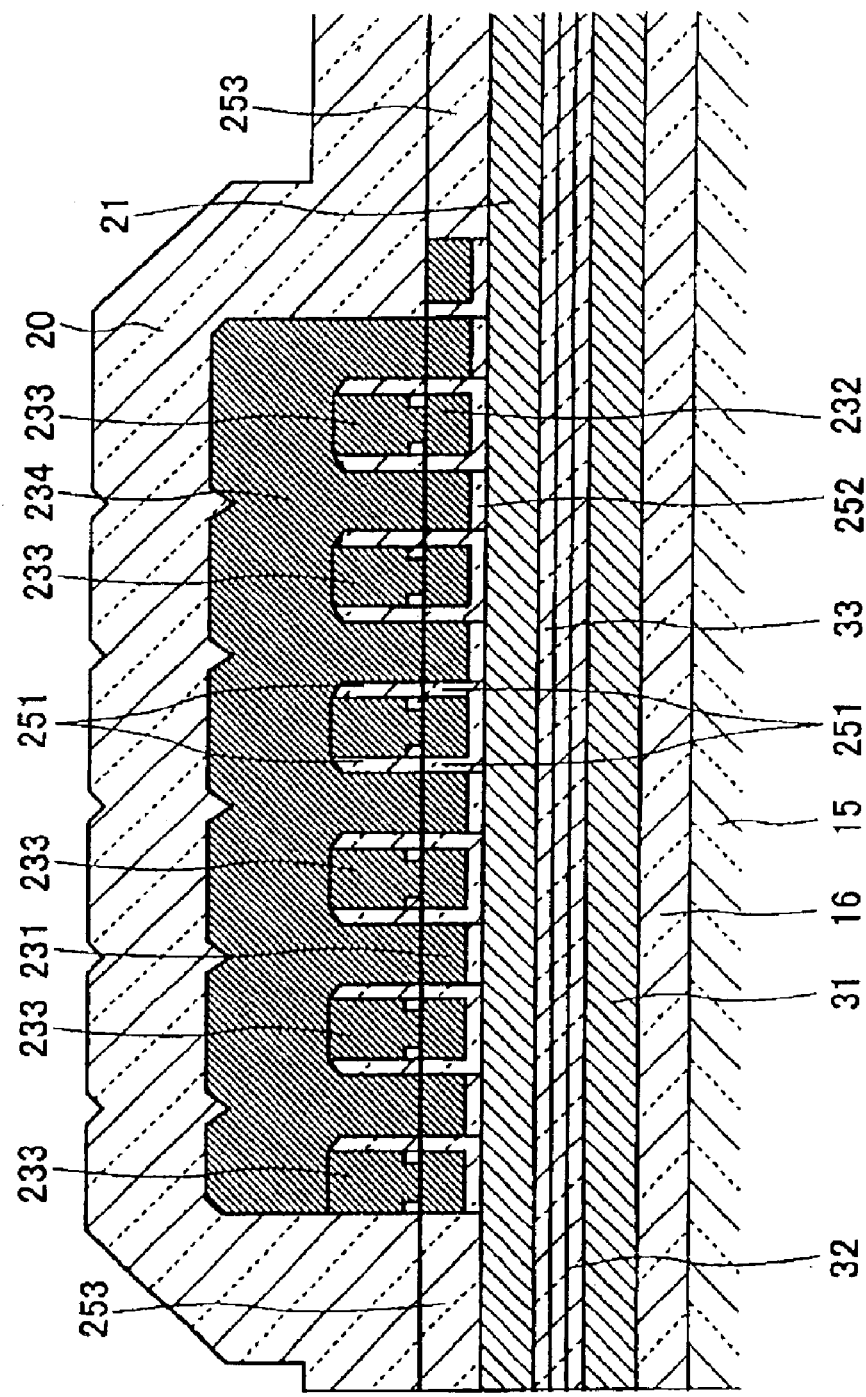
FIG. 69 is a cross sectional view showing the step after the step shown in FIG. 68.

FIG. 69 is a cross sectional view showing the step after the step shown in FIG. 68. Then, as shown in FIG. 69, a flattening film 20 is formed of $Al_2O_3$, $SiO_2$ or the like over the assembly shown in FIG. 68, and flattened by means of CMP.

Figure 70:
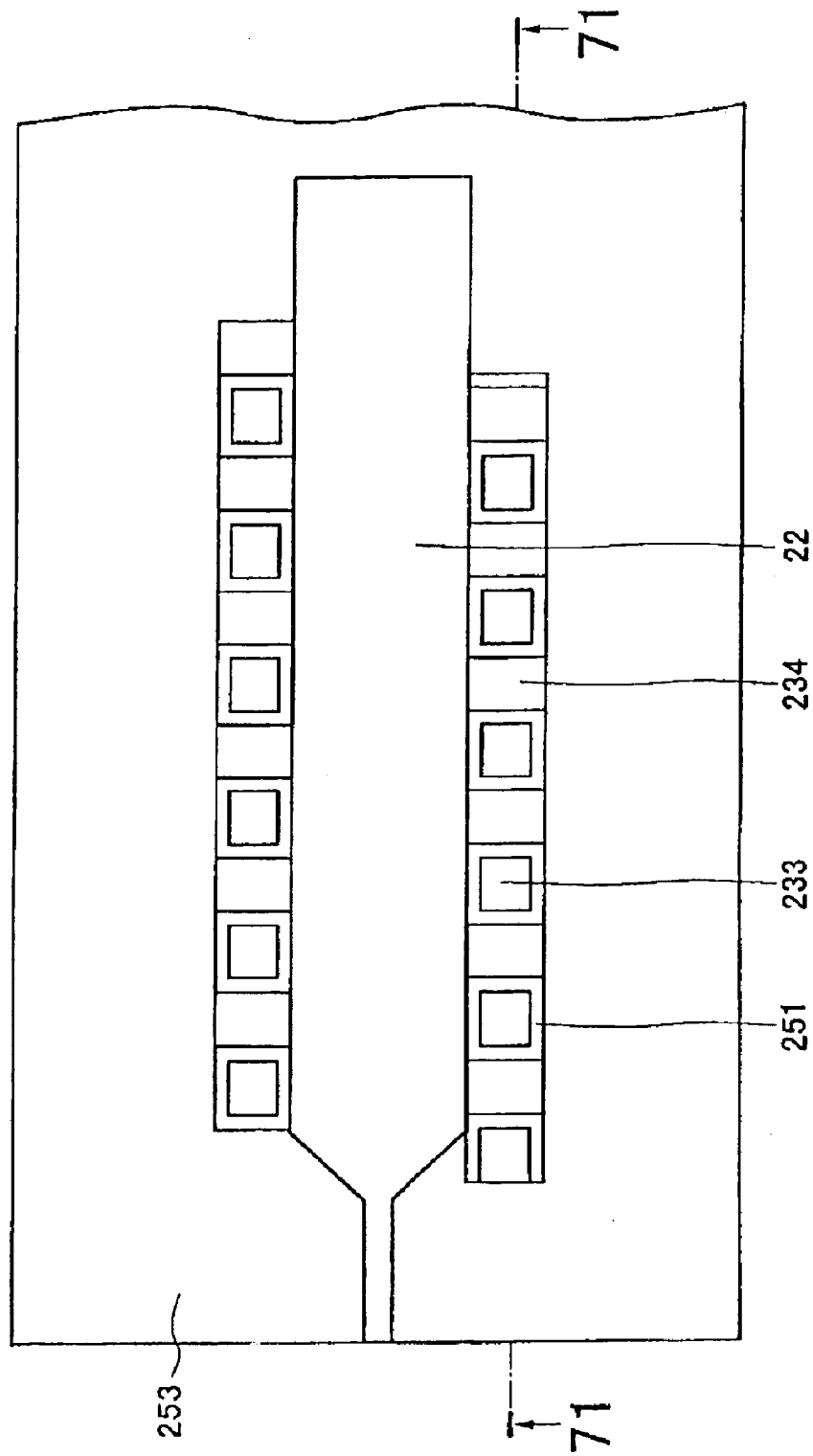
FIG. 70 is a plan view showing the step after the step shown in FIG. 69.
Figure 71:
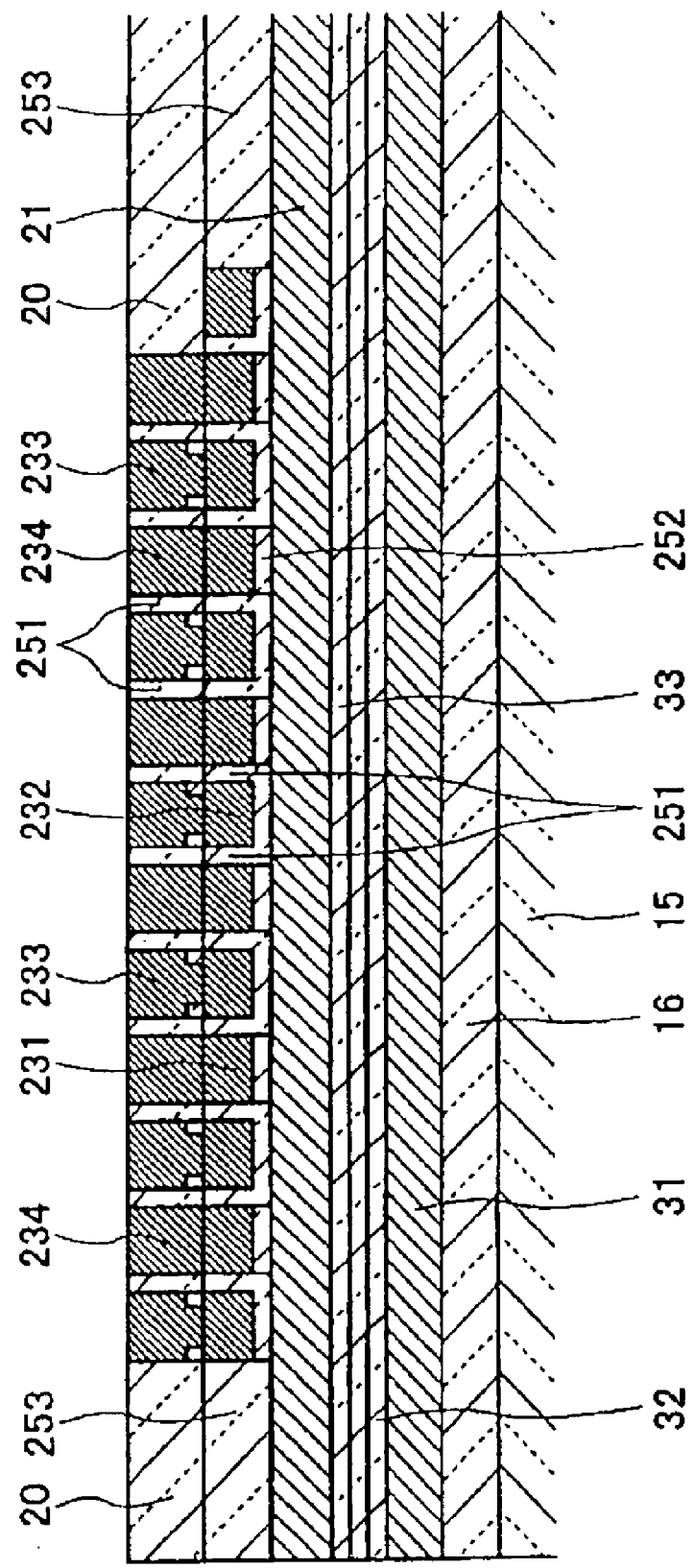
FIG. 71 is a cross sectional view showing the area shown in FIG. 70, taken on line "71—71"

FIG. 70 is a plan view showing the step after the step shown in FIG. 69, and FIG. 71 is a cross sectional view showing the area shown in FIG. 70, taken on line "71—71". In the flattening process, as shown in FIG. 71, the top surfaces of the third and the fourth thin film conductors 233 and 234 are flattened to be exposed.

Figure 72:
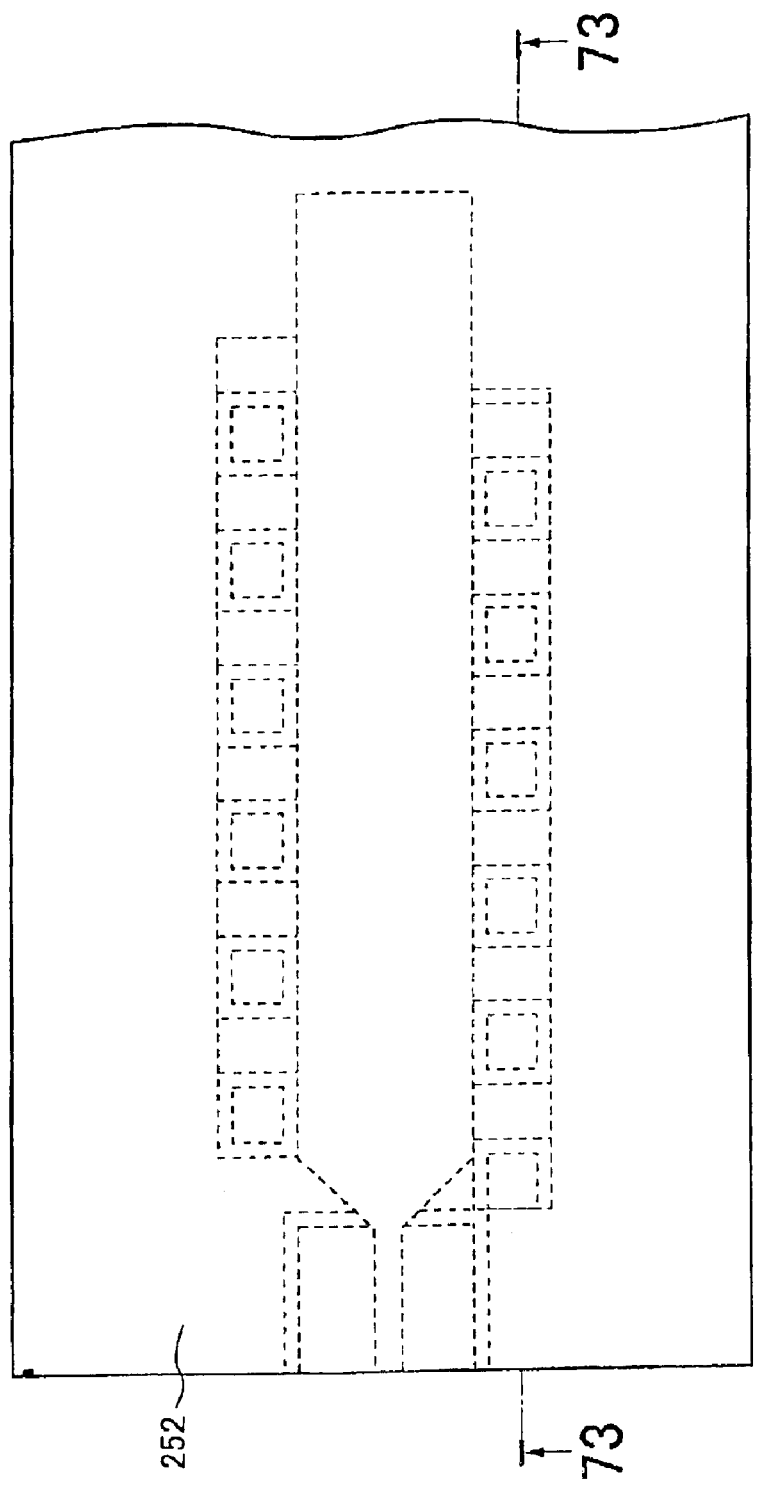
FIG. 72 is a plan view showing the step after the step shown in FIGS. 70 and 71.
Figure 73:
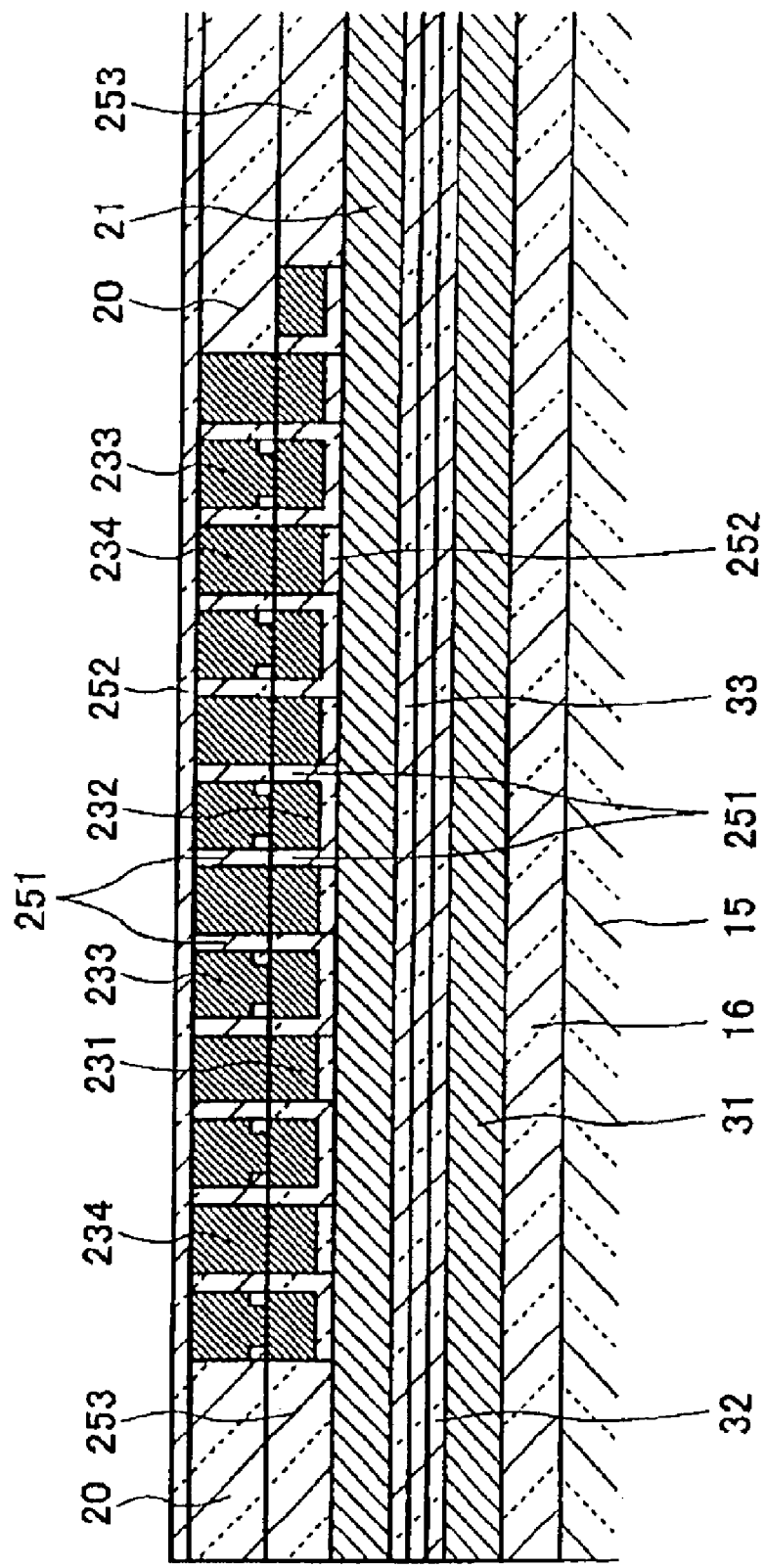
FIG. 73 is a cross sectional view showing the area shown in FIG. 72, taken on line "73—73"

FIG. 72 is a plan view showing the step after the step shown in FIGS. 70 and 71, and FIG. 73 is a cross sectional view showing the area shown in FIG. 72, taken on line "73—73". Then, as shown in FIGS. 72 and 73, the inorganic insulating film 252 is formed over the flattening film 20, the third thin film conductors 233 and the fourth thin film conductors 234. The inorganic insulating film 252 is made in the same manner as mentioned above.

Figure 74:
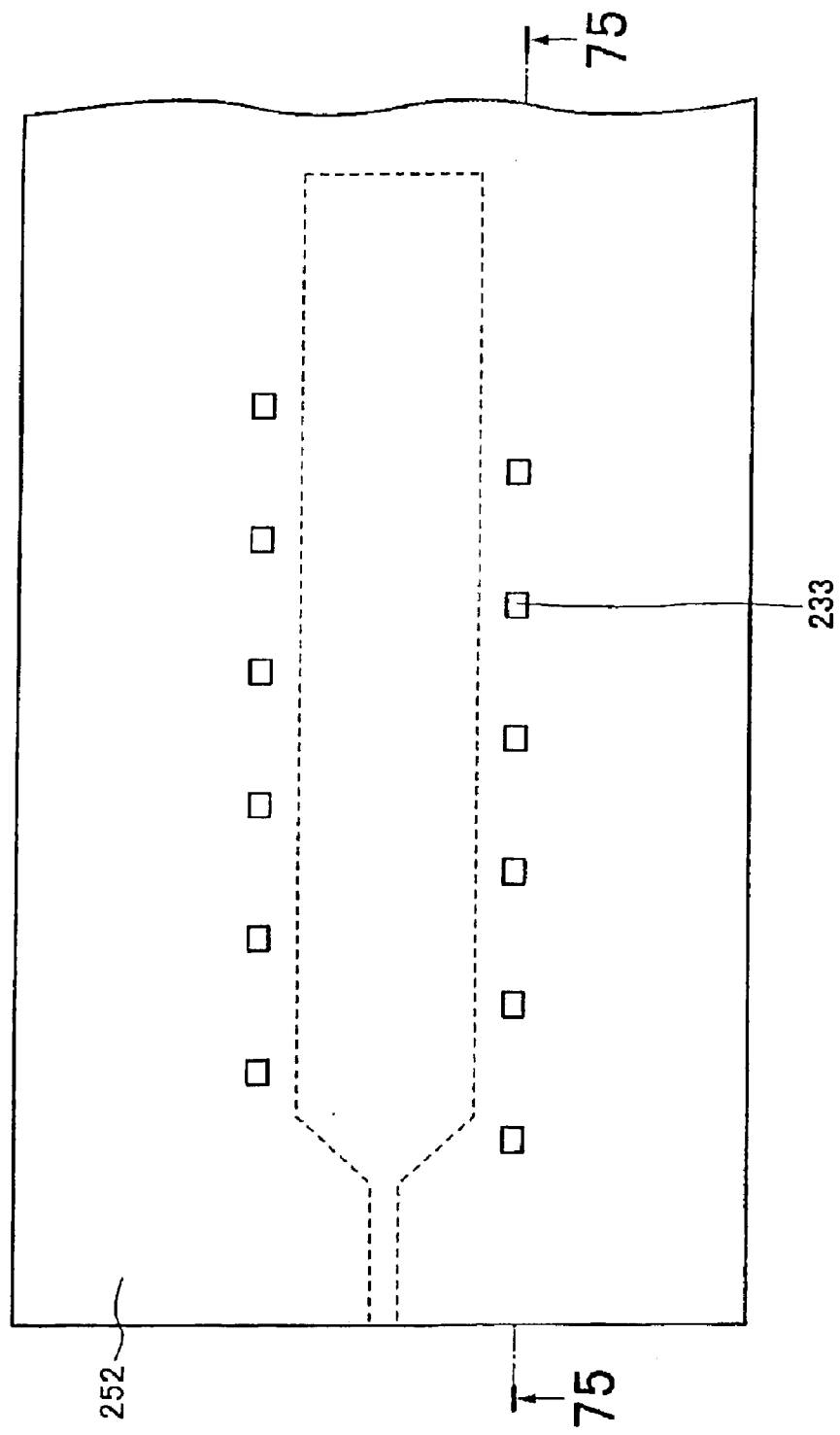
FIG. 74 is a plan view showing the step after the step shown in FIGS. 72 and 73.
Figure 75:
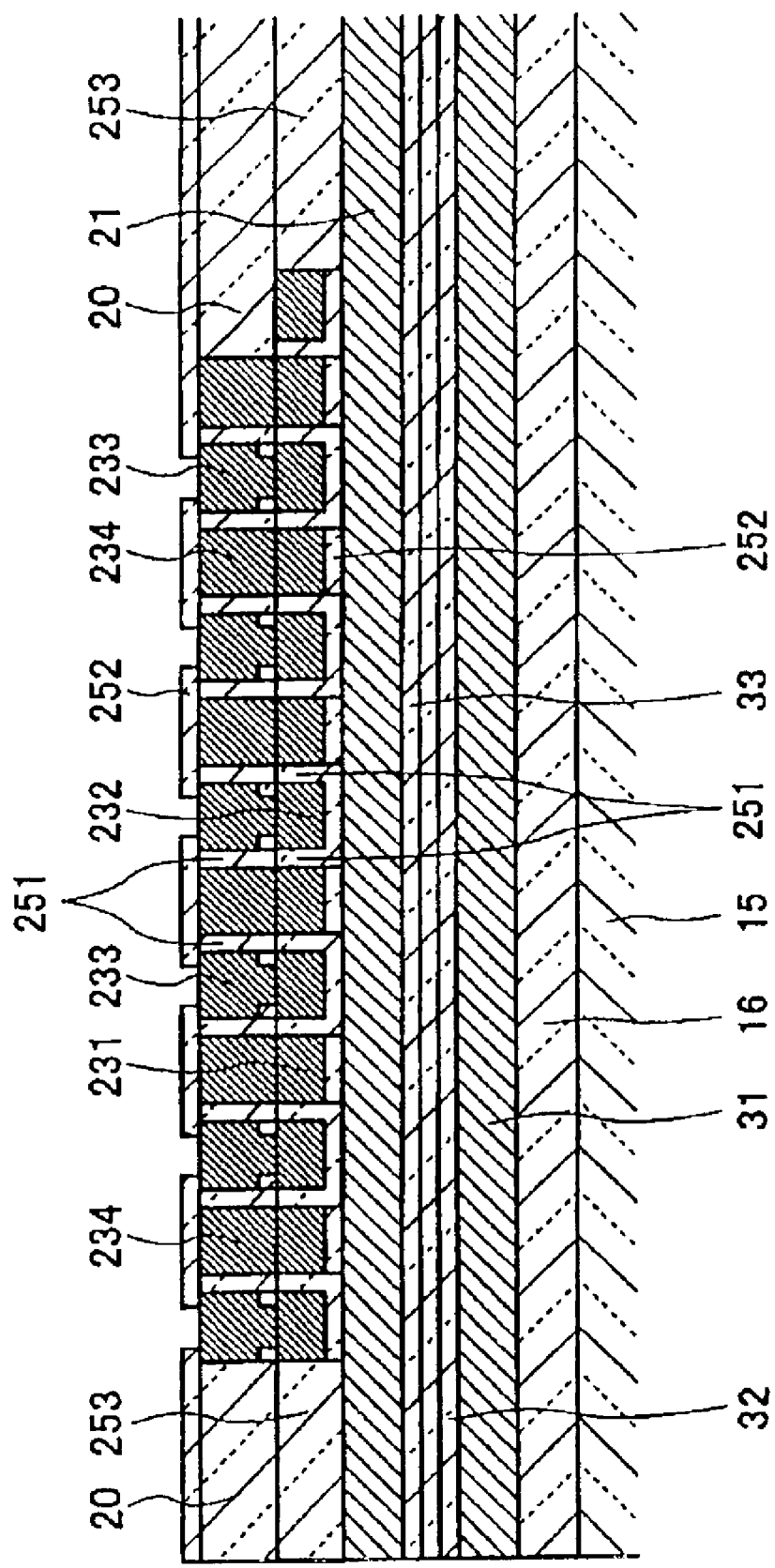
FIG. 75 is a cross sectional view showing the area shown in FIG. 74, taken on line "75—75"

FIG. 74 is a plan view showing the step after the step shown in FIGS. 72 and 73, and FIG. 75 is a cross sectional view showing the area shown in FIG. 74, taken on line "75—75". As shown in FIGS. 74 and 75, the inorganic insulating film 252 is partially removed to expose the top surfaces of the third thin film conductors 233 by means of dry etching such as milling or RIE using a resist pattern as a mask. The resist mask is removed by a solvent or by means of ashing. In this case, openings are formed in the inorganic insulating film 252.

Figure 76:
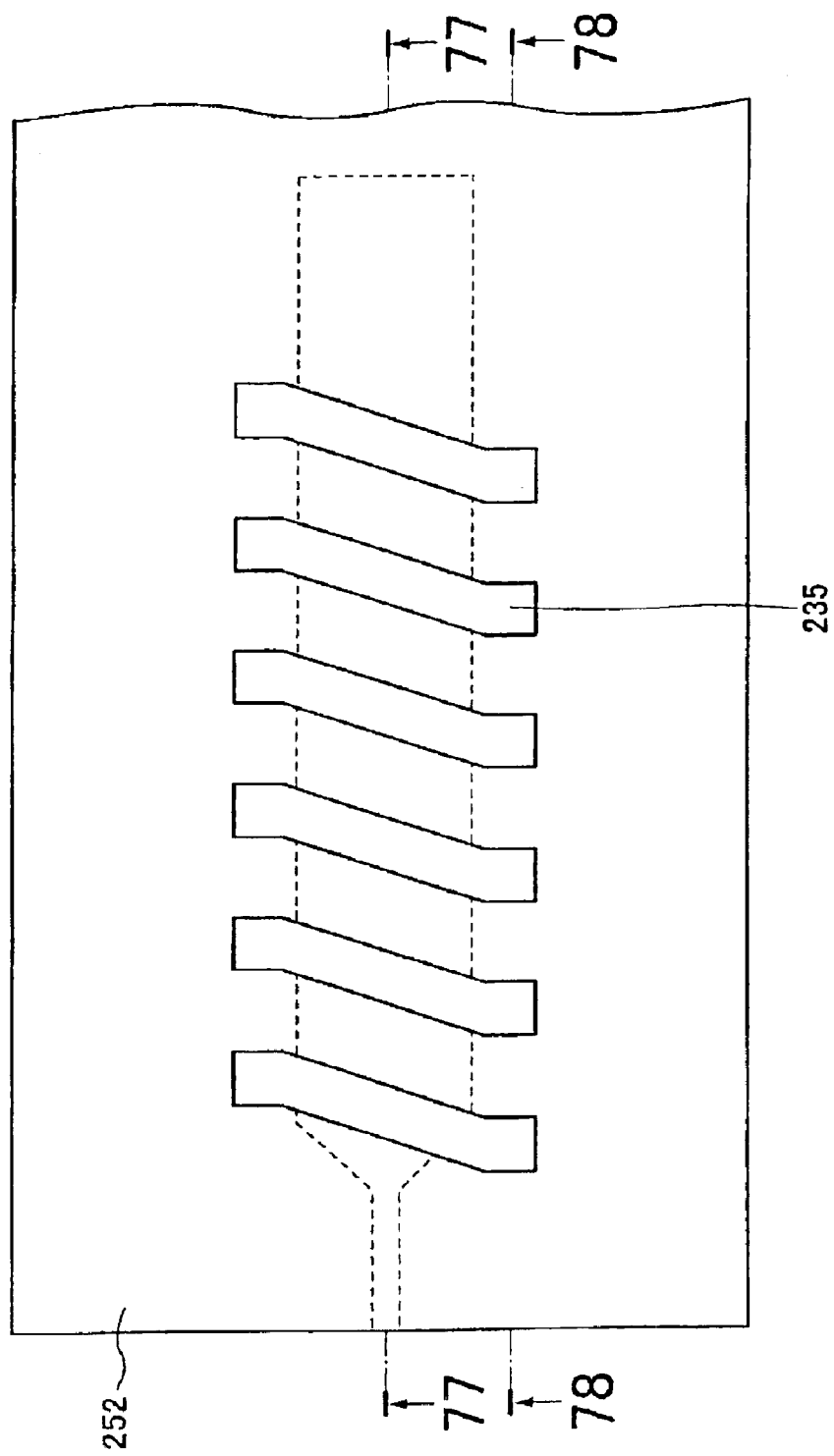
FIG. 76 is a plan view showing the step after the step shown in FIGS. 74 and 75.
Figure 77:
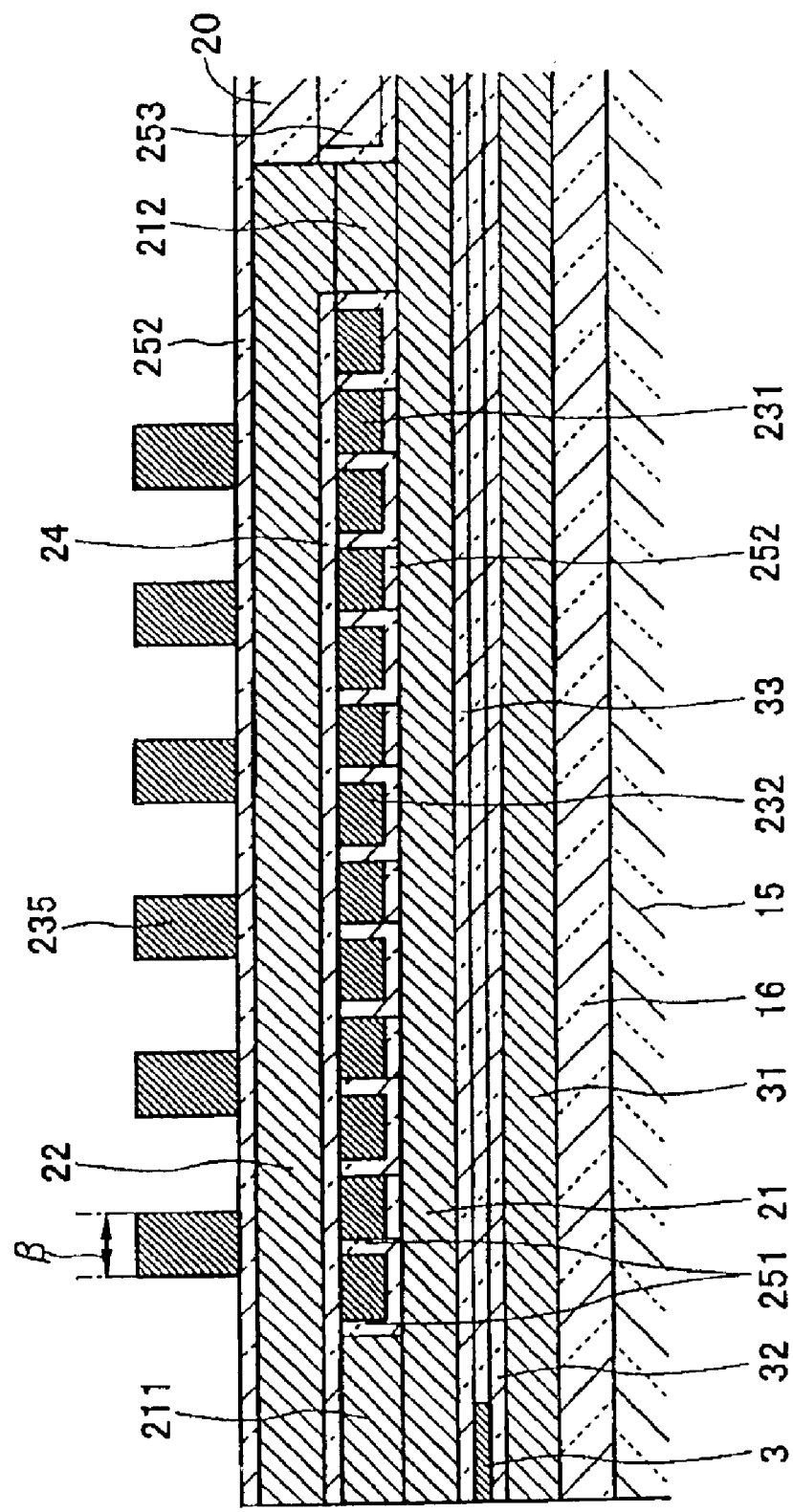
FIG. 77 is a cross sectional view showing the area shown in FIG. 76, taken on line "77—77"
Figure 78:
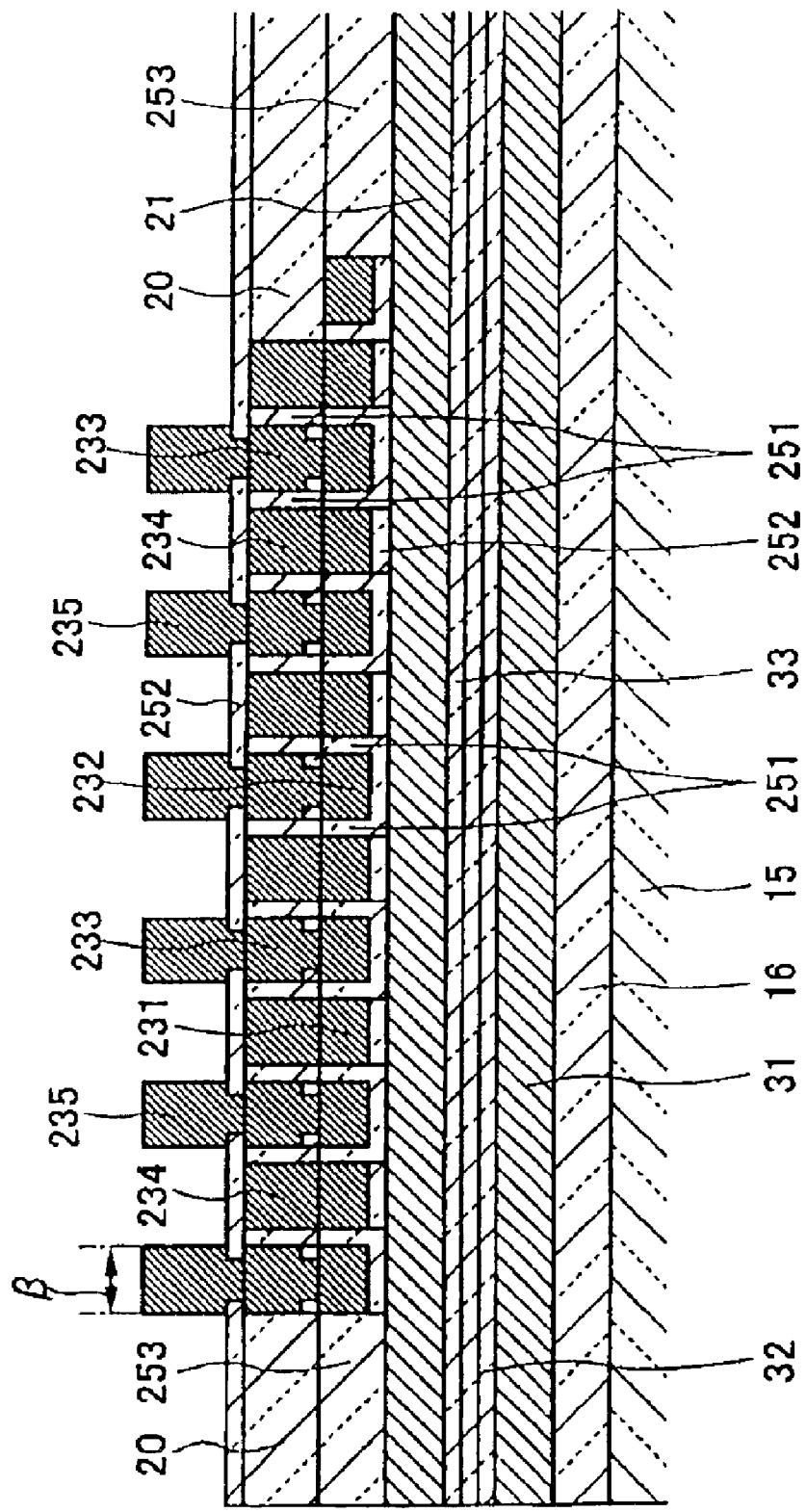
FIG. 78 is a cross sectional view showing the area shown in FIG. 76, taken on line "78—78"

FIG. 76 is a plan view showing the step after the step shown in FIGS. 74 and 75, and FIG. 77 is a cross sectional view showing the area shown in FIG. 76, taken on line "77—77", and FIG. 78 is a cross sectional view showing the area shown in FIG. 76, taken on line "78—78". As shown in FIGS. 76–78, plural fifth thin film conductors 235 are formed on the remaining inorganic insulating film 252.

The fifth thin film conductors 235 are arranged along the direction X so as to be separated from one another by the distance A. Each fifth thin film conductor is made of a conductive metallic material such as Cu in band-like shape by means of frame plating. In the fabrication of the fifth thin conductors 235, a seed layer is formed on the inorganic insulating film 252 in advance according to a normal frame plating technique. The width β of the first thin film conductor 235, which is defined by the thickness as viewed from the direction X, is preferably set within 0.25–3 μm. The inherent thickness of the first thin film conductor 235, which is defined by the thickness as viewed from the vertical direction, is preferably made thicker, and concretely, can be made twice as thick as the width β by means of frame plating.

Then, as shown in FIG. 78, the fifth thin film conductors 235 are electrically connected to the third thin film conductors 233 via the openings. Fundamentally, the fifth thin film conductors 235 may be made by the fabrication process shown in FIGS. 5–11.

Figure 79:
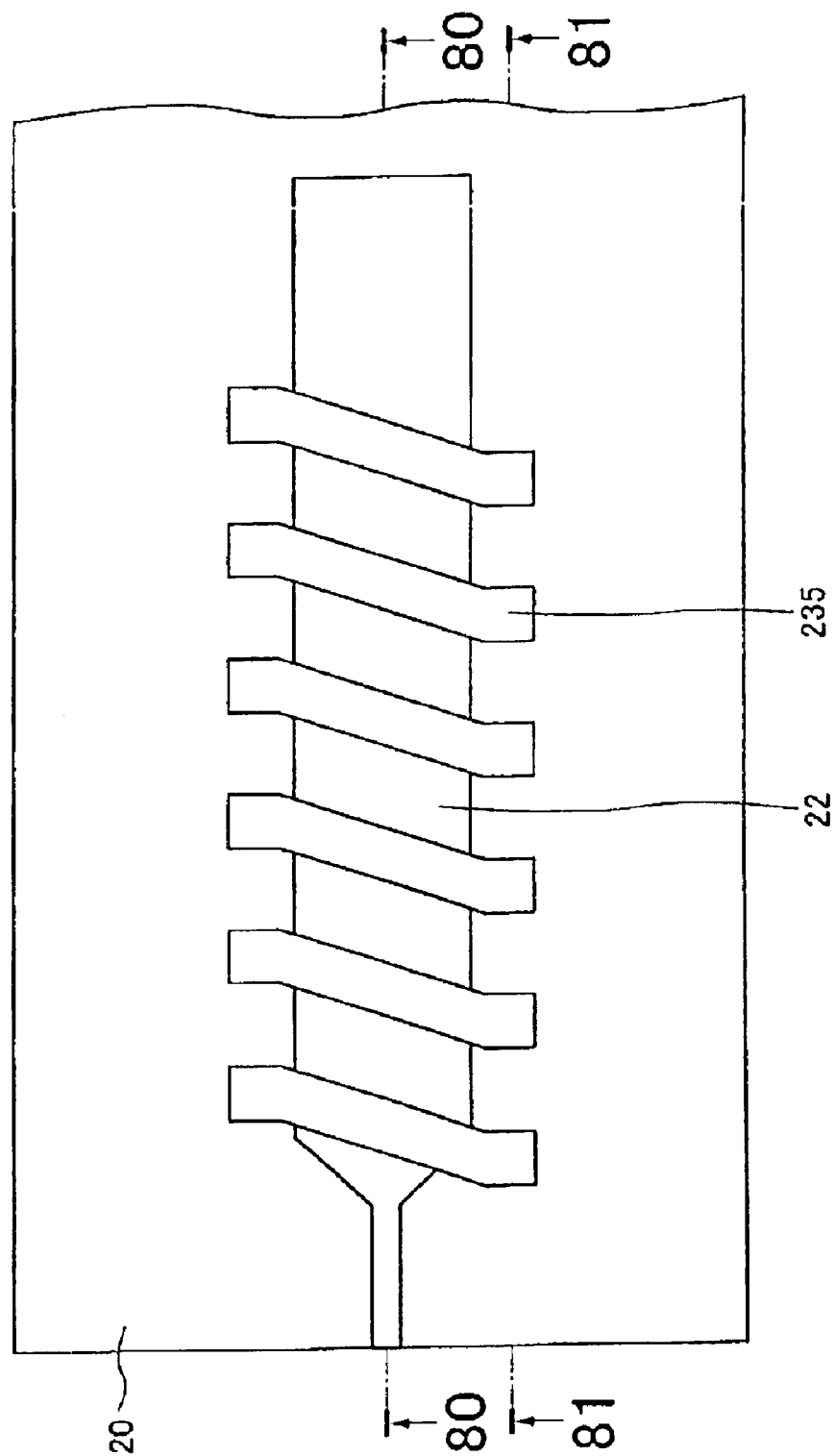
FIG. 79 is a plan view showing the step after the step shown in FIGS. 76–78.
Figure 80:
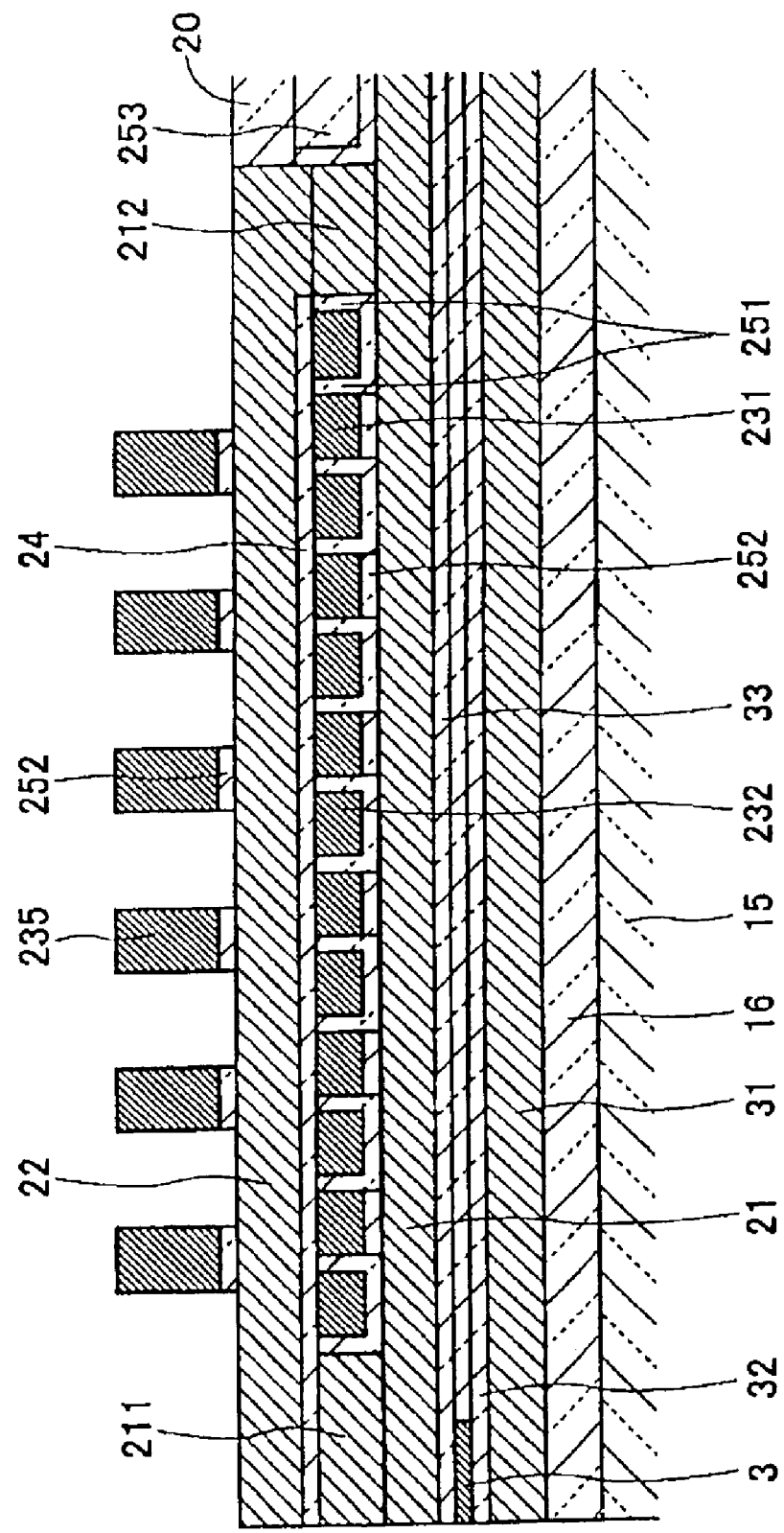
FIG. 80 is a cross sectional view showing the area shown in FIG. 79, taken on line "80—80"
Figure 81:
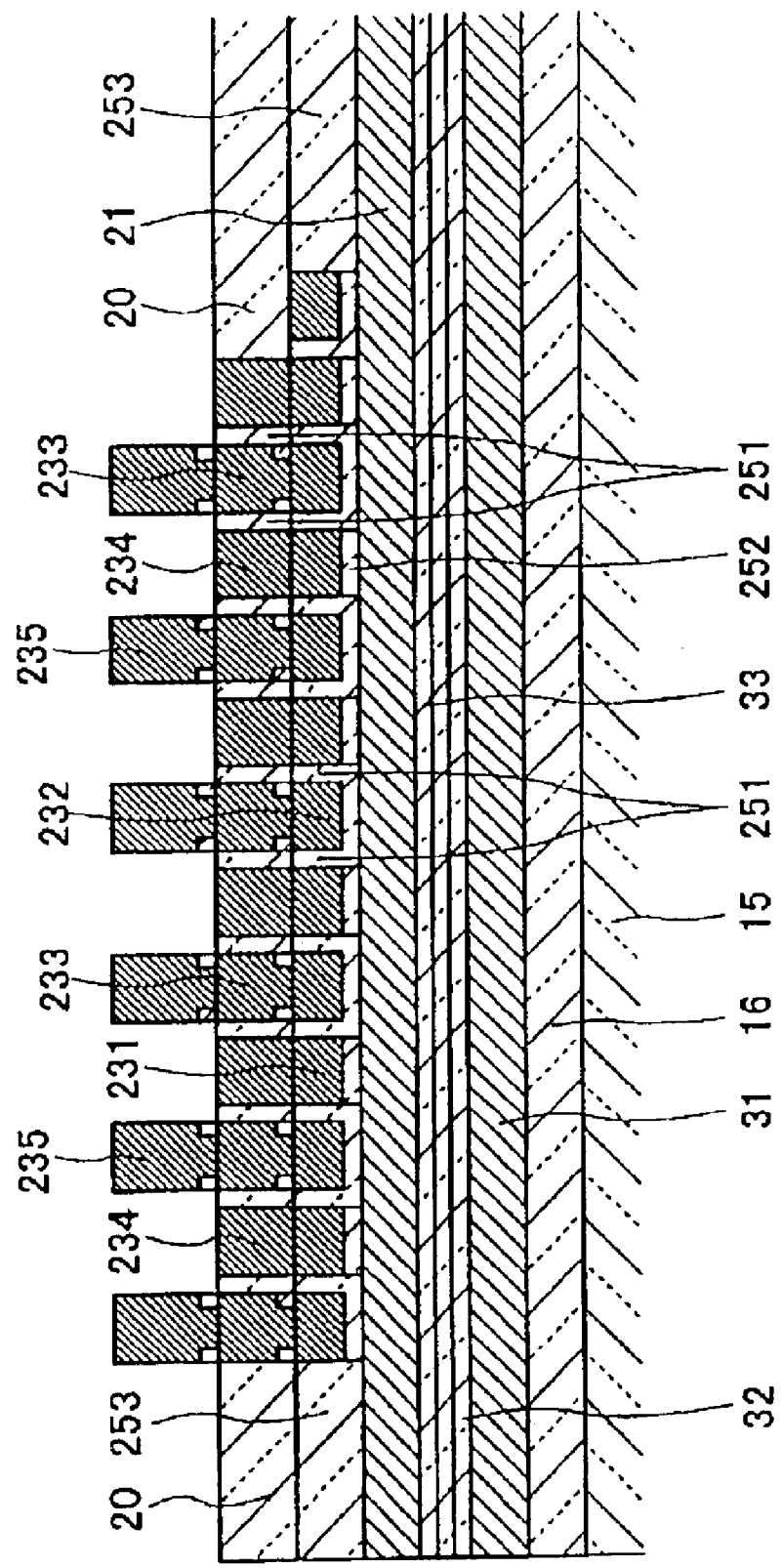
FIG. 81 is a cross sectional view showing the area shown in FIG. 79, taken on line "81—81"

FIG. 79 is a plan view showing the step after the step shown in FIGS. 76–78, and FIG. 80 is a cross sectional view showing the area shown in FIG. 79, taken on line "80—80", and FIG. 81 is a cross sectional view showing the area shown in FIG. 79, taken on line "81—81". As shown in FIGS. 79–81, the inorganic insulating film 252 is partially removed from in between the adjacent fifth thin film conductors 235 by means of dry etching such as milling or RIE using the thin film conductors 235 as a mask.

Figure 82:
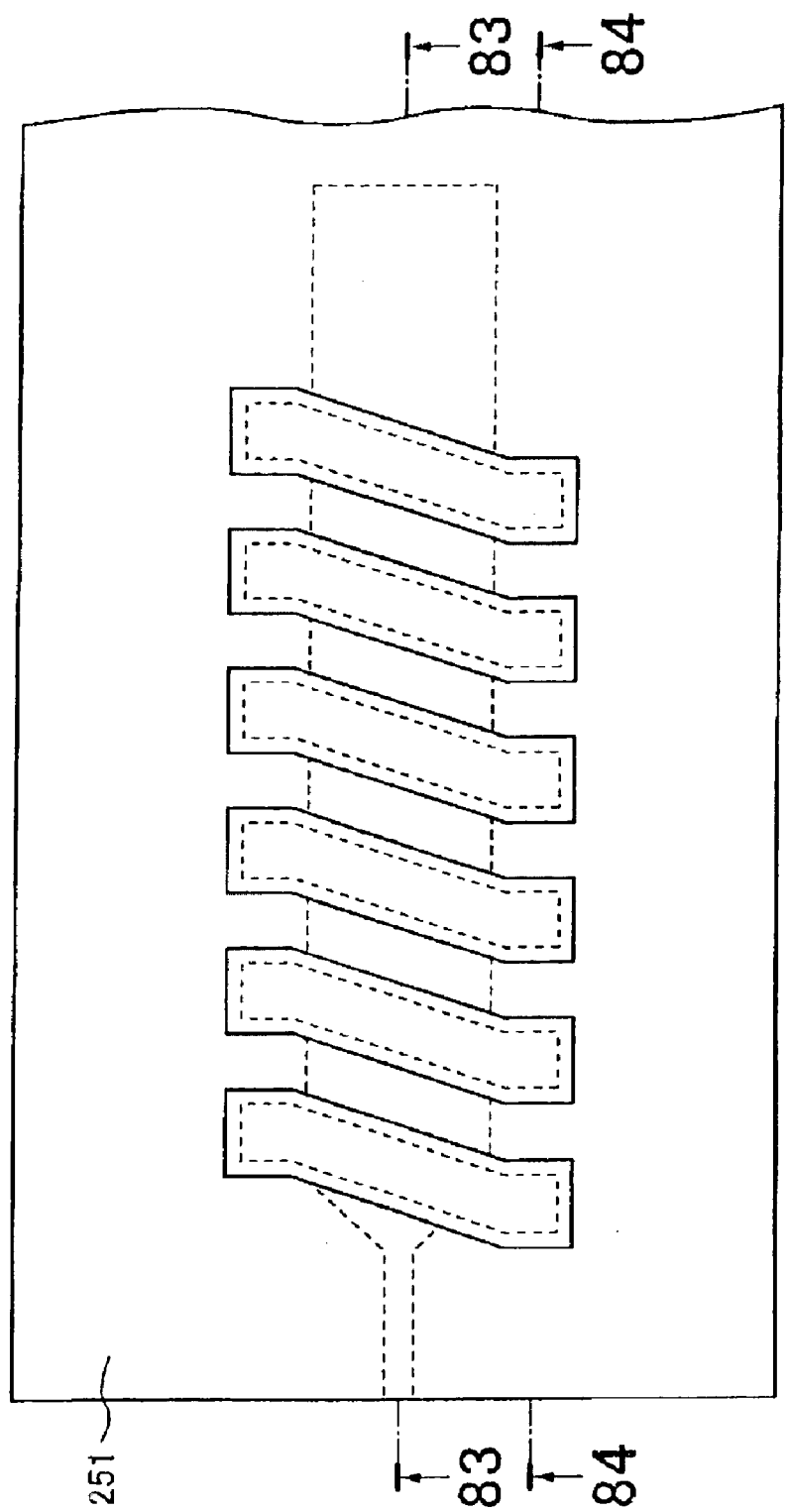
FIG. 82 is a plan view showing the step after the step shown in FIGS. 80 and 81.
Figure 83:
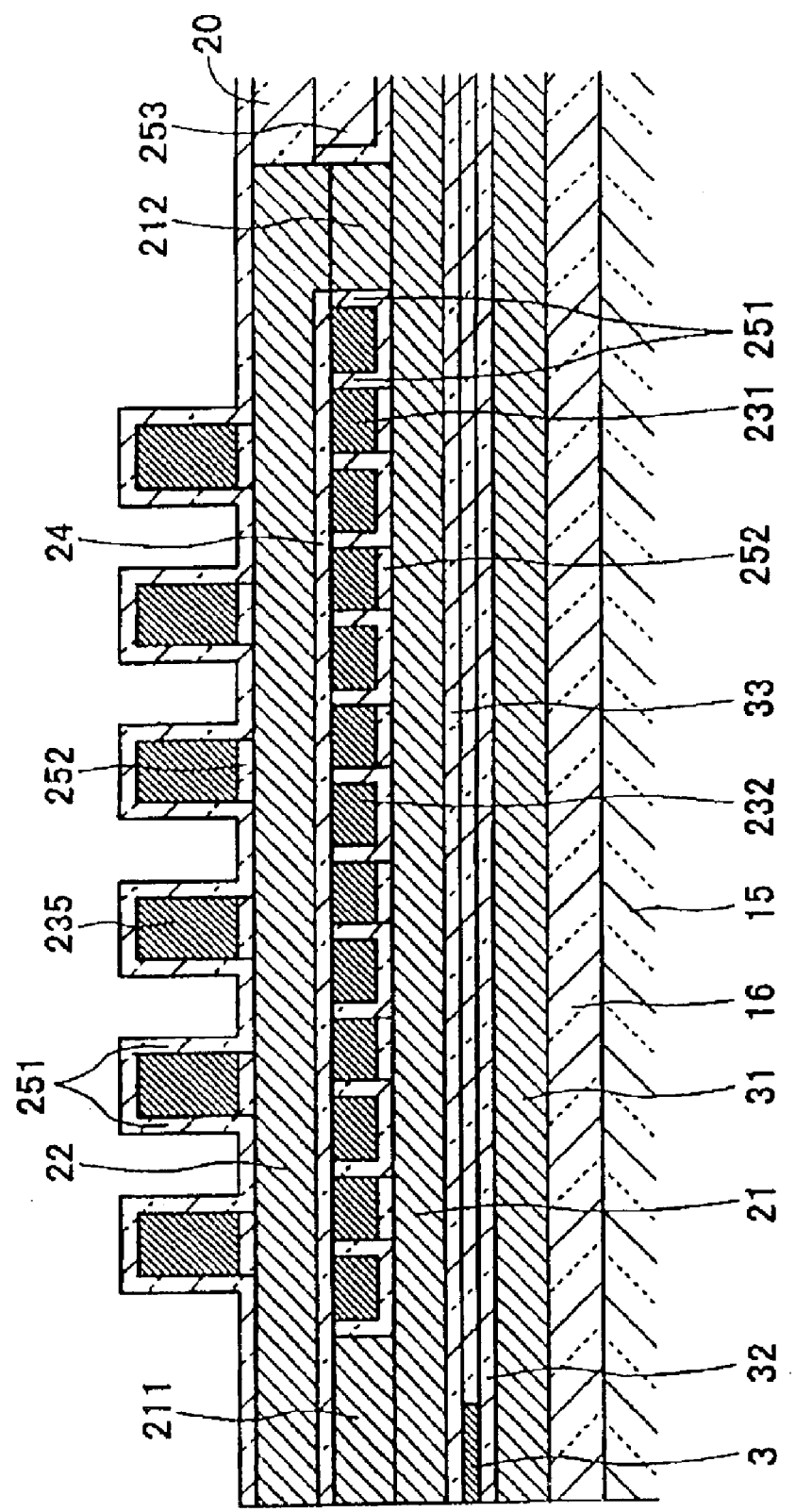
FIG. 83 is a cross sectional view showing the area shown in FIG. 82, taken on line "83—83"
Figure 84:
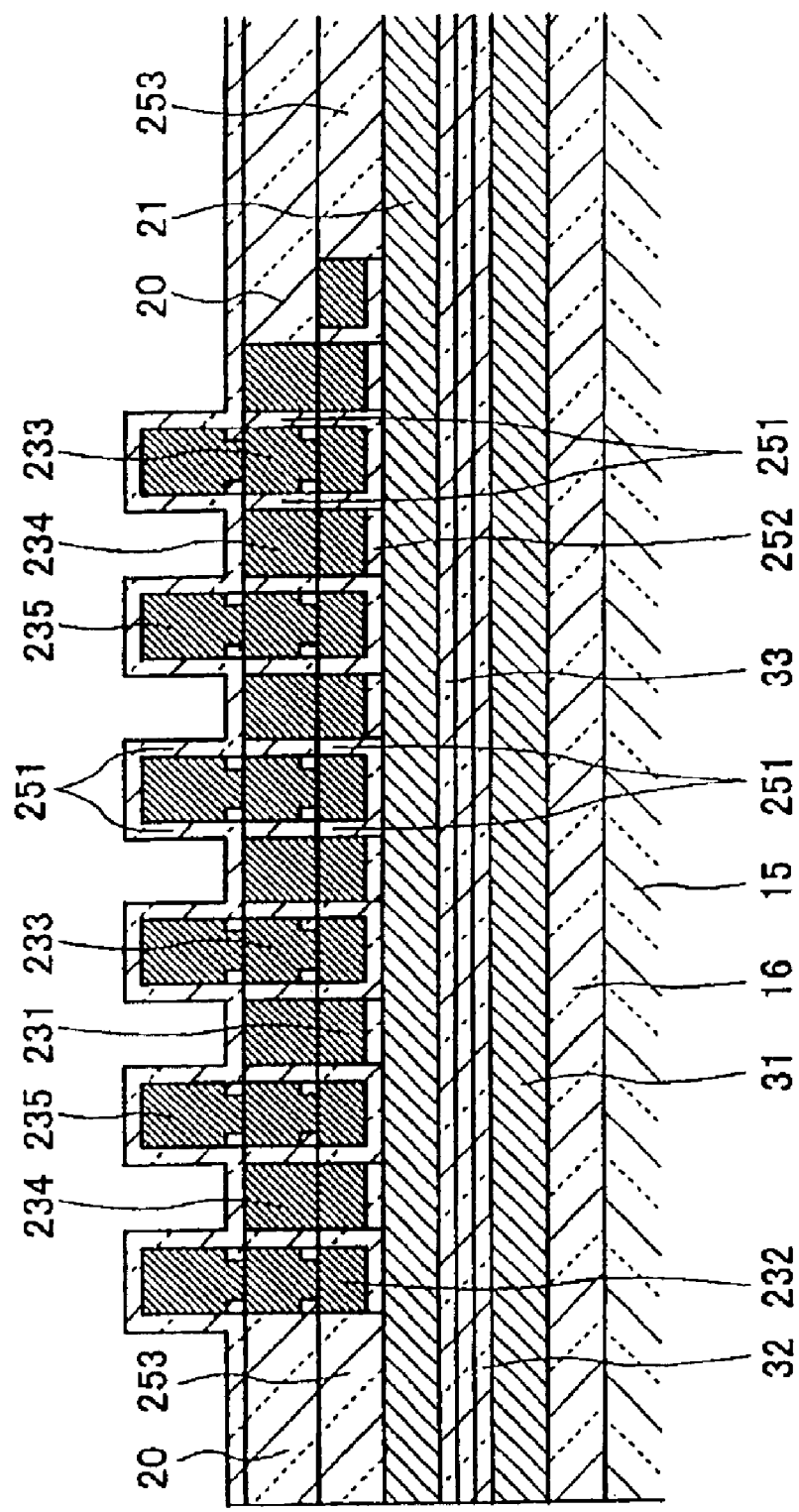
FIG. 84 is a cross sectional view showing the area shown in FIG. 82, taken on line "84—84"

FIG. 82 is a plan view showing the step after the step shown in FIGS. 80 and 81, and FIG. 83 is a cross sectional view showing the area shown in FIG. 82, taken on line "83—83", and FIG. 84 is a cross sectional view showing the area shown in FIG. 82, taken on line "84—84".

Then, as shown in FIGS. 82–84, the inorganic insulating film 251 is formed in a uniform thickness over the second magnetic layer 22, the fifth thin film conductors 235 and the flattening film 20. In this case, the inorganic insulating film 251 is formed along the side surfaces of each fifth thin film conductor 235 so as to be connected to the top surface of each fourth thin film conductor 234.

Figure 85:
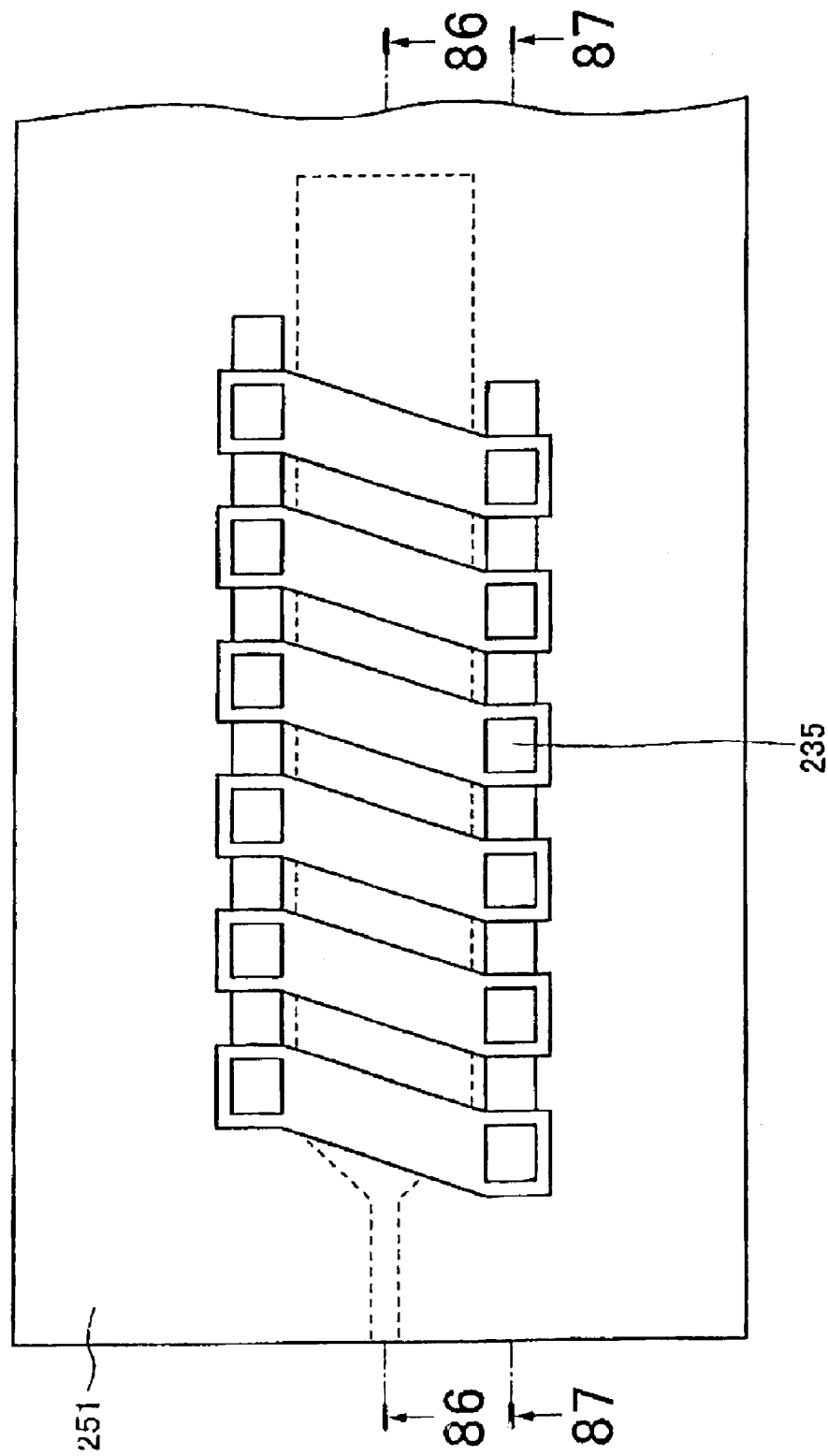
FIG. 85 is a plan view showing the step after the step shown in FIGS. 82–84.
Figure 86:
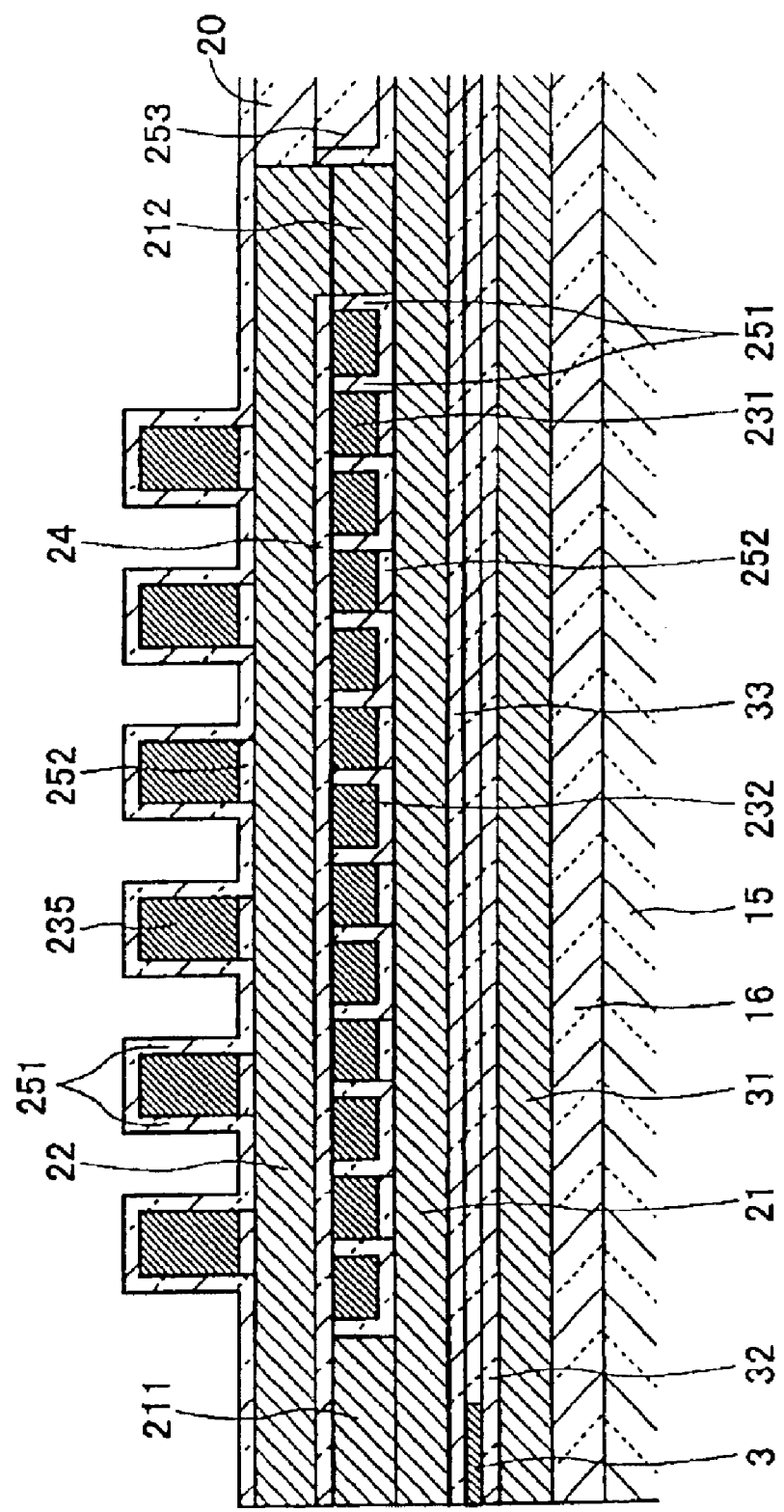
FIG. 86 is a cross sectional view showing the area shown in FIG. 85, taken on line "86—86"
Figure 87:
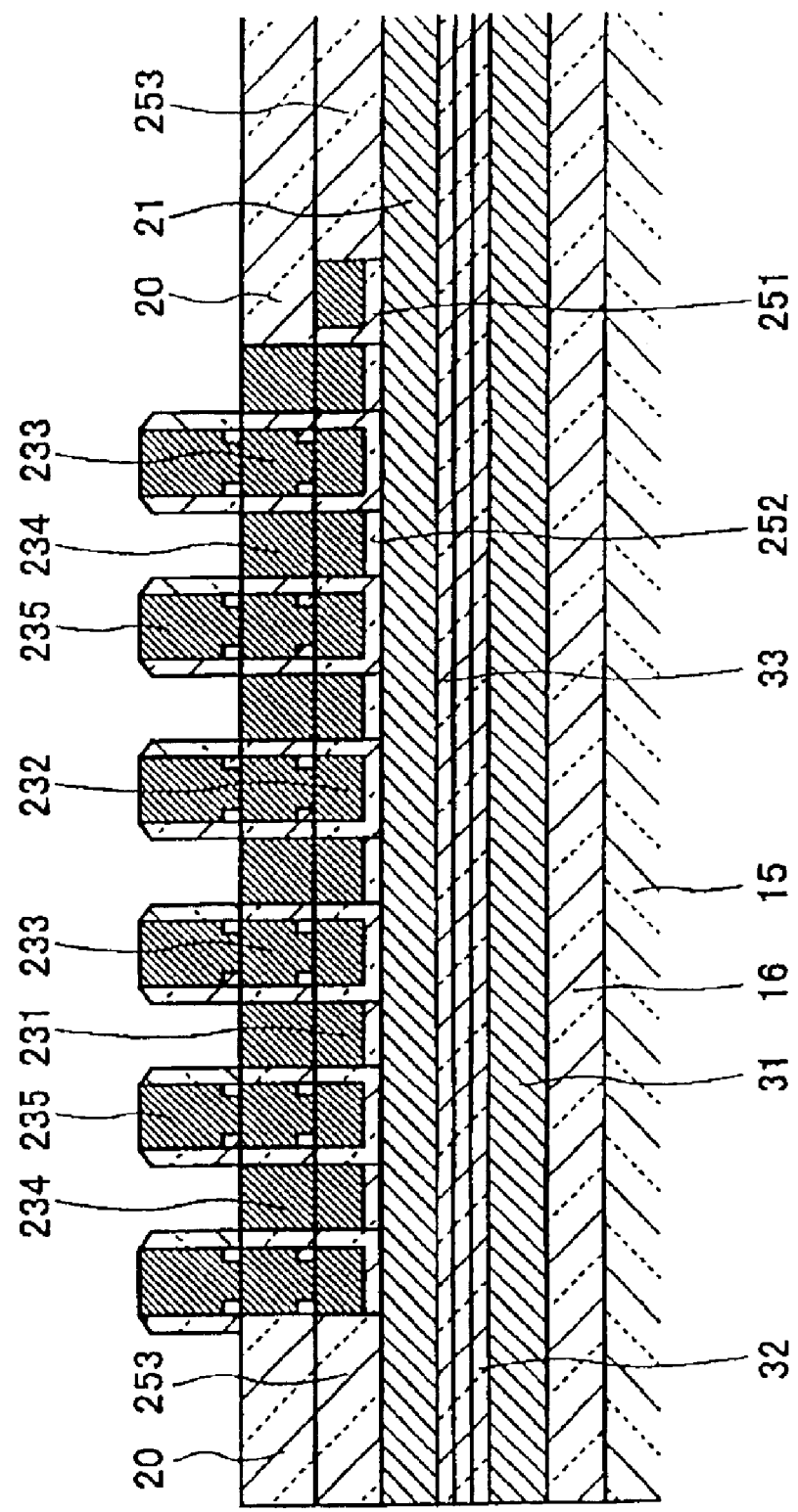
FIG. 87 is a cross sectional view showing the area shown in FIG. 85, taken on line "87—87"

FIG. 85 is a plan view showing the step after the step shown in FIGS. 82–84, and FIG. 86 is a cross sectional view showing the area shown in FIG. 85, taken on line "86—86", and FIG. 87 is a cross sectional view showing the area shown in FIG. 85, taken on line "87—87". Then, as shown in FIGS. 85–87, the top surfaces of the inorganic insulating film 251 located on the fifth thin film conductors 235 are removed by means of dry etching such as milling or RIE using a resist mask to expose the top surfaces of the fifth thin film conductors 235 to be functioned as conductors. In this case, the upper edges of the remnant inorganic insulating film 251 are removed slightly. After the dry etching process, the resist mask is removed by a solvent or by means of ashing.

Figure 88:
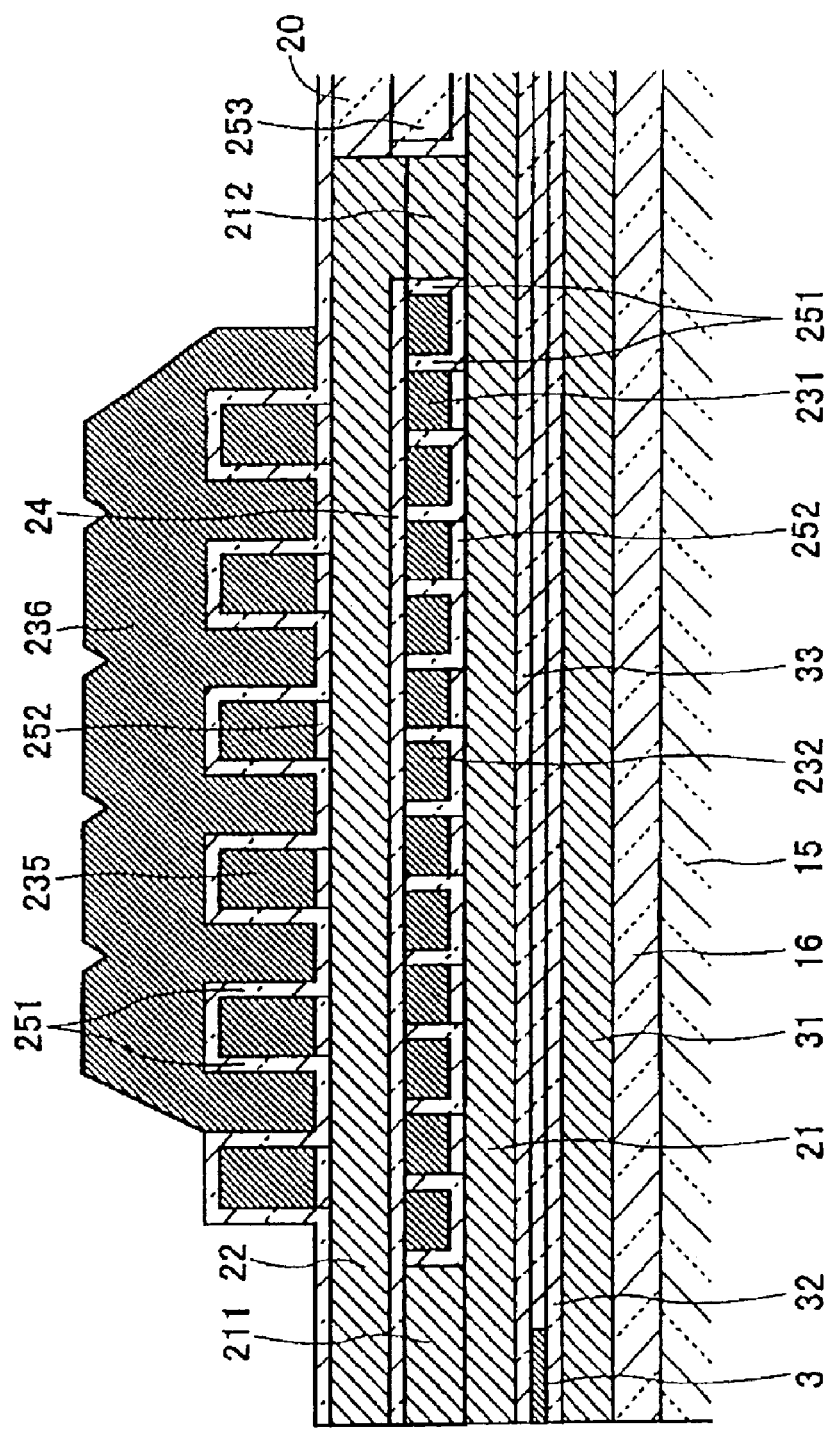
FIG. 88 is a cross sectional view showing the step after the step shown in FIGS. 85–87.
Figure 89:
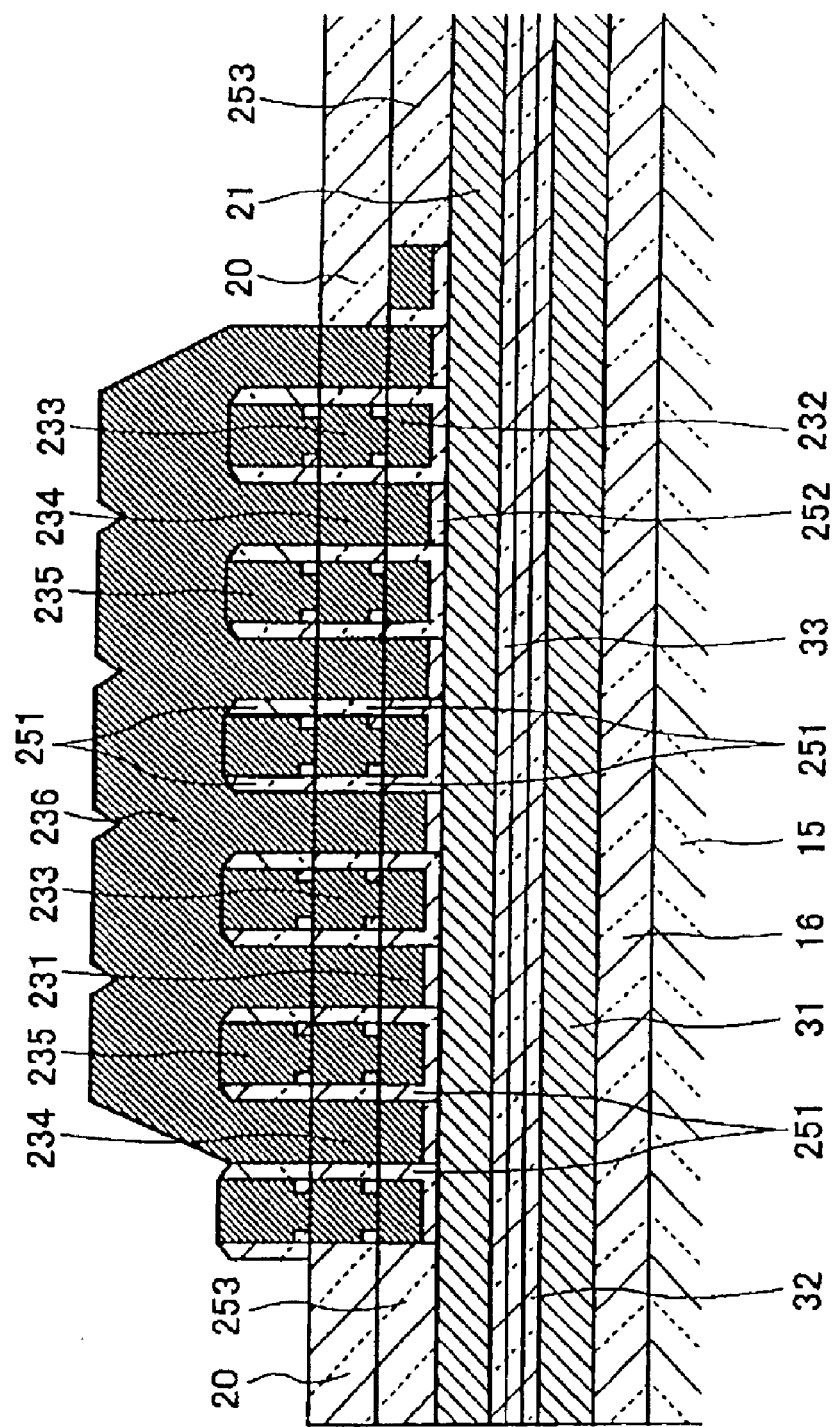
FIG. 89 is another cross sectional view showing the step after the step shown in FIGS. 85–87.

FIGS. 88 and 89 are cross sectional views showing the step after the step shown in FIGS. 85–87, taken on line "86—86" and line "87—87", respectively. As shown in FIGS. 88 and 89, a sixth thin film conductor 236 is formed so as to embed the gaps between the adjacent fifth thin film conductors 235.

The sixth thin film conductor 236 is electrically insulated from the fifth thin film conductor 235 at the center along the line "86—86", and electrically connected to the fourth thin film conductors 234 and the fifth thin film conductors 235 at the edge along the line "87—87". The sixth thin film conductor 236 is made of a conductive metallic material such as Cu in a thickness of 0.5–3 μm.

Figure 90:
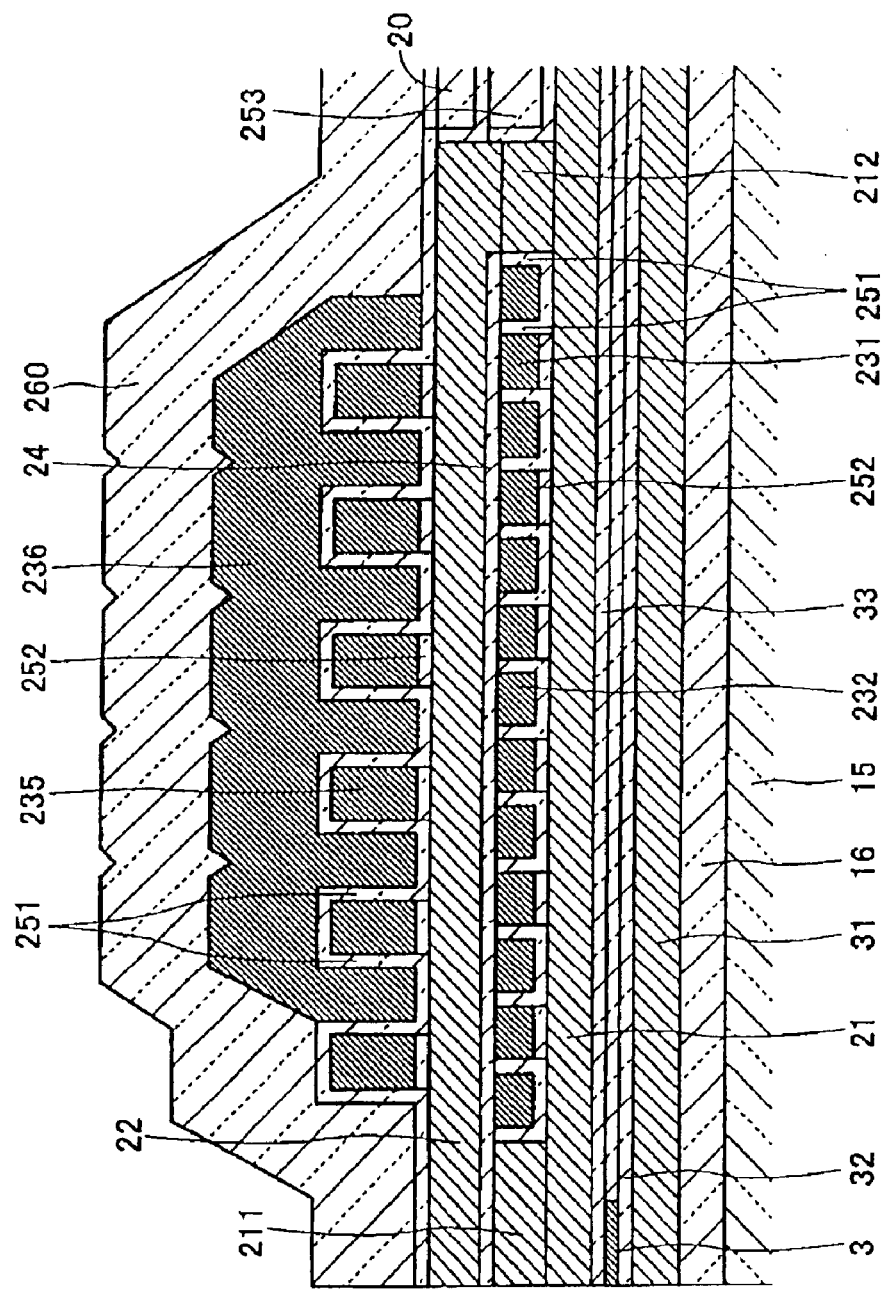
FIG. 90 is a cross sectional view showing the step after the step shown in FIGS. 88 and 89.
Figure 91:
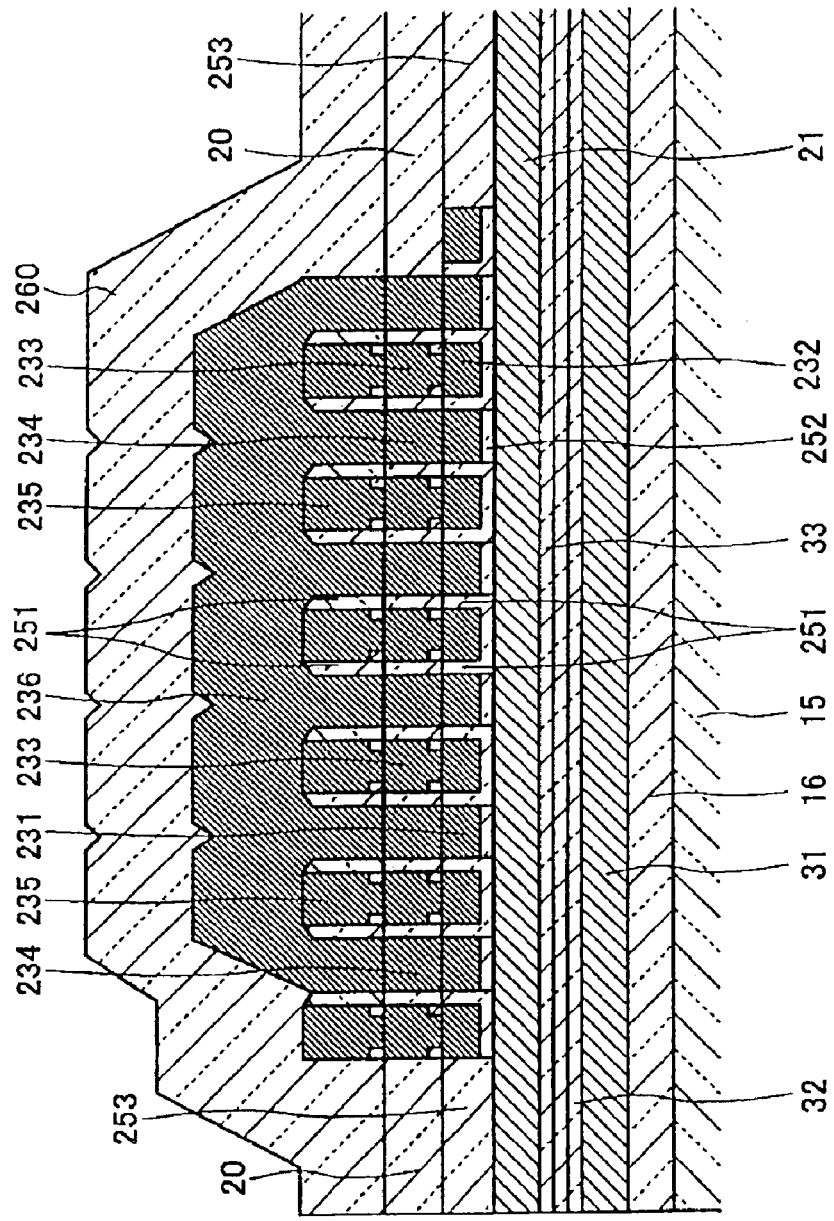
FIG. 91 is another cross sectional view showing the step after the step shown in FIGS. 88 and 89.

FIGS. 90 and 91 are cross sectional views showing the step after the step shown in FIGS. 88 and 89, taken on line "86—86" and line "87—87". As shown in FIGS. 90 and 91, a flattening film 260 is formed of $Al_2O_3$, $SiO_2$ or the like over the assembly shown in FIGS. 88 and 89 by means of sputtering or the like, and flattened by means of CMP.

Figure 92:
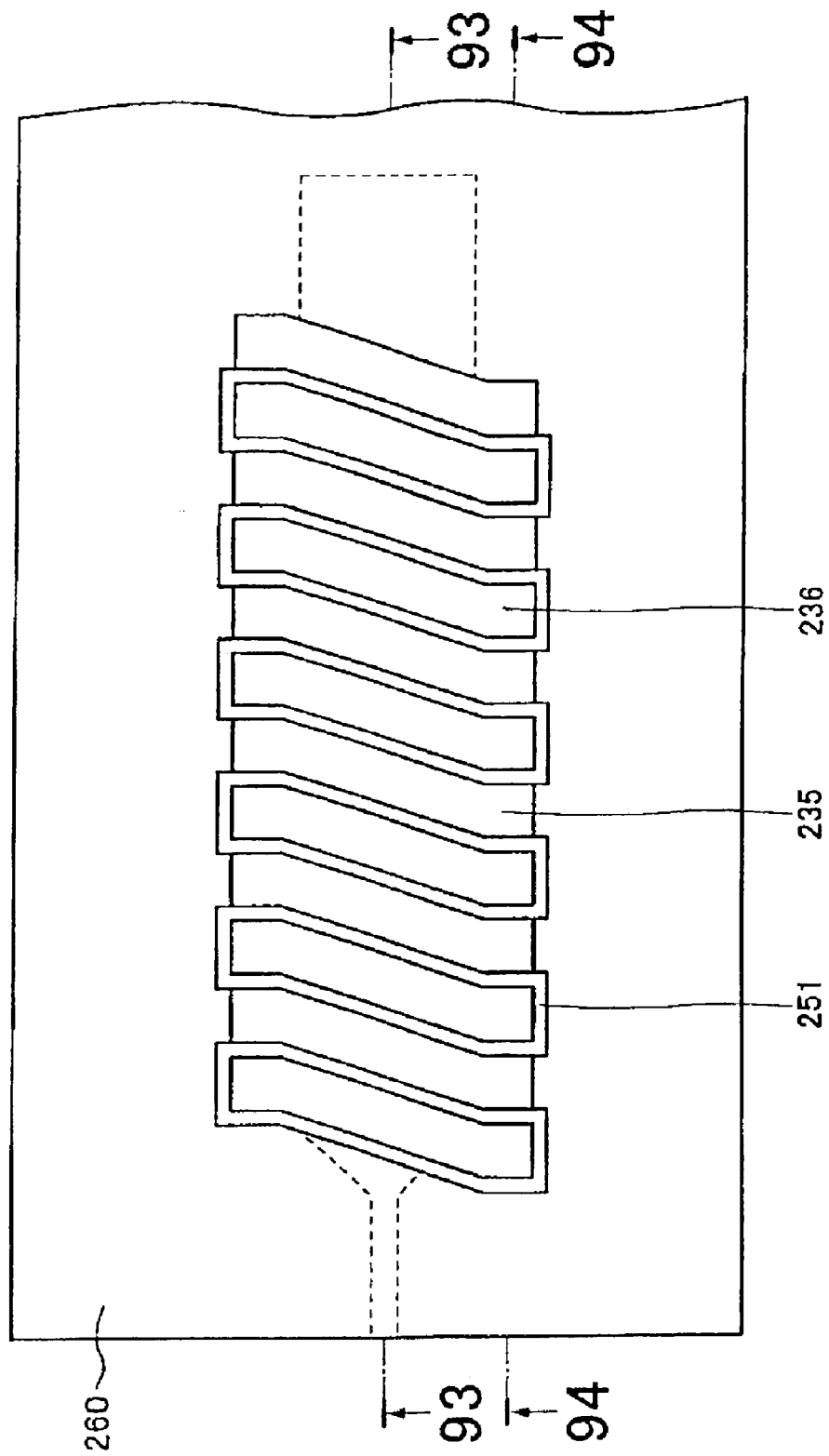
FIG. 92 is a plan view showing the step after the step shown in FIGS. 90 and 91.
Figure 93:
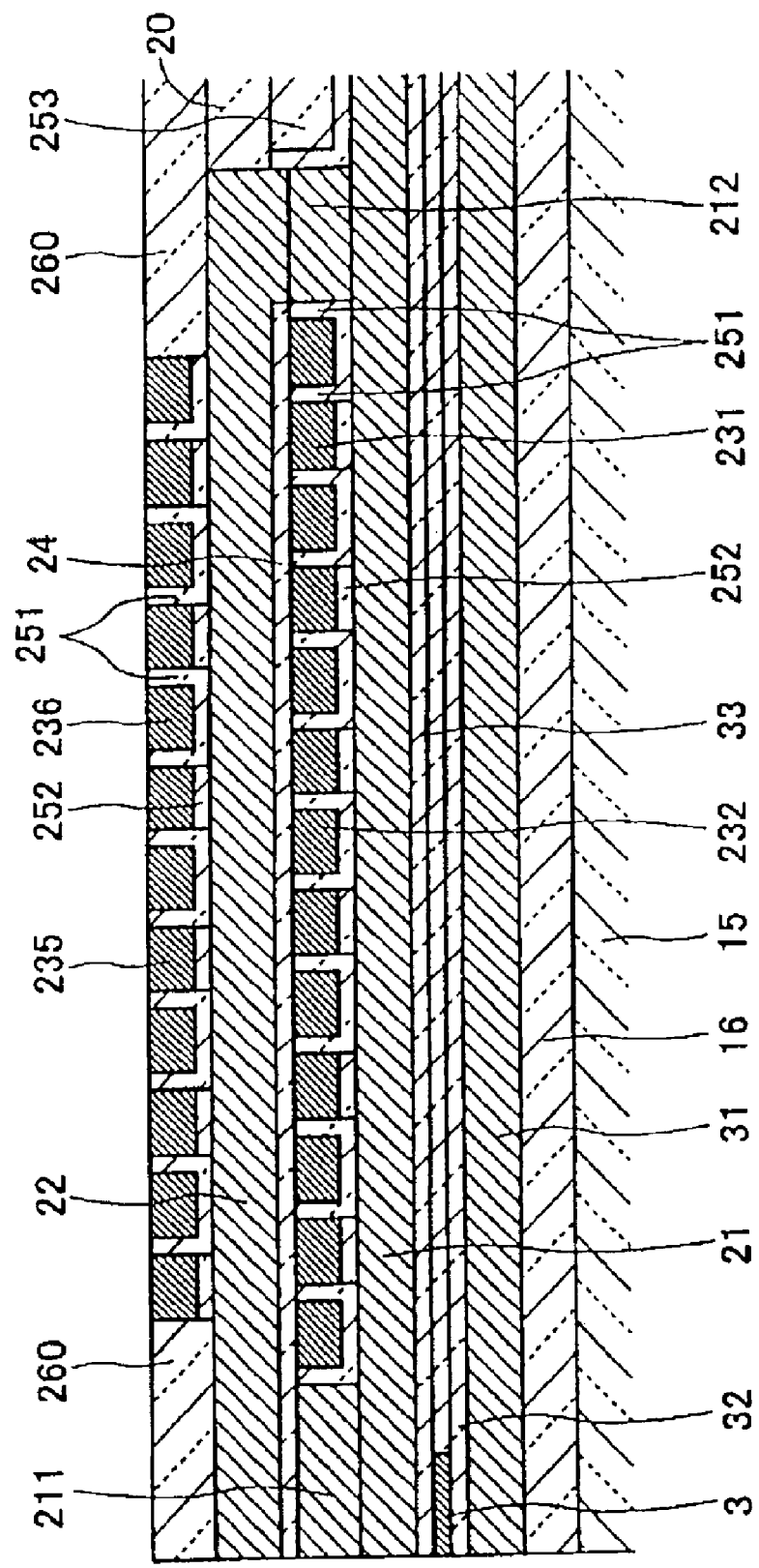
FIG. 93 is a cross sectional view showing the area shown in FIG. 92, taken on line "93—93"
Figure 94:
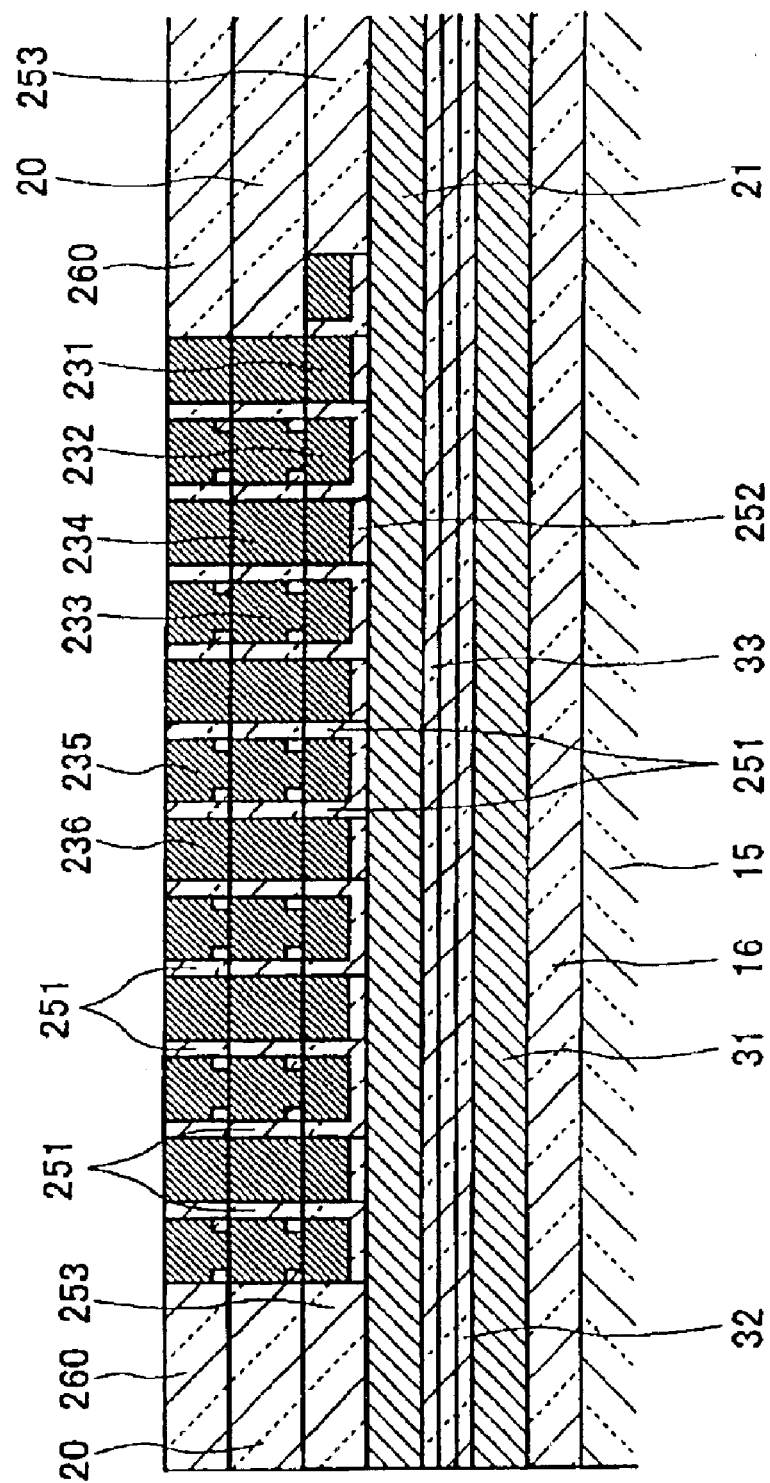
FIG. 94 is a cross sectional view showing the area shown in FIG. 92, taken on line "94—94"

FIG. 92 is a plan view showing the step after the step shown in FIGS. 90 and 91, and FIG. 93 is a cross sectional view showing the area shown in FIG. 92, taken on line "93—93", and FIG. 94 is a cross sectional view showing the area shown in FIG. 92, taken on line "94—94". These figures illustrate a flattened assembly after the formation of the flattening film 260 and the flattening process.

Figure 95:
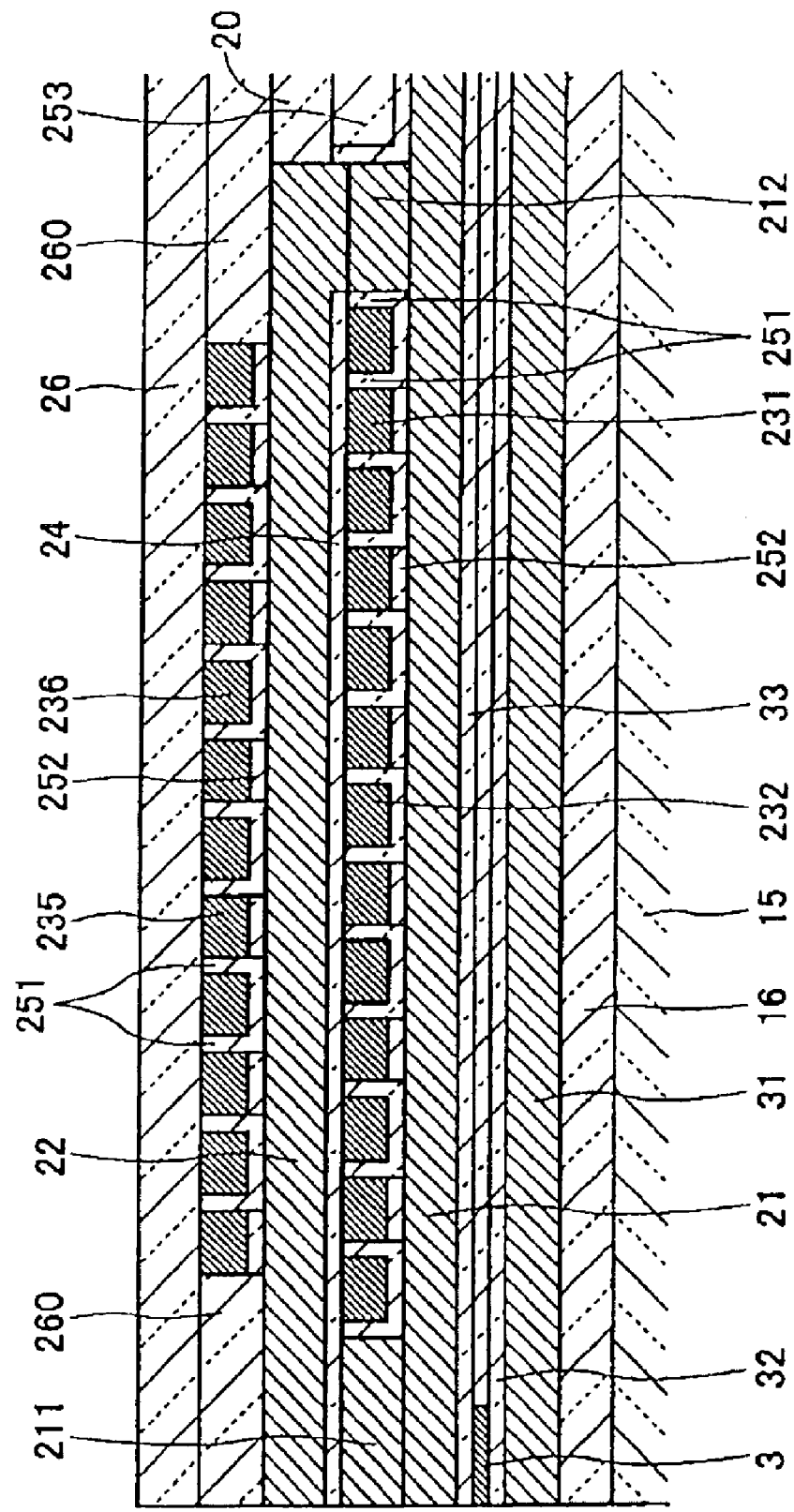
FIG. 95 is a cross sectional view showing the step after the step shown in FIGS. 92–94.
Figure 96:
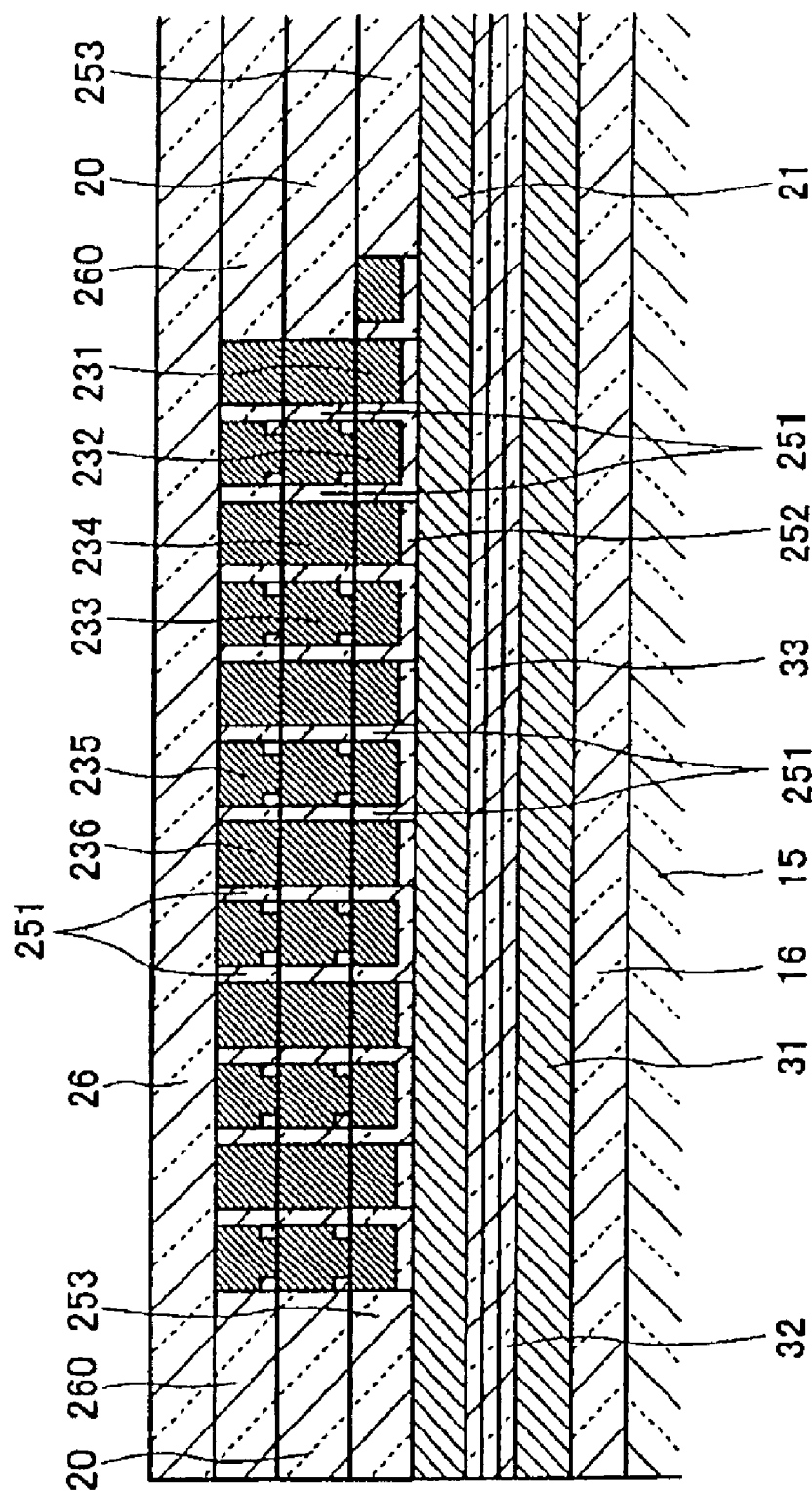
FIG. 96 is a cross sectional view showing the step after the step shown in FIG. 95.

As shown in FIGS. 95 and 96, a protective layer 26 is formed of $Al_2O_3$, $SiO_2$ or the like over the flattened assembly by means of sputtering.

As a result, a writing element is built in the thin film magnetic head element with the reading element. For the practical use of the thin film magnetic head, pull-out electrodes, bump layers and bump protective layers are provided. Another micro device such as the thin film inductor shown in FIGS. 26–28 can be fabricated in the same manner as mentioned above.

Figure 97:
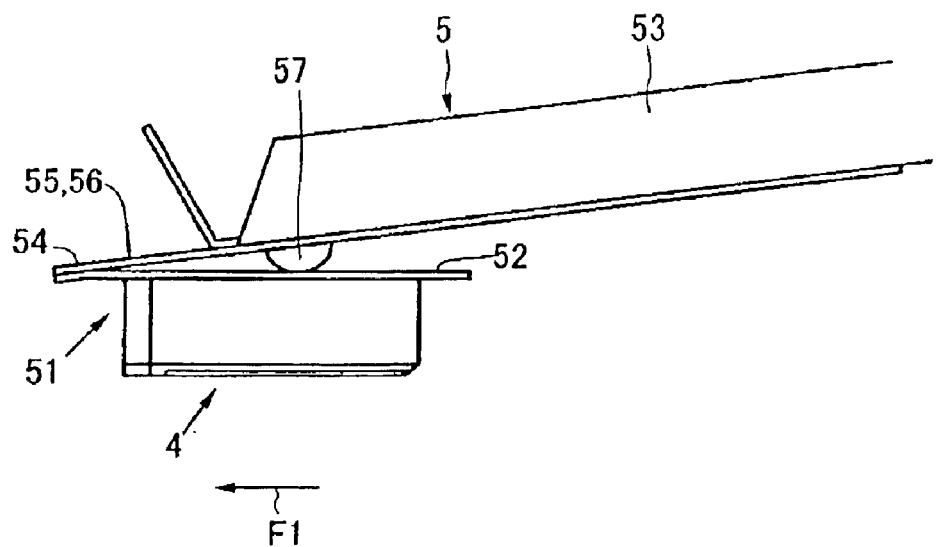
FIG. 97 is an elevational view showing a portion of a thin film magnetic head device according to the present invention.
Figure 98:
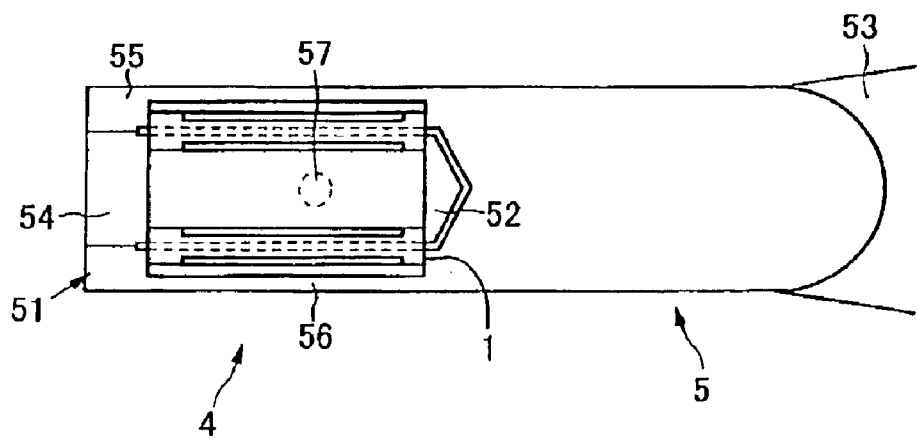
FIG. 98 is a bottom plan view of the thin film magnetic head device shown in FIG. 97.

Next, a thin film magnetic head device and a magnetic recording/reproducing device will be described. FIG. 97 is an elevational view showing a portion of a thin film magnetic head device according to the present invention, and FIG. 98 is a bottom plan view of the thin film magnetic head device shown in FIG. 97. The illustrated thin film magnetic head device includes a thin film magnetic head 4 as shown in FIGS. 6–9 and a head supporting device 5.

The head supporting device 5 is composed of a supporter 53 made of a metallic plate and a flexibler 51 made of a metallic plate provided on the free edge of the supporter 53 in its longitudinal direction. The thin film magnetic head 4 is attached on the lower surface of the flexibler 51.

The flexibler 51 has two outerframes 55 and 56 substantially parallel to the supporter 53 in its longitudinal direction, a lateral frame 54 to join the outerframes 55 and 56 in the remote portion thereof from the supporter 53, and a tongue shaped member 52, of which the forefront is free, extending substantially parallel to the outerframes 55 and 56 from the almost central portion of the lateral frame 54.

On the almost central portion of the tongue shaped member 52 is provided a hemispheric loading convex portion 57 bulging on the supporter 53. The loading convex portion 57 conducts a load to the tongue shaped member 52 from the free edge of the supporter 53.

The thin film magnetic head 4 is attached to the lower surface of the tongue shaped member 52 by an adhesive agent so that the air outflow side can correspond to the longitudinal direction of the lateral frame 54. In this invention, any kind of head supporting apparatus may be employed, besides the above head supporting apparatus 5.

FIG. 99 is a plan view showing a magnetic recording/reproducing device according to the present invention. The magnetic recording/reproducing device illustrated in FIG. 99 includes a thin film magnetic head device 6 as shown in FIGS. 97 and 98 and a magnetic recording medium 7. In the thin film magnetic head device 6, one end of a head supporting device 5 is attached on one end of an arm 9, and the other end of the arm 9 is supported by a position-determining device 8 including voice coil, etc., and driven. The thin film magnetic head 4 is mounted on the free edge of the head supporting device 5 so as to oppose the magnetic recording surface of the magnetic recording medium 7.

When the magnetic recording medium 7 is rotated in the F1 arrow direction by not shown driving device, the thin film magnetic head 4 floats from on the magnetic recording medium 7 by a minute space. In FIG. 99, the thin film magnetic head 4, attached on the forefront of the head supporting device 5, is moved in the radial direction, and then, the thin film magnetic head 4 is positioned at a given track of the magnetic recording medium 7 by the position determining device 8 which drives the head supporting device 5.

Although the present invention was described in detail with reference to the above examples, this invention is not limited to the above disclosure and every kind of variation and modification may be made without departing from the scope of the present invention.

As mentioned above, according to the present invention, some advantages can be provided as follows:

(a) A micro device, particularly a semiconductor device with a large wiring density and element density can be provided.

(b) A micro device, particularly a thin film magnetic head and a thin film inductor, of which the coil length is shortened and thus the impedance of the coil is increased to improve the high frequency performance, can be provided.

(c) A micro device, particularly a thin film inductor and a thin film magnetic head, of which the density of the coil turn is increased to improve the magnetic efficiency.

What is claimed is:

1. A micro device comprising a thin film wiring structure composed of plural thin film conductors, said thin film conductors being arranged on a base so as to be separated from one another by an inorganic insulating film, a gap width a between adjacent thin film conductors being defined by a thickness of said inorganic insulating film, said gap width $\alpha$ being set smaller than a width $\beta$ of each thin film conductor, and said thin film wiring structure is a thin film coil which is wound helically around a given axis to form a perpendicular winding structure, and said thin film conductors are composed of coil turns of said thin film coil.

2. The micro device as defined in claim 1, further comprising:

a first magnetic layer provided beyond said thin film coil, and a second magnetic layer provided through said thin film coil along said axis, said first magnetic layer being magnetically joined with said second magnetic layer beyond said thin film coil.

3. The micro device as defined in claim 2, wherein said coil turns of said thin film coil are provided adjacent to said first magnetic layer and said second magnetic layer via another inorganic insulating film.

4. The micro device as defined in claim 3, wherein said another inorganic insulating film is formed in a thickness of 0.01–0.05 $\mu$m.

5. A thin film inductor comprising a micro device as defined in claim 2.

6. A thin film magnetic head device comprising a thin film magnetic head as defined in claim 5 and a head supporting device to support said thin film magnetic head.

7. A magnetic recording reproducing device comprising a thin film magnetic head device as defined in claim 6 and a magnetic recording medium to be magnetically recorded and reproduced commensurate with said thin film magnetic head.

8. A thin film magnetic head comprising a micro device as defined in claim 2.

9. The thin film magnetic head as defined in claim 8, further comprising a reading element with a giant magnetoresistive effective element.

10. The thin film magnetic head as defined in claim 9, wherein said giant magnetoresistive effective element includes a spin valve film or a ferromagnetic tunnel junction element.

11. The micro device as defined in claims 1, wherein said gap width $\alpha$ is set within 0.01–0.05 $\mu$m.

12. The micro device as defined in claim 11, wherein said gap width $\alpha$ and said width $\beta$ satisfies a relation of $(1/300) \leq \alpha/\beta \leq (1/5)$.

13. A method for fabricating a micro device with a thin film coil, comprising the steps of:

forming a first inorganic insulating film on a base, forming plural first thin film conductors on said first insulating film so as to be separated from one another in a predetermined direction by a given distance, removing portions of said first inorganic insulating film located in between said plural first thin film conductors, forming a second inorganic insulating film in a uniform thickness over said first thin film conductors and exposed portions of said base, forming a second thin film conductor so as to embed gaps located between said first thin film conductors and to be electrically connected to said first thin film conductors, and forming a second magnetic layer so that said thin film coil is wound helically around said second magnetic layer with electrically insulated to constitute a perpendicular winding structure, wherein said base includes a first magnetic layer.

14. A method for fabricating a micro device with a thin film coil, comprising the steps of:

forming a first inorganic insulating film on a base, forming plural first thin film conductors on said first insulating film so as to be separated from one another in a predetermined direction by a given distance, forming a second inorganic insulating film in a uniform thickness over said first thin film conductors and said first inorganic insulating film, forming a second thin film conductor so as to embed gaps located between said first thin film conductors and to be electrically connected to said first thin film conductors, and forming a second magnetic layer so that said thin film coil is wound helically around said second magnetic layer with electrically insulated to constitute a perpendicular winding structure, wherein said base includes a first magnetic layer.

* * * * *